United States Patent
Kay et al.

(10) Patent No.: US 9,280,163 B2
(45) Date of Patent: Mar. 8, 2016

(54) AVERAGE POWER TRACKING CONTROLLER

(71) Applicant: RF Micro Devices, Inc., Greensboro, NC (US)

(72) Inventors: Michael R. Kay, Summerfield, NC (US); Nadim Khlat, Midi-Pyrenees (FR)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/747,725

(22) Filed: Jan. 23, 2013

(65) Prior Publication Data

US 2013/0141068 A1 Jun. 6, 2013

Related U.S. Application Data

(63) Continuation-in-part of application No. 13/690,187, filed on Nov. 30, 2012, now Pat. No. 9,041,364.

(60) Provisional application No. 61/589,558, filed on Jan. 23, 2012, provisional application No. 61/565,670, filed on Dec. 1, 2011.

(51) Int. Cl.
*G05F 1/00* (2006.01)
*G05F 1/46* (2006.01)
(Continued)

(52) U.S. Cl.
CPC . *G05F 1/46* (2013.01); *H02M 1/14* (2013.01); *H03F 1/0227* (2013.01); *H03F 1/26* (2013.01);
(Continued)

(58) Field of Classification Search
USPC ......... 323/282–285, 351, 286, 287, 268, 273; 363/59, 60, 61
See application file for complete search history.

(56) References Cited

U.S. PATENT DOCUMENTS 3,969,682 A 7/1976 Rossum
3,980,964 A 9/1976 Grodinsky
(Continued)

FOREIGN PATENT DOCUMENTS

CN 1211355 A 3/1999
CN 1518209 A 8/2004
(Continued)

OTHER PUBLICATIONS

Notice of Allowance for U.S. Appl. No. 13/188,024, mailed Jun. 18, 2013, 7 pages.
(Continued)

*Primary Examiner* — Adolf Berhane
*Assistant Examiner* — Afework Demisse
(74) *Attorney, Agent, or Firm* — Withrow & Terranova, P.L.L.C.

(57) ABSTRACT

This disclosure relates to radio frequency (RF) power converters and methods of operating the same. In one embodiment, an RF power converter includes an RF switching converter, a low-drop out (LDO) regulation circuit, and an RF filter. The RF filter is coupled to receive a pulsed output voltage from the RF switching converter and a supply voltage from the LDO regulation circuit. The RF filter is operable to alternate between a first RF filter topology and a second RF filter topology. In the first RF filter topology, the RF filter is configured to convert the pulsed output voltage from a switching circuit into the supply voltage. The RF filter in the second RF filter topology is configured to filter the supply voltage from the LDO regulation circuit to reduce a ripple variation in a supply voltage level of the supply voltage. As such, the RF filter provides greater versatility.

21 Claims, 22 Drawing Sheets

(51) Int. Cl.
*H02M 1/14* (2006.01)
*H03F 1/02* (2006.01)
*H03F 1/26* (2006.01)
*H03F 3/24* (2006.01)
*H04B 15/00* (2006.01)
*H02M 1/00* (2007.01)

(52) U.S. Cl.
CPC ............... *H03F 3/24* (2013.01); *H04B 15/005* (2013.01); *H02M 2001/0067* (2013.01); *H03F 2200/351* (2013.01); *H03F 2200/451* (2013.01); *H03F 2200/504* (2013.01)

(56) References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 * | 3/2010 | Choi ................. H02M 3/33507 363/16 |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |

(56) References Cited

U.S. PATENT DOCUMENTS

| | | |
|---|---|---|
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,693,676 B2 | 4/2014 | Xiao et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,099,961 B2 | 8/2015 | Kay et al. |
| 9,112,452 B1 | 8/2015 | Khlat |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |

(56) References Cited

U.S. PATENT DOCUMENTS

| | | |
|---|---|---|
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2012/0313701 A1 | 12/2012 | Khlat et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0134956 A1 | 5/2013 | Khlat |
| 2013/0141064 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184335 A1 | 7/2014 | Nobbe et al. |
| 2014/0203868 A1 | 7/2014 | Khlat et al. |
| 2014/0203869 A1 | 7/2014 | Khlat et al. |
| 2014/0225674 A1 | 8/2014 | Folkmann et al. |
| 2014/0266427 A1 | 9/2014 | Chiron |
| 2014/0266428 A1 | 9/2014 | Chiron et al. |
| 2014/0306769 A1 | 10/2014 | Khlat et al. |
| 2015/0048891 A1 | 2/2015 | Rozek et al. |
| 2015/0180422 A1 | 6/2015 | Khlat et al. |
| 2015/0234402 A1 | 8/2015 | Kay et al. |

FOREIGN PATENT DOCUMENTS

| | | |
|---|---|---|
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| EP | 0755121 A2 | 1/1997 |
| EP | 1047188 A2 | 10/2000 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 03002006 A1 | 12/2003 |
| WO | 2004082135 A2 | 9/2004 |
| WO | 2005013084 A2 | 2/2005 |
| WO | 2006021774 A1 | 3/2006 |
| WO | 2006004319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

International Preliminary Report on Patentability for PCT/US2011/054106 mailed Apr. 11, 2013, 8 pages.

International Preliminary Report on Patentability for PCT/US2011/061007 mailed May 30, 2013, 11 pages.

International Preliminary Report on Patentability for PCT/US2011/061009 mailed May 30, 2013, 10 pages.

Non-Final Office Action for U.S. Appl. No. 13/423,649, mailed May 22, 2013, 7 pages.

Advisory Action for U.S. Appl. No. 13/222,484, mailed Jun. 14, 2013, 3 pages.

International Preliminary Report on Patentability for PCT/US2011/064255, mailed Jun. 20, 2013, 7 pages.

Notice of Allowance for U.S. Appl. No. 13/343,840, mailed Jul. 1, 2013, 8 pages.

Notice of Allowance for U.S. Appl. No. 13/363,888, mailed Jul. 18, 2013, 9 pages.

Notice of Allowance for U.S. Appl. No. 13/222,453, mailed Aug. 22, 2013, 8 pages.

International Preliminary Report on Patentability for PCT/US2012/024124, mailed Aug. 22, 2013, 8 pages.

Notice of Allowance for U.S. Appl. No. 13/550,060, mailed Aug. 16, 2013, 8 pages.

Notice of Allowance for U.S. Appl. No. 13/222,484, mailed Aug. 26, 2013, 8 pages.

(56) References Cited

OTHER PUBLICATIONS

International Preliminary Report on Patentability for PCT/US2012/023495, mailed Aug. 15, 2013, 10 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Notice of Allowance for U.S. Appl. No. 13/602,856, mailed Sep. 24, 2013, 9 pages.
Quayle Action for U.S. Appl. No. 13/531,719, mailed Oct. 10, 2013, 5 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, 7 pages.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 13/550,049, mailed Nov. 25, 2013, 6 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W Dual-Band 870 and 2140 MHz Envelope Tracking GaN PA Designed by a Probability Distribution Conscious Approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering.0.55W/mm02 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Non-final Office Action for U.S. Appl. No. 11/113,873, now Patent No. 7,773,691, mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
Non-final Office Action for U.S. Appl. No. 13/089,917 mailed Nov. 23, 2012, 6 pages.
International Search Report for PCT/US11/033037, mailed Aug. 9, 2011, 10 pages.
International Preliminary Report on Patentability for PCT/US2011/033037 mailed Oct. 23, 2012, 7 pages.
Non-Final Office Action for U.S. Appl. No. 13/188,024, mailed Feb. 5, 2013, 8 pages.
International Search Report for PCT/US2011/044857, mailed Oct. 24, 2011, 10 pages.
International Preliminary Report on Patentability for PCT/US2011/044857 mailed Mar. 7, 2013, 6 pages.
Non-final Office Action for U.S. Appl. No. 13/218,400 mailed Nov. 8, 2012, 7 pages.
Notice of Allowance for U.S. Appl. No. 13/218,400 mailed Apr. 11, 2013, 7 pages.
International Search Report for PCT/US11/49243, mailed Dec. 22, 2011, 9 pages.
International Preliminary Report on Patentability for PCT/US11/49243 mailed Nov. 13, 2012, 33 pages.
International Search Report for PCT/US2011/054106 mailed Feb. 9, 2012, 11 pages.
International Search Report for PCT/US2011/061007 mailed Aug. 16, 2012, 16 pages.
Non-Final Office Action for U.S. Appl. No. 13/297,470 mailed May 8, 2013, 15 pages.
International Search Report for PCT/US2011/061009 mailed Feb. 8, 2012, 14 pages.
International Search Report for PCT/US2012/023495 mailed May 7, 2012, 13 pages.
Non-final Office Action for U.S. Appl. No. 13/222,453 mailed Dec. 6, 2012, 13 pages.
Notice of Allowance for U.S. Appl. No. 13/222,453 mailed Feb. 21, 2013, 7 pages.
Invitation to Pay Additional Fees and Where Applicable Protest Fee for PCT/US2012/024124 mailed Jun. 1, 2012, 7 pages.
International Search Report for PCT/US2012/024124 mailed Aug. 24, 2012, 14 pages.
Notice of Allowance for U.S. Appl. No. 13/316,229 mailed Nov. 14, 2012, 9 pages.

(56) References Cited

OTHER PUBLICATIONS

International Search Report for PCT/US2011/064255 mailed Apr. 3, 2012, 12 pages.
International Search Report for PCT/US2012/40317 mailed Sep. 7, 2012, 7 pages.
International Search Report for PCT/US2012/046887 mailed Dec. 21, 2012, 12 pages.
Non-final Office Action for U.S. Appl. No. 13/222,484 mailed Nov. 8, 2012, 9 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
Notice of Allowance for U.S. Appl. No. 14/022,858, mailed Oct. 25, 2013, 9 pages.
Non-Final Office Action for U.S. Appl. No. 12/836,307, mailed Nov. 5, 2013, 6 pages.
Examination Report for European Patent Application No. 11720630.0, mailed Aug. 16, 2013, 5 pages.
Final Office Action for U.S. Appl. No. 13/297,470, mailed Oct. 25, 2013, 17 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/661,552, mailed Feb. 21, 2014, 5 pages.
International Search Report and Written Opinion for PCT/US2013/065403, mailed Feb. 5, 2014, 11 pages.
Invitation pursuant to Article 94(3) and Rule 71(1) EPC for European Patent Application No. 11720630.0 issued Mar. 18, 2014, 4 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
International Preliminary Report on Patentability for PCT/US2012/062070 mailed May 8, 2014, 8 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Notice of Allowance for U.S. Appl. No. 14/022,940, mailed Jun. 10, 2014, 7 pages.
Non-Final Office Action for U.S. Appl. No. 13/714,600 mailed May 9, 2014, 14 pages.
Non-Final Office Action for U.S. Appl. No. 13/951,976 mailed Apr. 4, 2014, 7 pages.
Notice of Allowance for U.S. Appl. No. 12/836,307 mailed May 5, 2014, 6 pages.
International Preliminary Report on Patentability and Written Opinion for PCT/US2012/067230, mailed Jun. 12, 2014, 7 pages.
Notice of Allowance for U.S. Appl. No. 13/661,552, mailed Jun. 13, 2014, 5 pages.
Hassan, Muhammad, et al., "A Combined Series—Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Non-Final Office Action for U.S. Appl. No. 13/486,012, mailed Jul. 28, 2014, 7 pages.
Notice of Allowance for U.S. Appl. No. 13/692,084, mailed Jul. 23, 2014, 7 pages.
Notice of Allowance for U.S. Appl. No. 13/684,826, mailed Jul. 18, 2014, 7 pages.
International Search Report and Written Opinion for PCT/US2014/028089, mailed Jul. 17, 2014, 10 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/690,187, mailed Sep. 3, 2014, 9 pages.
Non-Final Office Action for U.S. Appl. No. 13/782,142, mailed Sep. 4, 2014, 6 pages.
European Search Report for Patent Application No. 14162682.0, issued Aug. 27, 2014, 7 pages.
Invitation to Pay Additional Fees and Partial International Search Report for PCT/US2014/028178, mailed Jul. 24, 2014, 7 pages.
Notice of Allowance for U.S. Appl. No. 13/948,291, mailed Feb. 11, 2015, 7 pages.
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
Non-Final Office Action for U.S. Appl. No. 14/048,109, mailed Feb. 18, 2015, 8 pages.
First Office Action for Chinese Patent Application No. 201180030273.5, issued Dec. 3, 2014, 15 pages (with English translation).
International Preliminary Report on Patentability for PCT/US2013/052277, mailed Feb. 5, 2015, 9 pages.

(56) References Cited

OTHER PUBLICATIONS

First Office Action for Chinese Patent Application No. 201280026559.0, issued Nov. 3, 2014, 14 pages (with English translation).
Notice of Allowance for U.S. Appl. No. 14/072,140, mailed Dec. 2, 2014, 8 pages.
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Non-Final Office Action for U.S. Appl. No. 14/122,852, mailed Feb. 27, 2015, 5 pages.
Advisory Action for U.S. Appl. No. 13/689,883, mailed Apr. 20, 2015, 3 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
European Search Report for European Patent Application No. 14190851.7, issued Mar. 5, 2015, 6 pages.
International Preliminary Report on Patentability for PCT/US2013/065403, mailed Apr. 30, 2015, 8 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Advisory Action for U.S. Appl. No. 13/714,600, mailed May 26, 2015, 3 pages.
Advisory Action for U.S. Appl. No. 13/661,227, mailed May 12, 2015, 3 pages.
Notice of Allowance for U.S. Appl. No. 13/747,749, mailed Jun. 4, 2015, 8 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
First Office Action and Search Report for Chinese Patent Application No. 201280007941.7, issued May 13, 2015, 13 pages.
Yun, Hu et al., "Study of envelope tracking power amplifier design," Journal of Circuits and Systems, vol. 15, No. 6, Dec. 2010, pp. 6-10.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 14/027,416, mailed Aug. 11, 2015, 9 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Notice of Allowance for U.S. Appl. No. 13/661,164, mailed Oct. 21, 2015, 7 pages.
Non-Final Office Action for U.S. Appl. No. 14/702,192, mailed Oct. 7, 2015, 7 pages.
Non-Final Office Action for U.S. Appl. No. 14/254,215, mailed Oct. 15, 2015, 5 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
First Office Action for Chinese Patent Application No. 201180067293.X, mailed Aug. 6, 2015, 13 pages.
Author Unknown, "Automatically," Definition, Dictionary.com Unabridged, 2015, pp. 1-6, http://dictionary.reference.com/browse/automatically.
Final Office Action for U.S. Appl. No. 13/689,883, mailed Dec. 23, 2015, 12 pages.
Final Office Action for U.S. Appl. No. 13/714,600, mailed Dec. 24, 2015, 15 pages.
Advisory Action for U.S. Appl. No. 13/689,922, mailed Dec. 18, 2015, 3 pages.
Notice of Allowance for U.S. Appl. No. 13/727,911, mailed Nov. 10, 2015, 8 pages.
Notice of Allowance for U.S. Appl. No. 14/163,229, mailed Nov. 5, 2015, 8 pages.
Final Office Action for U.S. Appl. No. 14/163,256, mailed Nov. 2, 2015, 10 pages.

(56) References Cited

OTHER PUBLICATIONS

Corrected Notice of Allowability for U.S. Appl. No. 13/689,940, mailed Nov. 17, 2015, 4 pages.
Final Office Action for U.S. Appl. No. 14/082,629, mailed Nov. 4, 2015, 17 pages.
Non-Final Office Action for U.S. Appl. No. 14/458,341, mailed Nov. 12, 2015, 5 pages.
Advisory Action for U.S. Appl. No. 14/082,629, mailed Jan. 22, 2016, 3 pages.
Non-Final Office Action for U.S. Appl. No. 13/876,518, mailed Jan. 20, 2016, 16 pages.

* cited by examiner

AVERAGE POWER TRACKING CONTROLLER

RELATED APPLICATIONS

This application claims the benefit of U.S. Provisional Patent Application Ser. No. 61/589,558, filed on Jan. 23, 2012 and entitled "AVERAGE POWER TRACKING USING CONTROLLER OF ENVELOPE TRACKING CONVERTER," the disclosure of which is incorporated herein by reference in its entirety.

This application is a continuation-in-part of U.S. patent application Ser. No. 13/690,187, filed on Nov. 30, 2012 and entitled "RF POWER CONVERTER," which claims the benefit of and priority to U.S. Provisional Patent Application Ser. No. 61/565,670, filed on Dec. 1, 2011 and entitled "OFFSET LOOP CAPACITOR FOR ENVELOPE TRACKING," the disclosures of which are hereby incorporated herein by reference in their entireties.

This application is also related to U.S. patent application Ser. No. 13/661,164, filed on Oct. 26, 2012 and entitled "AVERAGE FREQUENCY CONTROL OF SWITCHER FOR ENVELOPE TRACKING," and to U.S. patent application Ser. No. 13/661,227, filed on Oct. 26, 2012 and entitled "RF SWITCHING CONVERTER WITH RIPPLE CORRECTION," the disclosures of which are incorporated herein by reference in their entireties.

FIELD OF THE DISCLOSURE

The disclosure relates generally to radio frequency (RF) power converters.

BACKGROUND

User communication devices use radio frequency (RF) power converters to generate one or more supply voltages to power RF circuitry. If an RF switching converter provides Envelope Tracking (ET) and/or Average Power Tracking (APT), a supply voltage level of the supply voltage may need to be controlled with adequate precision in order to provide adequate power performance and to prevent unwanted distortion. Specialized RF components may be provided in RF power converters to meet spectrum and power performance requirements in certain operational modes. Unfortunately, these specialized RF components require additional die area, and therefore increase manufacturing costs.

Accordingly, RF power converters with more versatile RF components are needed.

SUMMARY

This disclosure relates to radio frequency (RF) switching converters and methods of operating the same. In one embodiment, an RF switching converter includes a switching circuit, a bang-bang controller (BBC), an Average Power Tracking (APT) controller, and an RF filter. The switching circuit is operable to receive a power source voltage, the switching circuit being switchable so as to generate a pulsed output voltage from the power source voltage. The RF filter is coupled to receive the pulsed output voltage from the switching circuit and is operable to convert the pulsed output voltage from the switching circuit into a supply voltage. The BBC is operable to receive an APT signal and is configured to switch the switching circuit based on an APT signal level of the APT signal so that the switching circuit generates the pulsed output voltage and so that the supply voltage level of the supply voltage has an average DC supply voltage level set in accordance with a DC offset signal level of the APT signal. The APT controller is configured to generate the APT signal such that the APT signal level varies from the DC offset signal level of the APT signal in accordance with a ripple variation of the supply voltage level of the supply voltage. To control the DC offset signal level and thereby the average DC supply voltage level, the APT controller is operable to receive a supply control input signal having a supply control input signal level, and is configured to set the DC offset signal level of the APT signal in accordance with the supply control input signal level of the supply control input signal. By providing the APT controller, the BBC may be used to switch the switching circuit in both an APT operational mode and an ET operational mode.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

This disclosure relates to radio frequency (RF) switching converters and RF amplification devices. RF switching converters convert a power source voltage, such as a battery voltage, into a supply voltage. Often, RF switching converters are employed in RF power amplification devices to provide the supply voltage to an RF amplification circuit within the RF amplification device. Using this supply voltage, the RF amplification circuit amplifies an RF signal by transferring power from the supply voltage to the RF signal in accordance with an amplifier gain.

The RF amplification devices may be used to amplify RF signals formatted in accordance with various RF communication standards. Different supply voltage biasing techniques may be more power efficient and/or introduce less distortion into the RF signal depending on the RF communication standard, power range, and/or RF frequency band. These supply voltage biasing techniques may include Envelope Tracking (ET), Average Power Tracking (APT), Polar Modulation, Low-Drop Out Regulation, and/or the like. Embodiments of the RF switching converters described herein may be designed to operate in different modes, where each mode is designed to implement a different supply voltage technique or a different set of supply voltage techniques. For example, in each mode, the RF switching converters may be designed to implement a different set of supply voltage techniques where each supply voltage technique in the set of supply voltage techniques provides a different supply voltage to different parts of the RF amplification circuit (such as driver amplifier stages and final amplifier stages).

Figure 1:
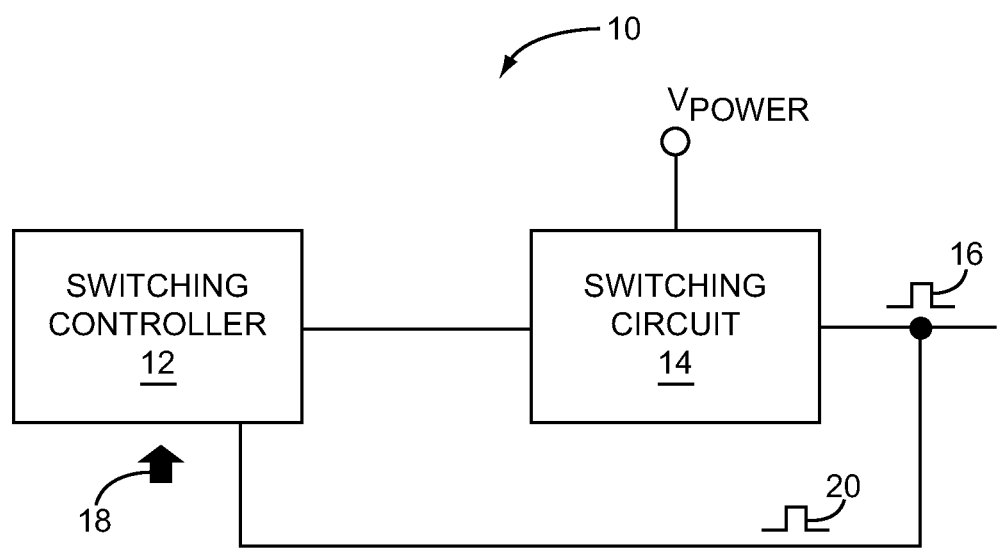
FIG. 1 illustrates one embodiment of a radio frequency (RF) switching converter with a switching controller and a switching circuit.

FIG. 1 is a block diagram of one embodiment of an RF switching converter 10. The RF switching converter 10 has a switching controller 12 and a switching circuit 14. The RF switching converter 10 is configured to generate a pulsed output voltage 16 from a power source voltage $V_{POWER}$. The power source voltage $V_{POWER}$ may come from a power source, such as a battery, an AC-to-DC converter, and/or the like. Except for power source abnormalities and possibly AC-to-DC ripple variations, the power source voltage level of the power source voltage $V_{POWER}$ may generally be described as DC and relatively constant, at least with respect to some acceptable ripple variation and/or some acceptable rate of transient voltage abnormalities. In particular, the switching circuit 14 is operable to receive the power source voltage $V_{POWER}$. The switching circuit 14 is switchable so as to generate the pulsed output voltage 16 from the power source voltage $V_{POWER}$. Thus, the switching circuit 14 may include one or more switches, such as switchable transistors, that can be turned on and turned off to present the pulsed output voltage 16 in at least two different voltage states. In this manner, pulses are produced in the pulsed output voltage 16.

The switching controller 12 is configured to switch the switching circuit 14 and determine switch timing for proper regulation of the pulsed output voltage 16. For example, the switching controller 12 may generate one or more control signals that turn on or turn off the switches and the switching circuit 14. The switching controller 12 may be analog, digital, and/or digital and analog, and may itself include various different controllers, as explained in further detail below. The pulsed output voltage 16 may be transmitted to an RF filter to convert the pulsed output voltage 16 into a supply voltage. The RF filter may or may not be included in the RF switching converter 10. For example, the RF filter may instead be included within a power amplification circuit and be external to the RF switching converter 10.

In this embodiment, the RF switching converter 10 may be used to employ APT and ET supply voltage biasing techniques. When RF signals are encoded using orthogonal frequency division multiple access multiplexing (OFDMA), the RF switching converter 10 may be used to implement ET. On the other hand, when RF signals are encoded using code division multiple access multiplexing (CDMA), the RF switching converter 10 may used to implement APT.

Referring again to FIG. 1, the switching controller 12 is configured to switch the switching circuit 14 such that the pulsed output voltage 16 has an average pulse frequency. In other words, although a duty ratio of the pulsed output voltage 16 may vary, the duty ratio has an average value with respect to time, and thus the pulsed output voltage 16 has an average pulse frequency with respect to time. A DC supply voltage level of the supply voltage is determined by a pulse frequency of the pulsed output voltage 16. Thus, a DC voltage state of the supply voltage varies as the pulse frequency varies.

By varying the pulse frequency and duty ratio of the pulsed output voltage 16, the DC voltage state of the supply voltage can change quickly. However, the pulsed output voltage has an average pulse frequency, which is essentially the mean frequency at which pulses are provided in the pulsed output voltage 16 with respect to time. Nevertheless, due to manufacturing variations and operational variations (such as temperature variation and power source variation), the average pulse frequency of the pulsed output voltage 16 may not always be set consistently or in accordance with a contemplated design. In fact, in some embodiments, the average pulse frequency has been shown to change by up to ±40% due to operational variations.

To mitigate the effects of manufacturing and operational variations, the switching controller 12 is configured to adjust the average pulse frequency. As shown in FIG. 1, the switching controller 12 is operable to receive a target average frequency value 18. In this embodiment, the target average frequency value 18 is a data parameter that identifies a target average frequency for the average pulse frequency of the pulsed output voltage 16. The switching controller 12 is configured to detect that the average pulse frequency of the pulsed output voltage 16 during a time period differs from the target average frequency identified by the target average frequency value 18. To help correct for the effects of manufacturing and/or operational variations on the average pulse frequency, the switching controller 12 reduces a difference between the average pulse frequency and the target average frequency identified by the target average frequency value 18. In this manner, the switching controller 12 can eliminate, minimize, or at least decrease errors in the average pulse frequency of the pulsed output voltage 16.

In the embodiment shown in FIG. 1, the switching controller 12 receives a pulsed feedback signal 20 that changes from one voltage state to another in accordance with the pulsed output voltage 16 generated by the switching circuit 14. Thus, the pulses of the pulsed feedback signal 20 are indicative of the pulses of the pulsed output voltage 16. From the pulsed feedback signal 20, the switching controller 12 can detect whether the average pulse frequency of the pulsed output voltage 16 differs from the target average frequency identified by the target average frequency value 18 during the time period. The switching controller 12 may then alter the switching frequency of the switching circuit 14 to reduce the difference between the average pulse frequency and the target average frequency identified by the target average frequency value 18.

It should be noted that the difference between the average pulse frequency and the target average frequency may or may not be eliminated after a single time period. For example, if the difference between the average pulse frequency and the target average frequency is large enough, the switching controller 12 may require multiple time periods in order to minimize the difference. Furthermore, the difference between the average pulse frequency and the target average frequency identified by the target average frequency value 18 may or may not ever be fully eliminated. This may depend on the frequency resolution and the control accuracy of a particular embodiment of the RF switching converter 10.

Figure 2:
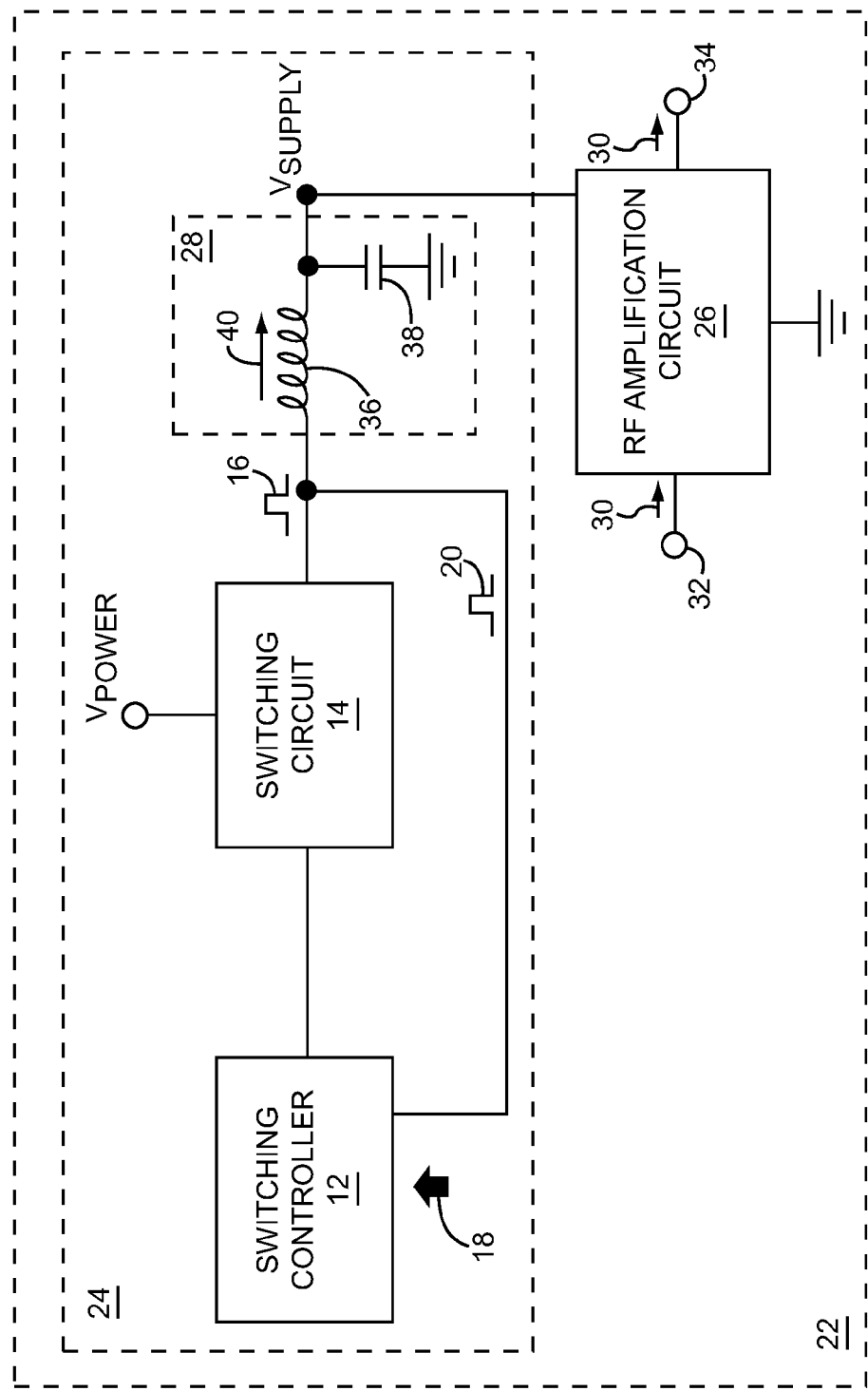
FIG. 2 illustrates one embodiment of an RF amplification device with another embodiment of an RF switching converter and an RF amplification circuit where the RF switching converter has the switching controller and the switching circuit shown in FIG. 1, along with an RF filter that converts a pulsed output voltage from the switching circuit into a supply voltage that is provided to the RF amplification circuit.

FIG. 2 illustrates one embodiment of an RF amplification device 22. The RF amplification device 22 includes another embodiment of an RF switching converter 24 and an RF amplification circuit 26. The RF switching converter 24 is the same as the RF switching converter 10 shown in FIG. 1, except the RF switching converter 24 shown in FIG. 2 has an RF filter 28 coupled to receive the pulsed output voltage 16. Thus, the RF switching converter 24 has the same switching controller 12 and the same switching circuit 14 described above with respect to FIG. 1. The RF filter 28 is configured to convert the pulsed output voltage 16 from the switching circuit 14 into a supply voltage $V_{SUPPLY}$ for the RF amplification circuit 26.

With regard to the RF amplification circuit 26 shown in FIG. 2, the RF amplification circuit 26 is operable to receive both the supply voltage $V_{SUPPLY}$ from the RF switching converter 24 and an RF signal 30 from external upstream RF circuitry. In this particular embodiment, the RF amplification circuit 26 receives the RF signal 30 at an input terminal 32. The RF amplification circuit 26 is configured to amplify the RF signal 30 using the supply voltage $V_{SUPPLY}$ from the RF switching converter 24. In other words, the RF amplification circuit 26 provides amplification to the RF signal 30 by transferring power from the supply voltage $V_{SUPPLY}$ to the RF signal 30. The RF amplification circuit 26 then outputs the RF signal 30 after amplification from an output terminal 34 to external downstream circuitry. For example, the RF amplification circuit 26 may be provided in a transmission chain of a transceiver in a user communication device, such as a laptop, a cellular phone, a tablet, a personal computer, or the like. The output terminal 34 may be coupled to an antenna (not shown) that radiates the RF signal 30 to a base station or directly to another user communication device after amplification by the RF amplification circuit 26.

The RF amplification circuit 26 may be configured to amplify the RF signal 30 when the RF signal 30 is formatted in accordance with any one of a multitude of RF communication standards. Often, the RF amplification circuit 26 is divided into RF amplification stages, including one or more driver RF amplification stages and a final RF amplification stage. The supply voltage $V_{SUPPLY}$ may provide the supply voltage $V_{SUPPLY}$ to all of the RF amplification stages, or alternatively, to a set of the RF amplification stages. For example, the supply voltage $V_{SUPPLY}$ may provide the supply voltage $V_{SUPPLY}$ to only the final RF amplification stage. Other circuitry may be provided in the RF switching converter 24 or externally to provide a second supply voltage to the driver RF amplification stages if desired.

The RF signal 30 may be encoded in any one of a plurality of multiplexing formats, such as Time Division Multiplexing (TDM), Frequency Division Multiplexing (FDM), CDMA, OFDMA, or the like. When CDMA is being employed, the RF switching converter 24 may be used to implement APT, and thus the RF amplification circuit 26 may need to be operated at back-off power levels well within a linear region of the RF amplification circuit 26. On the other hand, the RF switching converter 24 may be used to implement ET where the supply voltage level of the supply voltage $V_{SUPPLY}$ is modulated. Other types of power regulation circuits (either internal or external), such as low-drop out (LDO) regulation circuits, may be provided for TDM and FDM. However, LDO regulation circuits are generally unable to efficiently transfer power to the RF amplification circuit 26 for CDMA and OFDMA due to large resistances, which consume a significant amount of power. The RF switching converter 24 is generally much more power efficient due to its ability to provide power conversion using primarily reactive components.

Referring again to FIG. 2, the switching controller 12 may be configured to switch the switching circuit 14 such that the RF amplification circuit 26 is configured to amplify the RF signal 30 when the RF signal 30 is formatted in accordance with a Long Term Evolution (LTE) standard, which utilizes OFDMA to encode data in the RF signal 30. The RF amplification circuit 26 needs to amplify the RF signal 30 without introducing an excessive amount of distortion into the RF signal 30. However, to do this at the maximum efficiency, the RF amplification circuit 26 should operate near saturation. If the saturation voltage simply remains constant, the RF amplification circuit 26 introduces an excessive amount of distortion to the RF signal 30, since the RF amplification circuit 26 is not operating linearly. Often, other approaches have dealt with this problem by backing off from the saturation point. However, in this embodiment, the supply voltage $V_{SUPPLY}$ has a supply voltage level that varies so as to adjust the saturation voltage of the RF amplification circuit 26. Thus, although the RF amplification circuit 26 does not operate linearly when saturated, the saturation voltage of the RF amplification circuit 26 is selected so that the amplification gain associated with that saturation voltage is maintained essentially constant given the input power of the RF signal 30. In this manner, amplification is provided linearly simply by selecting the saturation voltage so that the amplification gain remains essentially the same, regardless of the input power of the RF signal 30.

As shown in FIG. 2, the RF filter 28 is operable to receive the pulsed output voltage 16 from the switching circuit 14, and is configured to convert the pulsed output voltage 16 into the supply voltage $V_{SUPPLY}$. To convert the pulsed output voltage 16 into the supply voltage $V_{SUPPLY}$, the RF filter 28 includes a power inductor 36 coupled in series and a power capacitor 38 coupled in shunt with respect to the switching circuit 14. Accordingly, the power inductor 36 is configured to generate an inductor current 40 in response to the pulsed output voltage 16. While the voltage across the power inductor 36 can change instantly, the power inductor 36 resists changes in the inductor current 40. In contrast, while a current to the power capacitor 38 can change instantly, the power capacitor 38 resists changes in voltage. The supply voltage $V_{SUPPLY}$ in this embodiment is essentially the voltage across the power capacitor 38.

The power capacitor 38 generates the supply voltage $V_{SUPPLY}$ having a supply voltage level that varies in accordance with a ripple variation. However, this ripple variation is generally small, and the RF filter 28 generates the supply voltage $V_{SUPPLY}$ with an average DC supply voltage level set in accordance with a pulse frequency of the pulsed output voltage 16. Similarly, the power inductor 36 provides the inductor current 40 having an inductor current level that varies in accordance with a ripple variation. However, the ripple variation is generally small enough so that the inductor current 40 provides an average DC current level. As the pulse frequency varies, so does the average DC supply voltage level. In this manner, the supply voltage level is, for the most part, DC and can be set to a particular value by adjusting the pulse frequency of the pulsed output voltage 16.

The switching circuit 14 is operable to receive the power source voltage $V_{POWER}$, and is switchable so as to generate the pulsed output voltage 16 from the power source voltage $V_{POWER}$. The switching controller 12 is configured to switch the switching circuit 14 such that the pulsed output voltage 16 has an average pulse frequency. The average pulse frequency is generally a center value for the pulse frequency. In this embodiment, the average pulse frequency may be set to different values, such as, for example, 5 MHz, 18 MHz, or 30 MHz. The pulse frequency may vary from the average pulse frequency by ±4.5 MHz.

However, as discussed above, due to manufacturing variations and/or operational variations, the average pulse frequency (or, in other words, the center pulse frequency) may be set inappropriately or drift. To determine that the average pulse frequency is set incorrectly, the switching controller 12 receives the pulsed feedback signal 20 and detects whether the average pulse frequency of the pulsed output voltage 16 differs from the target average frequency identified by the target average frequency value 18 during the time period. If so, the switching controller 12 adjusts the average pulse frequency to reduce the difference between the average pulse frequency and the target average frequency identified by the target average frequency value 18.

Figure 3:
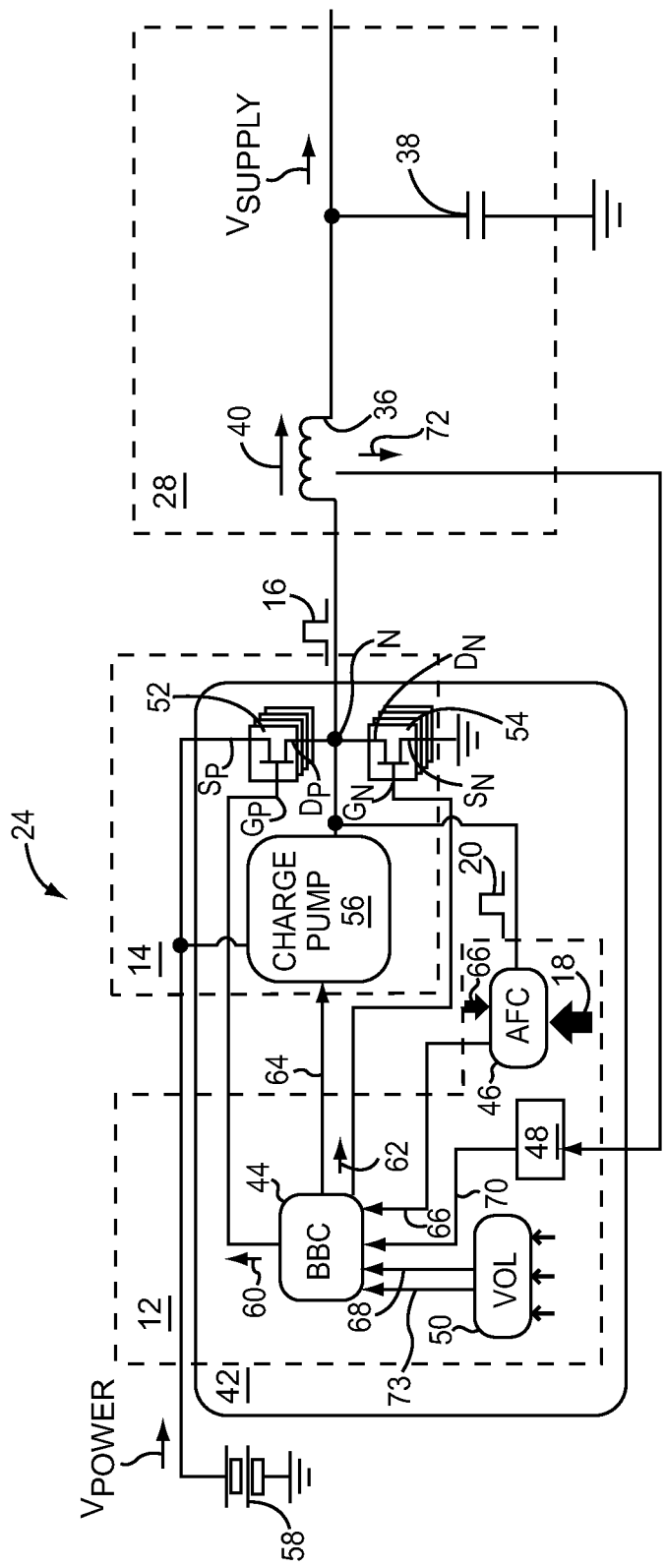
FIG. 3 is a semiconductor layout of one embodiment of the RF switching converter shown in FIG. 2, where the RF switching converter includes a bang-bang controller (BBC), a voltage offset loop (VOL), a current sense detector, and an average frequency controller (AFC).

FIG. 3 illustrates a semiconductor layout of one embodiment of the RF switching converter 24, with the switching controller 12, switching circuit 14, and RF filter 28 shown in FIG. 2. The RF switching converter 24 shown in FIG. 3 includes a semiconductor substrate 42. The switching controller 12 and the switching circuit 14 are formed with the semiconductor substrate 42. In particular, the switching controller 12 and the switching circuit 14 may be formed in a device region formed from metallic layers and doped semiconductor layers in the semiconductor substrate 42. Typical dopants that may be utilized to dope the semiconductor layers in the device region of the semiconductor substrate 42 are Gallium (Ga), Arsenic (As), Silicon (Si), Tellurium (Te), Zinc (Zn), Sulfur (S), Boron (B), Phosphorus (P), Beryllium (Be), Aluminum Gallium Arsenide (AlGaAs), Indium Gallium Arsenide (InGaAs), and/or the like. The device region is generally formed over a semiconductor die within the semiconductor substrate 42. The semiconductor die is generally not doped and can be formed from any suitable semiconductor material, such as Si, Silicon Germanium (SiGe), Gallium Arsenide (GaAs), Indium Phosphorus (InP), and/or the like.

The switching controller 12 shown in FIG. 3 includes a bang-bang controller (BBC) 44, an average frequency controller (AFC) 46, a current sense detector 48, and a voltage offset loop (VOL) 50. The switching controller 12 is operable in a first operational mode, which in this example is an ET operational mode, and in a second operational mode, which in this example is an APT operational mode. The switching circuit 14 includes a P-type field effect transistor (P-FET) 52, an N-type field effect transistor (N-FET) 54, and a charge pump 56. With regard to the switching circuit 14, the P-FET 52 is operable to receive the power source voltage $V_{POWER}$ from a power source 58, such as a battery. The N-FET 54 is operable to receive a reference voltage, such as ground. In this particular embodiment, the P-FET 52 includes a source Sp, a drain $D_P$, and a gate G. The source $S_P$ is configured to receive the power source voltage $V_{POWER}$. The N-FET 54 includes a drain $D_N$, a source $S_N$, and a gate $G_N$. The source $S_N$ is coupled to ground, while the drain $D_N$ is coupled directly to the drain $D_P$ of the P-FET 52. The pulsed output voltage 16 is generated from a node N between the drain $D_P$ and the drain $D_N$.

In order for the switching circuit 14 to generate the pulsed output voltage 16, the BBC 44 of the switching controller 12 is configured to switch the P-FET 52 between an on state and an off state. In the on state, the P-FET 52 is configured to pull the pulsed output voltage 16 toward the power source voltage $V_{POWER}$. The BBC 44 is also configured to switch the N-FET 54 between the on state and the off state. The N-FET 54 is configured to pull the pulsed output voltage 16 toward the reference voltage (i.e., ground) in the on state. To switch the P-FET 52 between the on state and the off state, the BBC 44 is operable to generate a first control signal 60 that may be provided in an activation state or in a deactivation state. The first control signal 60 is received at the gate $G_P$ of the P-FET 52. In the activation state, the first control signal 60 switches the P-FET 52 into the on state to pull the pulsed output voltage 16 toward the power source voltage $V_{POWER}$. When the first control signal 60 is in the deactivation state, the P-FET 52 is turned off and a power source voltage level of the power source voltage $V_{POWER}$ is dropped across the P-FET 52.

The BBC 44 also generates a second control signal 62. The gate $G_N$ of the N-FET 54 is operable to receive the second control signal 62 from the BBC 44. When the second control signal 62 is in an activation state, the N-FET 54 is switched on and the pulsed output voltage 16 is pulled toward the reference voltage, in this case ground. On the other hand, when the second control signal 62 is in the deactivation state, the N-FET 54 is switched off and the voltage from the node N to the reference voltage is dropped across the N-FET 54.

The BBC 44 is operable in a first bang-bang mode, in a second bang-bang mode, in a third bang-bang mode, in a fourth bang-bang mode, in a fifth bang-bang mode, and in a sixth bang-bang mode. In the first bang-bang mode, the BBC 44 only switches the P-FET 52 and the N-FET 54 on and off. As such, the N-FET 54 is switched off when the P-FET 52 is switched on. In this case, the pulsed output voltage 16 is provided in a first voltage state near the power source voltage level (at voltage magnitude BUCK) of the power source voltage $V_{POWER}$. On the other hand, when the P-FET 52 is switched off, the N-FET 54 is switched on. Thus, the pulsed output voltage 16 is provided in a second voltage state near the reference voltage level of the reference voltage (in this case, near ground).

The BBC 44 may be set in the first bang-bang mode when the switching controller 12 is in the ET operational mode. The BBC 44 may also be set in the first bang-bang mode when the switching controller 12 is in the APT operational mode. For example, the BBC 44 may be set in the first bang-bang mode during APT when the VOL 50 is activated and being used to generate an APT signal 73. The BBC 44 may be also be set in the first bang-bang mode if another APT signal is being used (such as an APT signal received by the switching controller 12 from external circuitry or an APT signal 280 (see below)).

With regard to the second bang-bang mode, the BBC 44 is also operable to control switches within the charge pump 56. The charge pump 56 has a switching topology that may include two flying capacitors and seven switches to allow the charge pump 56 to generate two different boost voltages that can be dynamically selected. Thus, while in the first bang-bang mode, the BBC 44 only switches the N-FET 54 and the P-FET 52 on and off to present step-down buck voltages at the node N. However, in the second bang-bang mode, the BBC 44 is further configured to operate the switches in the charge pump 56 so as to present two different boost voltage states, equal to about 1.5 times the power source voltage $V_{POWER}$ (i.e., the third voltage state) and 2 times the power source voltage $V_{POWER}$ (i.e., the fourth voltage state) at node N. The BBC 44 may generate a charge pump output 64, which may include several control signals to control the switches of the charge pump 56. In the second bang-bang mode, the BBC 44 may switch the switching circuit 14 so that the pulsed output voltage 16 is provided at any of the four voltage states. The operation of the BBC 44 is explained in further detail below. The BBC 44 may be set in the second bang-bang mode both when the switching controller 12 is in the ET operational mode and, if the VOL 50 is being used to generate the APT signal 73, when the switching controller 12 is in the APT operational mode.

With regard to the third bang-bang mode, the BBC 44 is operable to control switches within the charge pump 56. In the third bang-bang mode, the BBC 44 is configured to operate the switches of the charge pump 56 so that the pulsed output voltage 16 is provided only between the first voltage state and the third voltage state. The BBC 44 may be set in the third bang-bang mode both when the switching controller 12 is in the ET operational mode and, if the VOL 50 is being used to generate the APT signal 73, when the switching controller 12 is in the APT operational mode.

The BBC 44 is also operable to control switches within the charge pump 56 in the fourth bang-bang mode. In the fourth bang-bang mode, the BBC 44 is configured to operate the switches of the charge pump 56 so that the pulsed output voltage 16 is provided only between the third voltage state and the fourth voltage state. The BBC 44 may be set in the fourth bang-bang mode both when the switching controller 12 is in the ET operational mode and, if the VOL 50 is being used to generate the APT signal 73, when the switching controller 12 is in the APT operational mode.

In the fifth bang-bang mode, the BBC 44 is configured to operate the switches of the charge pump 56 so that the pulsed output voltage 16 is provided only between the first voltage state and the third voltage state, as in the third bang-bang mode. However, in the fifth bang-bang mode, the BBC 44 uses the same thresholds as in the first bang-bang mode, as explained in further detail below. The fifth bang-bang mode is not used when the switching controller 12 is in the ET operational mode, or during the APT operational mode if the VOL 50 is being used to generate the APT signal 73.

In the sixth bang-bang mode, the BBC 44 is configured to operate the switches of the charge pump 56 so that the pulsed output voltage 16 is provided only between the third voltage state and the fourth voltage state, as in the fourth bang-bang mode. However, in the sixth bang-bang mode, the BBC 44 uses the same thresholds as in the first bang-bang mode, as explained in further detail below. The BBC 44 may be set in the sixth bang-bang mode both when the switching controller 12 is in the ET operational mode and during the APT operational mode. The sixth bang-bang mode is not used when the switching controller 12 is in the ET operational mode or, if the VOL 50 is being used to generate the APT signal 73, in the APT operational mode.

To determine when to switch on and switch off the P-FET 52 and the N-FET 54 in either the first bang-bang mode or the second bang-bang mode, the BBC 44 receives a threshold parameter 66 from the AFC 46. The AFC 46 of the switching controller 12 is operable to receive the threshold parameter 66 at an initialized value from external circuitry. The BBC 44 is also operable to receive an offset voltage 68 from the VOL 50 when the switching controller 12 is operating in the ET operational mode. Finally, the BBC 44 is operable to receive a current sense signal 70 from the current sense detector 48 when the switching controller 12 is operating in the ET operational mode. The current sense signal 70 has a signal level indicative of a current level of the inductor current 40 of the power inductor 36. To do this, the current sense detector 48 receives a feedback voltage 72 and generates the current sense signal 70 as a current having a current level indicative of the current level of the inductor current 40 in the ET operational mode.

The BBC 44 is configured to set the average pulse frequency of the pulsed output voltage 16 based on the threshold parameter 66 from the AFC 46. To correct the average pulse frequency, the AFC 46 adjusts the threshold parameter 66 to reduce the difference between the average pulse frequency and the target average frequency identified by the target average frequency value 18. After the time period for detection of the average pulse frequency, the AFC 46 adjusts the threshold parameter 66 and provides the updated threshold parameter 66 to the BBC 44.

The current sense detector 48 and the VOL 50 are each operable to be activated and deactivated. In the ET operational mode, the BBC 44 is operable to receive the current sense signal 70 from the current sense detector 48 and the offset voltage 68 from the VOL 50. As such, when the switching controller 12 operates in the ET operational mode, the current sense detector 48 and the VOL 50 are activated. The VOL 50 is further operable in the ET operational mode and in the APT operational mode. When the switching controller 12 is operating in the ET operational mode, the VOL 50 is also configured to operate in the ET operational mode. In the ET operational mode, the VOL 50 is configured to generate the offset voltage 68 having an offset voltage magnitude, as explained above. The BBC 44 is configured to switch the switching circuit 14 based on the current sense signal 70 and the offset voltage 68 so that the switching circuit 14 generates the pulsed output voltage 16. More specifically, the BBC 44 is configured to switch the switching circuit 14 based on the sense signal level of the current sense signal 70 and the offset voltage magnitude of the offset voltage 68 so that the switching circuit 14 generates the pulsed output voltage 16.

It should be noted that, in this embodiment, the current sense detector 48 is configured to generate the current sense signal 70 such that a derivative of the current sense signal 70 is negatively proportional to a derivative of the inductor current 40 (see FIG. 3), which is a supply current from the switching circuit 14. As a derivative of the supply voltage $V_{SUPPLY}$ (see FIG. 3) across the power capacitor 38 is directly proportional to the derivative of the inductor current 40, the derivative of the current sense signal 70 is also negatively proportional to a derivative of the supply voltage $V_{SUPPLY}$. Thus, the VOL 50 is configured to generate the current sense signal 70 such that a first change in the inductor current 40 (or in the supply voltage level of the supply voltage $V_{SUPPLY}$) results in a second change in the sense signal level, the second change being negatively proportional to the first change. Accordingly, the sense signal level of the current sense signal 70 increases as a result of the inductor current 40 (or supply voltage level of the supply voltage $V_{SUPPLY}$) decreasing and vice versa. In this example, the current sense signal 70 is a sense current and the sense signal level is a current level of the sense current.

As discussed above, the switching controller 12 is also operable in the APT operational mode. In the APT operational mode, the BBC 44 is operable to receive the APT signal 73 and is configured to switch the switching circuit 14 based on an APT signal level of the APT signal 73 so that the switching circuit 14 generates the pulsed output voltage 16. When the switching controller 12 is in the APT operational mode, the current sense detector 48 is deactivated and thus does not generate the current sense signal 70. Rather, the VOL 50 may be activated and also operate in the APT operational mode. The VOL 50 does not generate the offset voltage 68 in the APT operational mode. Rather, the VOL 50 is configured to generate the APT signal 73 in the APT operational mode. The APT signal 73 is generated by the VOL 50 such that the APT signal level varies from a DC offset signal level of the APT signal in accordance with the ripple variation of the supply voltage level of the supply voltage $V_{SUPPLY}$. Thus, the BBC 44 is configured to switch the switching circuit 14 based on an APT signal level of the APT signal 73 in the APT operational mode so that the switching circuit 14 generates the pulsed output voltage 16. In this manner, the supply voltage level of the supply voltage $V_{SUPPLY}$ has an average DC supply voltage level set in accordance with the DC offset signal level of the APT signal 73 in the APT operational mode. Alternatively, the VOL 50 may be deactivated when the switching controller 12 is in the APT operational mode. In this case, the APT signal 73 may be received from an internal or external APT controller, as explained in further detail below.

It should be noted that, in this embodiment, the VOL 50 is configured to generate the APT signal 73 such that a derivative of the APT signal 73 is negatively proportional to a derivative of the supply voltage $V_{SUPPLY}$. Thus, the VOL 50 is configured to generate the APT signal 73 such that a first change in the supply voltage level of the supply voltage $V_{SUPPLY}$ results in a second change in the APT signal level, the second change being negatively proportional to the first change. Accordingly, the APT signal level increases as a result of the supply voltage level decreasing, and vice versa. In this example, the APT signal 73 is an APT voltage and the APT signal level is an APT voltage level.

Figure 4:
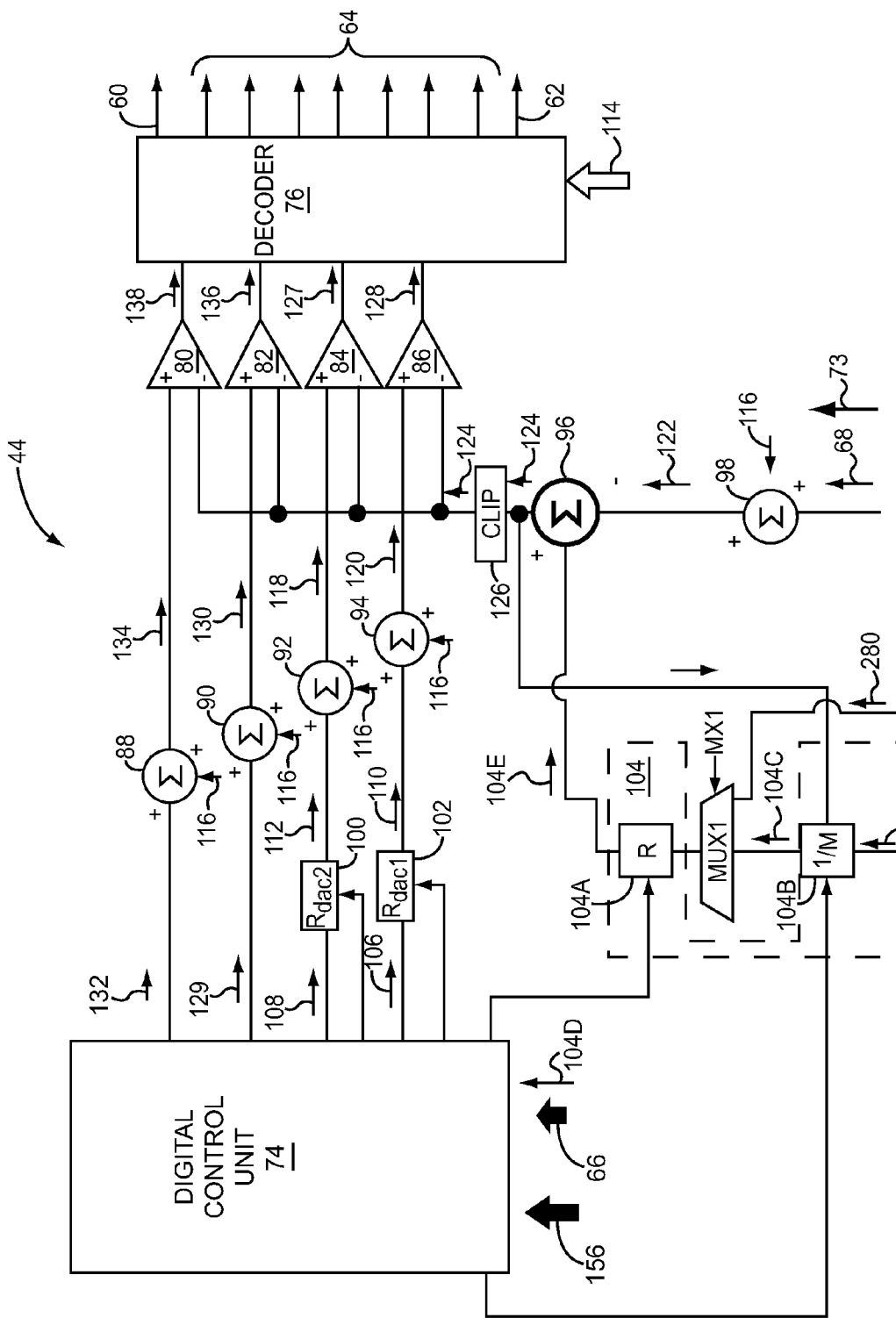
FIG. 4 illustrates one embodiment of the BBC shown in FIG. 3, which compares a sense voltage level of a sense voltage to threshold voltage levels to operate the switching circuit shown in FIG. 3.

FIG. 4 illustrates one embodiment of the BBC 44 shown in FIG. 3. The BBC 44 includes a digital control unit 74, a decoder 76, a comparator 80, a comparator 82, a comparator 84, a comparator 86, a voltage adder 88, a voltage adder 90, a voltage adder 92, a voltage adder 94, a voltage adder 96, a voltage adder 98, a variable resistor 100, a variable resistor 102, a mirrored ratio circuit 104, and a multiplexer MUX1. The digital control unit 74 is configured to receive the threshold parameter 66 from the AFC 46 (shown in FIG. 3). The BBC 44 is configured to set a first threshold voltage level based on the threshold parameter 66. To do this, the digital control unit 74 searches a stored list of threshold magnitudes based on the threshold parameter 66. The threshold magnitude |TM| is then used to generate a first intermediary current signal 106 and a second intermediary current signal 108. The first intermediary current signal 106 has a current level with a negative of the threshold magnitude, $-|TM|$. The first intermediary current signal 106 is transmitted through the variable resistor 102 to provide a first intermediary voltage 110. In this embodiment, the first intermediary voltage 110 is a voltage across the variable resistor 102. The variable resistor 102 has a variable resistance of $R_{dac1}$, which is set by the digital control unit 74.

With regard to the second intermediary current signal 108, the second intermediary current signal 108 has a current level that is a positive of the threshold magnitude, +|TM|. The second intermediary current signal 108 is transmitted through the variable resistor 100 to generate a second intermediary voltage 112. In this embodiment, the second intermediary voltage 112 is a voltage across the variable resistor 100. The variable resistor 100 has a variable resistance of $R_{dac2}$. The digital control unit 74 is configured to set the variable resistance $R_{dac2}$. Generally, the variable resistances $R_{dac1}$, $R_{dac2}$ are set by the digital control unit 74 to the same, or substantially the same, resistance value.

With regard to the decoder 76, the decoder 76 is configured to receive an operational mode control input 114. The operational mode control input 114 may include one or more bit signals in order to represent a word. In this manner, the operational mode control input 114 may indicate the first bang-bang mode, the second bang-bang mode, the third bang-bang mode, the fourth bang-bang mode, the fifth bang-bang mode, or the sixth bang-bang mode. As shown in FIG. 4, the voltage adders 92 and 94 are provided in order to add a range voltage 116 to the first intermediary voltage 110 and the second intermediary voltage 112. In the first bang-bang mode, however, the range voltage 116 has a voltage level of zero (0) Volts. From the voltage adder 92, a first threshold signal 118 is generated having a first threshold voltage level based on the threshold parameter 66. From the voltage adder 94, a second threshold signal 120 is generated having a second threshold voltage level based on the threshold parameter 66.

The first threshold voltage level and the second threshold voltage level are used to determine when to turn on and turn off the P-FET 52 (shown in FIG. 3) and the N-FET 54 (shown in FIG. 3) in the first through fourth bang-bang modes. In the first bang-bang mode, only the first threshold voltage level of the first threshold signal 118 and the second threshold voltage level of the second threshold signal 120 are relevant. The charge pump 56 (shown in FIG. 3) is not utilized. However, with regard to the second bang-bang mode, the third bang-bang mode, and the fourth bang-bang mode, additional threshold levels to set boost levels can be provided through the operation of the charge pump 56 when the switching controller 12 is in the ET operational mode.

In the embodiment shown in FIG. 4, both the first threshold signal 118 and the second threshold signal 120 are voltages, and in particular, DC voltages. Thus, the first threshold voltage level of the first threshold signal 118 and the second threshold voltage level of the second threshold signal 120 are relatively constant voltage levels. The second threshold voltage level is lower than the first threshold voltage level because the first intermediary current signal 106 had the negative of the threshold magnitude, −|TM|, while the second intermediary current signal 108 had the positive of the threshold magnitude, +|TM|. The first threshold signal 118 is received at a non-inverting terminal of the comparator 84, while the second threshold signal 120 is received at a non-inverting terminal of the comparator 86.

During the ET operational mode, the current sense detector 48 and the VOL 50 are both activated. The VOL 50 is set to operate in the ET operational mode. The current sense signal 70 is provided to the mirrored ratio circuit 104. The mirrored ratio circuit 104 has a variable resistor 104A and a mirror circuit 104B. The mirror circuit 104B receives the current sense signal 70 and is configured to generate a mirror current 104C from the current sense signal 70. The multiplexer MUX1 is configured to select the mirror current 104C, and thus the current sense signal 70, in response to a multiplexer select bit signal MX1 being in a first bit state (i.e., logical "1" or logical "0"). In the ET operational mode, the multiplexer select bit signal MX1 is provided in the first bit state so that the multiplexer MUX1 selects the current sense signal 70 (i.e., through the mirror current 104C) from the current sense detector 48 when the current sense detector 48 is activated. A ratio of a current level of the mirror current 104C and the current level of the current sense signal 70 is 1/M. The ratio 1/M is variable where the value of M is controlled by the digital control unit 74 based on a dedicated MIPI bit 104D.

The first threshold voltage level and the second threshold voltage level are set to equal the $R_{dac}$ (i.e., the resistance value of either $R_{dac1}$ or $R_{dac2}$)/R*M*|TM|. With regard to the first bang-bang mode, the value of M is set equal to 20. For instance, since the threshold parameter 66 is 4 bits, the threshold parameter 66 may represent current levels from 20 mA to 40 mA in steps of 2 mA. The second bang-bang mode requires an increased range. To increase the range for the second bang-bang mode, the value M is set equal to 40. For instance, since the threshold parameter 66 is 4 bits, the threshold parameter may represent current levels from 40 mA to 80 mA in steps of 4 mA. The threshold parameter 66 may thus represent current levels where the ratio of 1/M may be changed from 1/20 to 1/40 via the dedicated MIPI bit 104D.

A preliminary voltage 104E, which is the voltage across the variable resistor 104A, is then generated and provided to the voltage adder 96. The variable resistor 104A has a variable resistance R, which is set by the digital control unit 74. During operation of the VOL 50 (shown in FIG. 3) in fast mode, there is a need for a large dynamic range to control large current through an offset capacitor (discussed below), thus the variable resistances R, $R_{dac1}$, $R_{dac2}$ are reduced so that R and $R_{dac1}$, and R and $R_{dac2}$, have the same ratio to allow an increased feedback dynamic range, and the decoder 76 operates in the second bang-bang mode. Then, at the end of the fast mode, both the ratios for R and $R_{dac1}$, and R and $R_{dac2}$ are set back to their nominal values and the decoder 76 operates in the first bang-bang mode.

The offset voltage 68 is received at the voltage adder 98 from the VOL 50, which adds the range voltage 116 so as to generate a preliminary voltage 122. The preliminary voltage 122 is subtracted from the preliminary voltage 104E so as to generate a sense voltage 124 having a sense voltage level indicative of a current level of the current across the power inductor 36 (shown in FIG. 3) and the supply voltage level of the supply voltage $V_{SUPPLY}$. As mentioned above, in the first bang-bang mode, only the first threshold voltage level of the first threshold signal 118 and the second threshold voltage level of the second threshold signal 120 are relevant. In this embodiment, the sense voltage 124 is a voltage, while the current sense signal 70 is a current. A clip 126 provides voltage limitations to the sense voltage 124 to ensure that the appropriate headroom is provided to the P-FET 52 (shown in FIG. 3) and the N-FET 54 (shown in FIG. 3).

The comparator 84 generates a comparator signal 127 from the comparison of the sense voltage 124 and the first threshold signal 118. The decoder 76 turns on the P-FET 52 and turns off the N-FET 54 in response to the sense voltage level being above the first threshold voltage level. As such, the decoder 76 is configured to generate the first control signal 60 in the activation state and the second control signal 62 in the deactivation state. The comparator 86 generates a comparator signal 128, which is received by the decoder 76. The comparator 86 is configured to compare the second threshold voltage level and the sense voltage level of the sense voltage 124. The decoder 76 is configured to turn off the P-FET 52 and turn on the N-FET 54 in response to the sense voltage level of the sense voltage 124 being below the second threshold voltage level of the second threshold signal 120. Thus, in this case, the decoder 76 is configured to generate the first control signal 60 in the deactivation state and the second control signal 62 in the activation state. Note that the BBC 44 does not turn off the P-FET 52 and turn on the N-FET 54 when the sense voltage level is below the first threshold voltage level of the first threshold signal 118. Rather, the P-FET 52 is turned off and the N-FET 54 is turned on in response to the sense voltage level being below the second threshold voltage level. This provides the so-called "bang-bang" control operation of the BBC 44.

In the second bang-bang mode, the range voltage 116 is also provided to provide a greater range for comparisons. For example, the range voltage 116 may have a range voltage level of approximately 1.7 volts in the second bang-bang mode. A third intermediary voltage 129 is generated by the digital control unit 74 based on the threshold parameter 66. A third threshold signal 130 is generated from the voltage adder 90 having a third threshold voltage level. In this manner, the BBC 44 is configured to set a third threshold voltage level that is higher than the first threshold voltage level in the high voltage mode. Additionally, the digital control unit 74 is configured to generate a fourth intermediary voltage 132 based on the threshold parameter 66 in the high voltage mode. A fourth threshold signal 134 is generated from the voltage adder 88 having a fourth threshold voltage level. In this manner, the BBC 44 is configured to set a fourth threshold voltage level that is higher than the third threshold voltage level.

The comparator 82 receives the third threshold signal 130 at a non-inverting input and the sense voltage 124 at an inverting input. A comparator signal 136 is generated from the comparator 82. The decoder 76 is configured to switch the charge pump 56 (shown in FIG. 3) such that the pulsed output voltage 16 is provided in the first high voltage state (which, in this example, is approximately 1.5 times the power source voltage level of the power source voltage $V_{POWER}$) in response to the sense voltage level being above the third threshold voltage level of the third threshold signal 130. The comparator 80 is configured to receive the fourth threshold signal 134 at a non-inverting terminal and the sense voltage 124 at an inverting terminal. The comparator 80 is configured to generate a comparator signal 138. The decoder 76 is configured to switch the charge pump 56 such that the pulsed output voltage 16 is provided in the second high voltage state (which, in this example, is approximately double the power source voltage level of the power source voltage $V_{POWER}$) in response to the sense voltage level being above the fourth threshold voltage level. The decoder 76 is configured to control the charge pump 56 by controlling the activation and deactivation states of the control signals in the charge pump output 64.

Figure 5A:
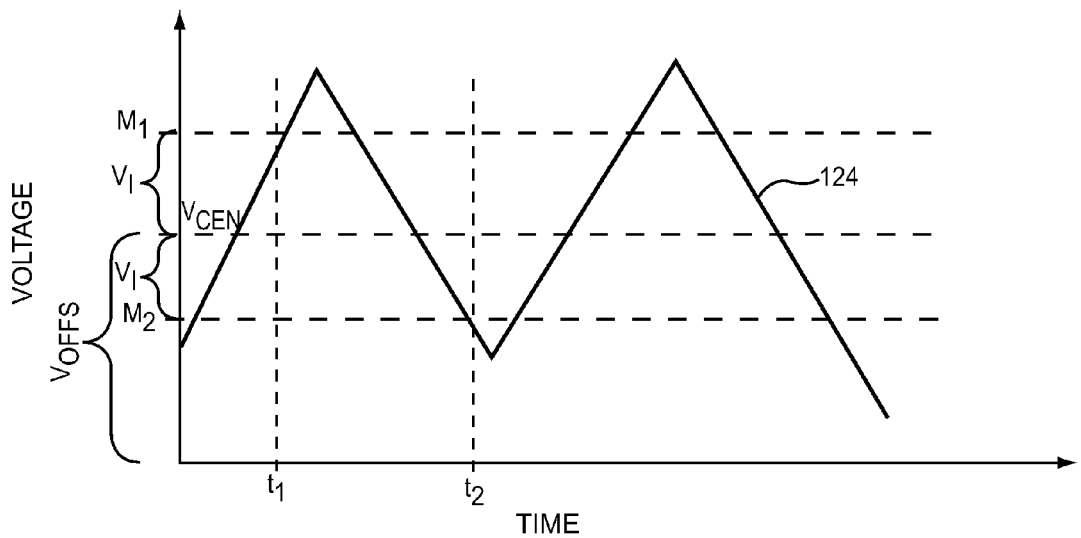
FIG. 5A illustrates one embodiment of the sense voltage as a function of time along with threshold voltage levels when the BBC shown in FIG. 4 is operating in a first bang-bang mode.
Figure 5B:
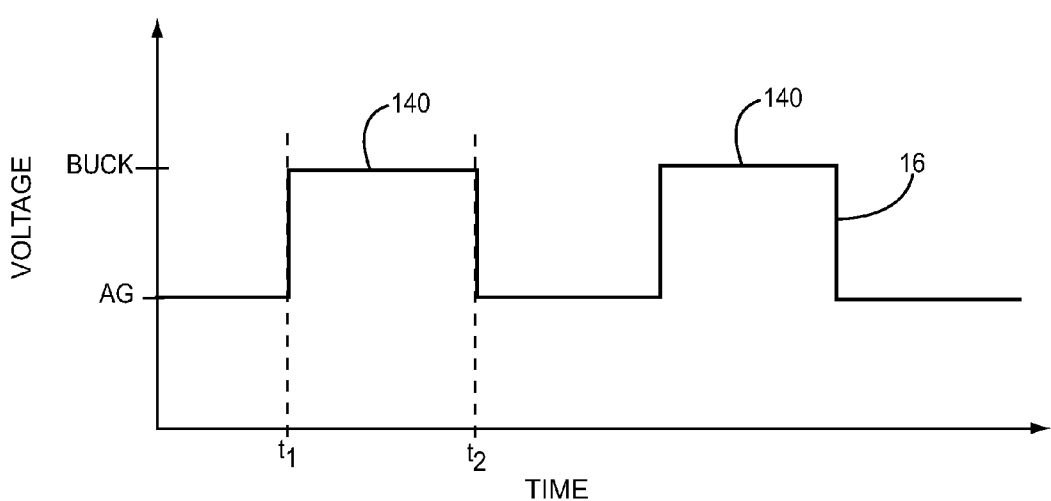
FIG. 5B illustrates one embodiment of the pulsed output voltage generated by the switching circuit shown in FIG. 3 when the BBC shown in FIG. 4 is operating in the first bang-bang mode.

Referring now to FIGS. 5A-5B, FIG. 5A illustrates one embodiment of the sense voltage 124 with respect to time. A voltage magnitude $V_{OFFS}$ is the magnitude of the offset voltage 68 received from the VOL 50 shown in FIG. 3. Thus, in the first bang-bang mode, the voltage magnitude $V_{OFFS}$ determines a center voltage level $V_{CEN}$ since the first intermediary current signal 106 was the negative of the threshold magnitude |TM|. Thus, the second threshold voltage level is provided at a voltage difference $V_I$ lower than the center voltage level $V_{CEN}$. The second threshold voltage level is thus at $M_2$.

Since the second intermediary current signal 108 had a current level that was the positive of the threshold magnitude |TM|, the first threshold voltage level of the first threshold signal 118 is provided at $M_1$. The first threshold voltage level $M_1$ is the voltage difference $V_I$ above the center voltage level $V_{CEN}$.

FIG. 5B illustrates one embodiment of the pulsed output voltage 16 in the first bang-bang mode. The voltage magnitude BUCK in FIG. 5B represents the voltage level resulting in the pulsed output voltage 16 when the P-FET 52 (shown in FIG. 3) is pulled up near the power source voltage level of the power source voltage $V_{POWER}$ (shown in FIG. 3). The voltage magnitude AG (i.e., approximately ground) in FIG. 5B represents the voltage level resulting in the pulsed output voltage 16 when the N-FET 54 (shown in FIG. 3) is pulled down near ground. As shown in FIG. 5A, the sense voltage level of the sense voltage 124 is above the first threshold voltage level $M_1$ at time $t_1$. Accordingly, the P-FET 52 pulls the pulsed output voltage 16 to the voltage magnitude BUCK in response to the sense voltage level of the sense voltage 124 being above the first threshold voltage level $M_1$, as shown in FIG. 5B. The pulsed output voltage 16 is maintained at the voltage magnitude BUCK until time $t_2$. As shown in FIG. 5A, the sense voltage level of the sense voltage 124 is below the second threshold voltage level $M_2$ at time $t_2$. Accordingly, the N-FET 54 pulls the pulsed output voltage 16 to the voltage level AG in response to the sense voltage level of the sense voltage 124 being below the second threshold voltage level $M_2$, as shown in FIG. 5B. The process repeats itself to generate pulses 140 in the pulsed output voltage 16. The BBC 44 shown in FIG. 3 is thus configured to switch the switching circuit 14 at a switching frequency that is based on the threshold parameter 66. This is because the threshold parameter 66 determines the voltage and the voltage difference $V_I$, and thus determines how often and for how long a pulse 140 is provided in the pulsed output voltage 16.

Figure 6A:
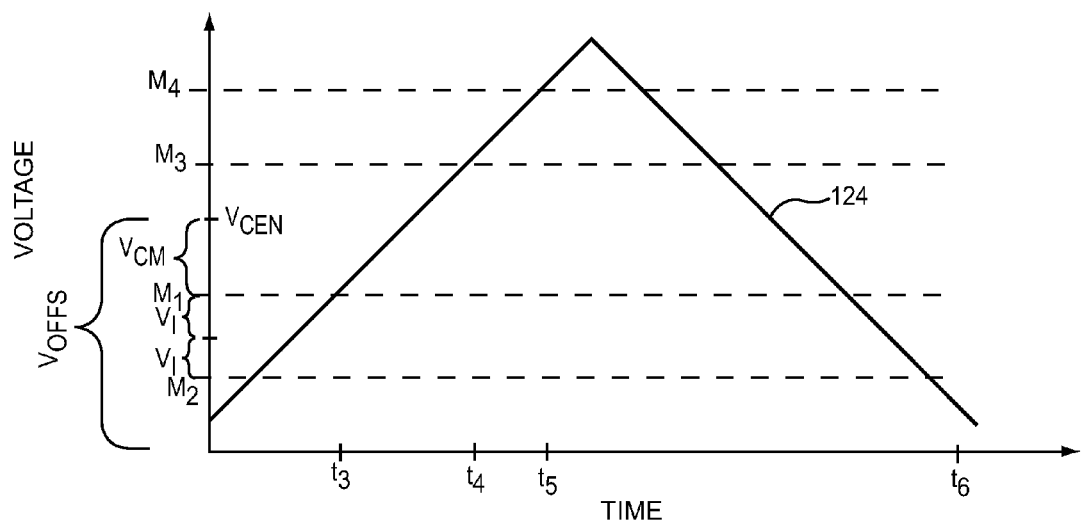
FIG. 6A illustrates one embodiment of the current sense signal as a function of time along with threshold voltage levels when the BBC is operating in a second bang-bang mode.
Figure 6B:
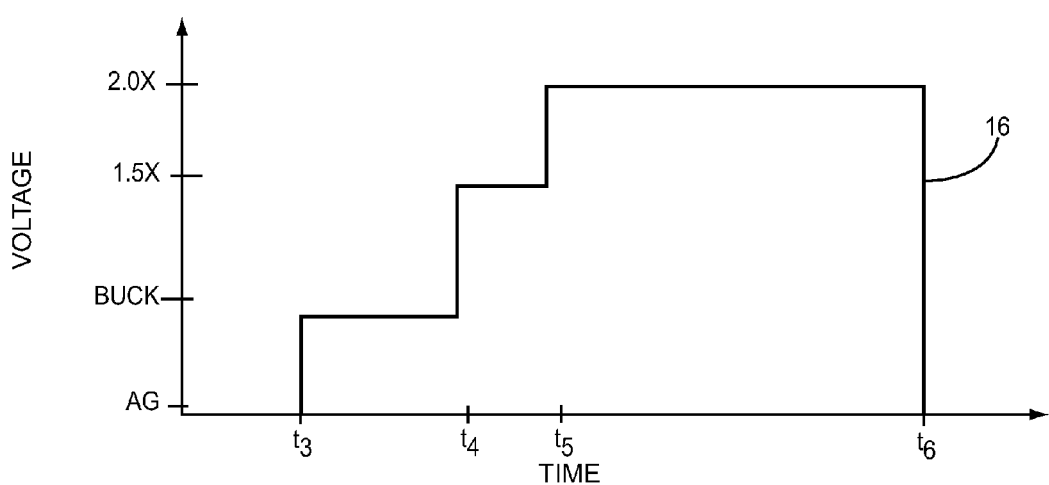
FIG. 6B illustrates one embodiment of the pulsed output voltage generated by the switching circuit shown in FIG. 3 when the BBC shown in FIG. 4 is operating in the second bang-bang mode.

FIG. 6A and FIG. 6B illustrate the operation of the BBC 44 shown in FIG. 3 in the second bang-bang mode. Note that in the second bang-bang mode, the first threshold voltage level $M_1$ and the second threshold voltage level $M_2$ have been adjusted downward by the range voltage level $V_{CM}$ of the range voltage 116 (shown in FIG. 4). The sense voltage 124 is shown in FIG. 6A, along with the third threshold voltage level $M_3$ of the third threshold signal 130 and the fourth threshold voltage level $M_4$ of the fourth threshold signal 134.

At time $t_3$, the sense voltage level of the sense voltage 124 is above the first threshold voltage level $M_1$, as shown in FIG. 6A. Accordingly, in response, the pulsed output voltage 16 is pulled to the voltage magnitude BUCK, as shown in FIG. 6B. The voltage level of the pulsed output voltage 16 is maintained at the voltage magnitude BUCK until time $t_4$. At time $t_4$, the sense voltage level of the sense voltage 124 is above the third threshold voltage level $M_3$, as shown in FIG. 6A. Accordingly, the BBC 44 switches the charge for the charge pump 56 so that the voltage level of the pulsed output voltage 16 is provided at the high voltage state of 1.5×, as shown in FIG. 6B. The voltage level is maintained in the high voltage state 1.5× (i.e., the third voltage state) until time $t_5$. At time $t_5$, the sense voltage level of the sense voltage 124 is above the fourth threshold voltage level $M_4$, as shown in FIG. 6A. Accordingly, in response, the BBC 44 operates the charge pump 56 so that the voltage level of the pulsed output voltage 16 is provided at the high voltage state 2.0× (i.e., the fourth voltage state), as shown in FIG. 6B. The voltage level of the pulsed output voltage 16 is maintained at the high voltage state 2.0× until time $t_6$. At time $t_6$, the sense voltage level of the sense voltage 124 is below the second threshold voltage level $M_2$, as shown in FIG. 6A. Accordingly, in response, the voltage level of the pulsed output voltage 16 is pulled down to the voltage level AG, as shown in FIG. 6B. Given that an example of the operation of the BBC 44 (shown in FIG. 3) in FIGS. 5A, 5B, 6A, and 6B has been given, the operation of embodiments of the AFC 46 (shown in FIG. 3) can now be described.

Figure 7A:
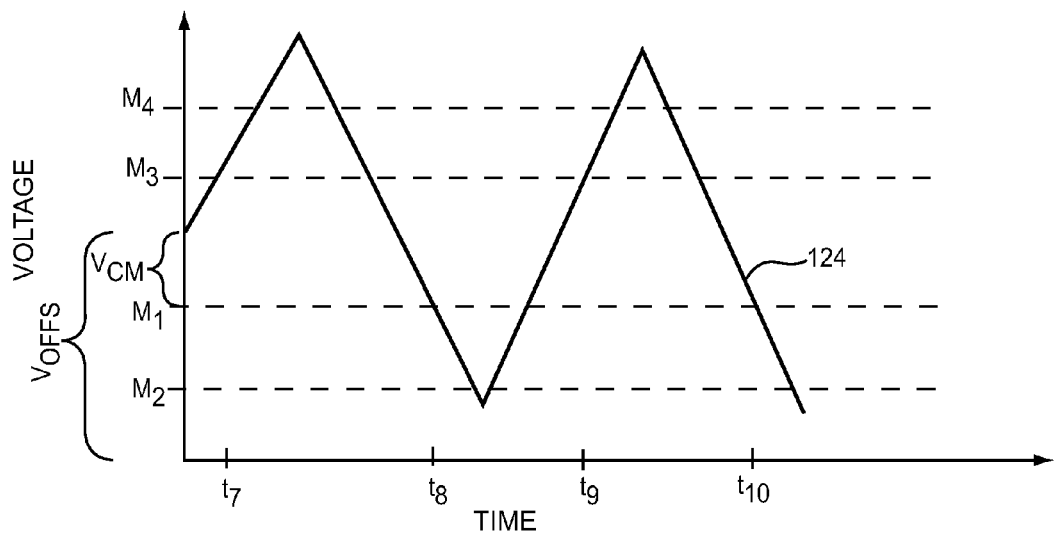
FIG. 7A illustrates one embodiment of the sense voltage as a function of time along with threshold voltage levels when the BBC shown in FIG. 4 is operating in a third bang-bang mode.
Figure 7B:
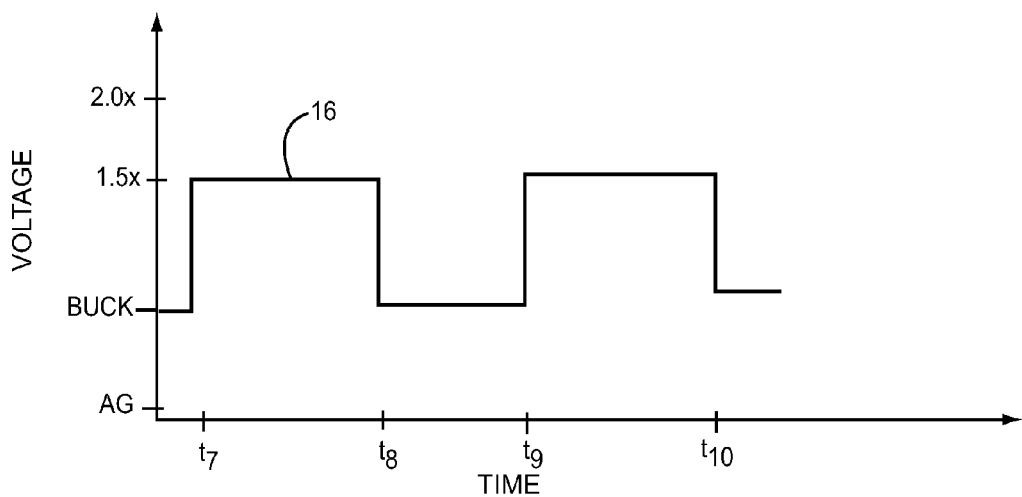
FIG. 7B illustrates one embodiment of the pulsed output voltage generated by the switching circuit shown in FIG. 3 when the BBC shown in FIG. 4 is operating in the third bang-bang mode.

Referring now to FIGS. 7A-7B, FIG. 7A illustrates one embodiment of the sense voltage 124 with respect to time. The voltage magnitude $V_{OFFS}$ is the magnitude of the offset voltage 68 received from the VOL 50 shown in FIG. 3. The threshold voltage levels $M_1$, $M_2$, $M_3$, and $M_4$ are the same as those in the second bang-bang mode. However, only the first threshold voltage level $M_1$ and the third threshold voltage level $M_3$ are relevant in the fourth bang-bang mode.

FIG. 7B illustrates one embodiment of the pulsed output voltage 16 in the third bang-bang mode. As shown in FIG. 7A, the sense voltage level of the sense voltage 124 is above the third threshold voltage level $M_3$ at time $t_7$. Accordingly, in response, the BBC 44 operates the charge pump 56 so that the voltage level of the pulsed output voltage 16 is provided at the high voltage state 1.5× (i.e., the third voltage state), as shown in FIG. 7B. The pulsed output voltage 16 is maintained at the third voltage state 1.5× until time $t_8$. As shown in FIG. 7A, the sense voltage level of the sense voltage 124 is below the first threshold voltage level $M_1$ at the time $t_8$. Accordingly, in response, the BBC 44 operates the P-FET 52 so that the voltage level of the pulsed output voltage 16 is provided at the first voltage state with the voltage magnitude BUCK, as shown in FIG. 7B. The process repeats itself at times $t_9$ and $t_{10}$.

Figure 8A:
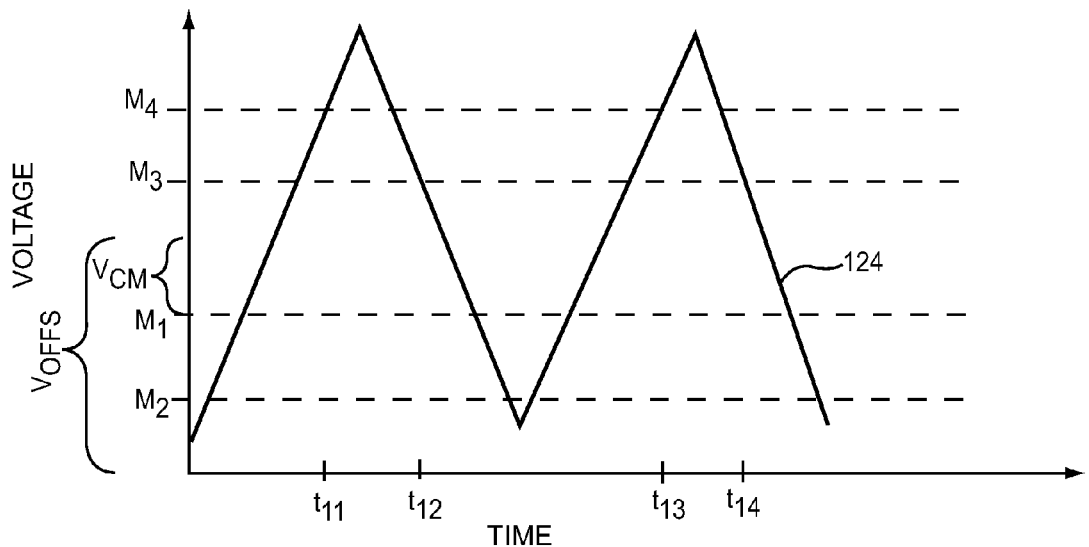
FIG. 8A illustrates one embodiment of the sense voltage as a function of time along with threshold voltage levels when the BBC shown in FIG. 4 is operating in a fourth bang-bang mode.
Figure 8B:
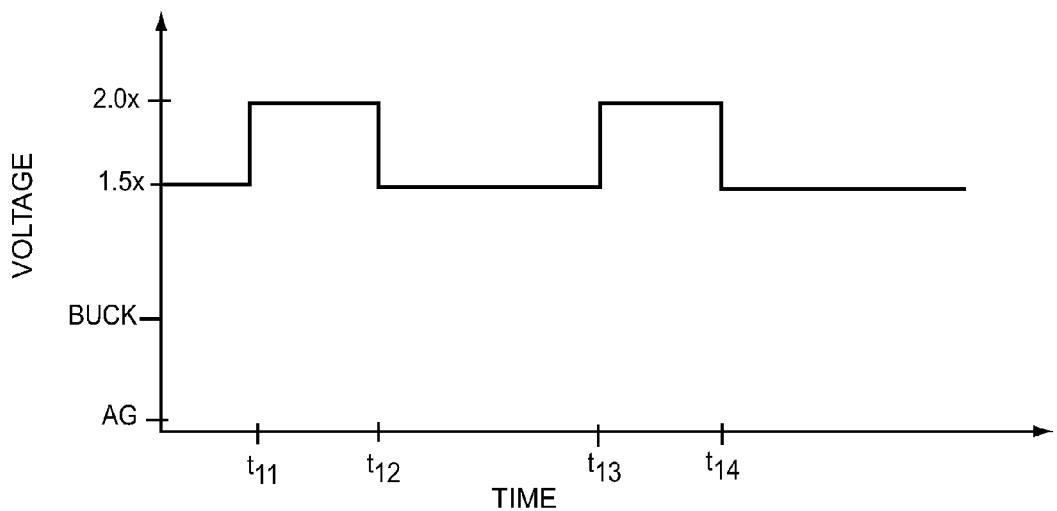
FIG. 8B illustrates one embodiment of the pulsed output voltage generated by the switching circuit shown in FIG. 3 when the BBC shown in FIG. 4 is operating in the fourth bang-bang mode.

Referring now to FIGS. 8A-8B, FIG. 8A illustrates one embodiment of the sense voltage 124 with respect to time. The voltage magnitude $V_{OFFS}$ is the magnitude of the offset voltage 68 received from the VOL 50 shown in FIG. 3. The threshold voltage levels $M_1$, $M_2$, $M_3$, and $M_4$ are the same as those in the second bang-bang mode. However, only the fourth threshold voltage level $M_4$ and the third threshold voltage level $M_3$ are relevant in the fourth bang-bang mode.

FIG. 8B illustrates one embodiment of the pulsed output voltage 16 in the fourth bang-bang mode. As shown in FIG. 8A, the sense voltage level of the sense voltage 124 is above the fourth threshold voltage level $M_4$ at time $t_{11}$. Accordingly, in response, the BBC 44 operates the charge pump 56 so that the voltage level of the pulsed output voltage 16 is provided at the high voltage state 2.0× (i.e., the fourth voltage state), as shown in FIG. 7B. The pulsed output voltage 16 is maintained at the voltage state 2.0× until time $t_{12}$. As shown in FIG. 8A, the sense voltage level of the sense voltage 124 is below the third threshold voltage level $M_3$ at the time $t_{12}$. Accordingly, in response, the BBC 44 operates the charge pump 36 so that the voltage level of the pulsed output voltage 16 is provided at the third voltage state with the 1.5× voltage magnitude, as shown in FIG. 8B. The process repeats itself at times $t_{13}$ and $t_{14}$.

Figure 9:
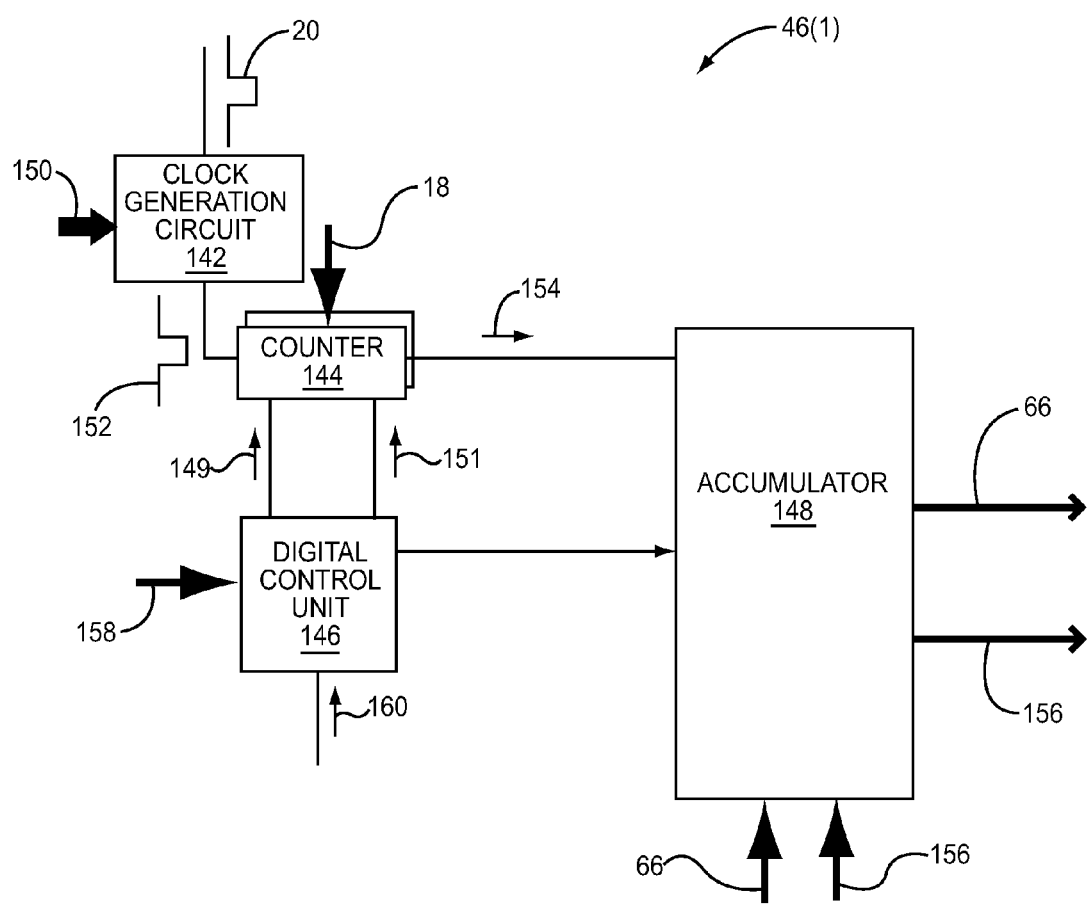
FIG. 9 illustrates one embodiment of the AFC shown in FIG. 3, wherein the AFC sets a pulse count integer to an initial value and decrements the pulse count integer to a final value to determine whether an average pulse frequency of the pulsed output voltage is greater than or less than a target average frequency.

FIG. 9 illustrates one embodiment of an AFC 46(1). The AFC 46(1) includes a clock generation circuit 142, a counter 144, a digital control unit 146, and an accumulator 148. In this embodiment, the clock generation circuit 142 receives a pulse ratio parameter 150 that identifies a pulse ratio. For example, the pulse ratio parameter 150 may be an integer equal to one (1), two (2), or four (4). The clock generation circuit 142 generates a clock signal from the pulsed feedback signal 20. More specifically, the clock generation circuit 142 shown in FIG. 9 is configured to generate a clock signal 152 such that clock pulses of the clock signal 152 are provided at the pulse ratio with respect to the pulses 140 (shown in FIG. 5B) of the pulsed output voltage 16 (shown in FIGS. 3 and 5B). Thus, if the pulse ratio identified by the pulse ratio parameter 150 is one (1), for every pulse in the pulsed feedback signal 20 there is a clock pulse in the clock signal 152. In contrast, if the pulse ratio parameter 150 is two (2), the clock generation circuit 142 provides one clock pulse for every two pulses in the pulsed feedback signal 20. If the pulse ratio identified by the pulse ratio parameter 150 is four (4), there will be four pulses in the pulsed feedback signal 20 for every clock pulse in the clock signal 152.

The clock generation circuit 142 provides the clock signal 152 to the counter 144. The counter 144 is configured to perform a count operation on a pulse count integer during a time period in accordance with the clock signal 152 so that the pulse count integer has a final value upon expiration of the time period. To initiate the pulse count integer of the counter 144 to an initial value, the digital control unit 146 is configured to generate an enable signal 149 and a reset signal 151. In other words, upon receiving both the enable signal 149 and the reset signal 151, the counter 144 is configured to set the pulse count integer to the initial value. In this embodiment, the value of the pulse count integer is initialized to equal the number of clock pulses of the clock signal 152 that should be provided if the pulsed output voltage 16 is operating at the target average frequency identified by the target average frequency value 18. The initial value of the pulse count integer is thus equal to the target average frequency identified by the target average frequency value 18, multiplied by a time duration of the time period, and divided by a pulse ratio of the pulse ratio parameter 150.

In this embodiment, the count operation performed by the counter 144 is a decrement operation that decrements the pulse count integer as long as the pulse count integer is above a minimum value. For example, the count operation decrements the pulse count integer until the pulse count integer reaches a minimum value, which in this example is zero (0). The final value of the pulse count integer is thus indicative of when the average pulse frequency during the time frequency differs from the target average frequency identified by the target average frequency value 18. If the final value of the pulse count integer is zero (0), it may be presumed that the average pulse frequency is greater than the target average frequency. If the final value is greater than zero (0), it may be presumed that the average pulse frequency is less than the target average frequency.

The counter 144 then sets a flag bit 154 based on the final value of the pulse count integer. In this embodiment, the counter 144 sets the flag bit 154 to a first bit state in response to the final value of the pulse count integer being above the minimum value, which in this example is zero (0). The counter 144 sets the flag bit 154 to a second bit state antipodal to the first bit state in response to the final value of the pulse count trigger being equal to the minimum value. For example, the flag bit 154 may be set to a logical 1 if the final value of the pulse count integer is greater than the minimum value (i.e., zero (0) in this example). The counter 144 would set the flag bit 154 to a logical 0 if the final value of the pulse count integer is at the minimum value (i.e., zero (0) in this example).

The accumulator 148 is operable to receive the threshold parameter 66 and the flag bit 154. The accumulator 148 is configured to adjust the threshold parameter 66 such that the threshold parameter 66 is increased by a step size in response to the flag bit 154 being in the first bit state (i.e., in this example, logical 1). As a result, this reduces the average pulse frequency. In contrast, the accumulator 148 is configured to adjust the threshold parameter 66 such that the threshold parameter 66 is decreased by the step size in response to the flag bit 154 being in the second bit state (i.e., in this example, logical 0). As a result, the threshold parameter 66 is provided to the BBC 44 such that the BBC 44 increases the average pulse frequency of the pulsed output voltage 16.

Note that the accumulator 148 is further operable to receive a noise adjustment selection bit 156. The accumulator 148 is configured to set the step size to a first integer in response to the noise adjustment selection bit 156 being in the first bit state (i.e., logical 1) and is configured to set the step size to a second integer in response to the noise adjustment selection bit 156 being in the second bit state (i.e., logical 0). In this embodiment, the first integer is a step size of two (2), while the second integer is a step size of one (1). The noise adjustment selection bit 156 is provided to the BBC 44 shown in FIG. 3. The digital control unit 74 shown in FIG. 4 is configured to set the ratio between the variable resistors 100, 102, 104A and the value of M in accordance with the noise adjustment selection bit 156. For example, if the noise adjustment selection bit 156 is equal to zero (0), the first bang-bang mode is selected. M is equal to the value 20 and the ratios between the variable resistor 104A and the variable resistor 102, and between the variable resistor 104A and the variable resistor 100, are set accordingly. On the other hand, if the noise adjustment selection bit 156 is equal to one (1), the second bang-bang mode is selected. M is equal to 40 and the ratios between the variable resistor 104A and the variable resistor 102, and between the variable resistor 104A and the variable resistor 100, are set accordingly by the digital control unit 74.

Also, note that the digital control unit 146 shown in FIG. 9 is configured to receive a mode value 158. If the mode value 158 is equal to zero (0), the accumulator 148 only loads the threshold parameter 66 and the noise adjustment selection bit 156. When the mode value 158 is equal to one (1), the accumulator 148 updates the threshold parameter 66 after the time duration. If the mode value 158 is equal to two (2), the accumulator 148 holds the threshold parameter 66 without providing any changes.

To start the time period, the digital control unit 146 is configured to receive a trigger signal 160. The trigger signal 160 may be in an activation state or in a deactivation state. In this particular embodiment, the trigger signal 160 is a time slot initiation signal. The digital control unit 146 is configured to begin the time period in response to the trigger signal 160 being in the activation state. This signifies the beginning of the time slot.

When the mode value 158 is equal to one (1), the digital control unit 146 sets the pulse count integer to the initial value and performs a count operation in response to each one of the clock pulses of the clock signal 152. If the pulse ratio parameter 150 is equal to one (1), this means that the digital control unit 146 sets the time duration of the time period to approximately a first time slot size in response to the pulse ratio parameter being 1. For example, the first time slot size may be equal to 0.5 milliseconds. The digital control unit 146 may also set the time duration to equal a second time slot size greater than the first time slot size in response to the pulse ratio parameter 150 being equal to two (2). For example, the second time slot size may be 0.667 milliseconds. The digital control unit 146 sets the time duration of the time period to approximately double the second time slot size in response to the pulse ratio parameter 150 being equal to four (4). Thus, in this example, the time duration will cover two time slots of 0.667 milliseconds. Between the time slots, the mode value 158 may be provided as two (2) in order for the accumulator 148 to hold its contents. After the time duration, whether 0.5 milliseconds, 0.667 milliseconds, or 2×0.667 milliseconds, the accumulator 148 adjusts the threshold parameter 66, and the updated threshold parameter 66 is provided for the next subsequent time slot.

Figure 10A:
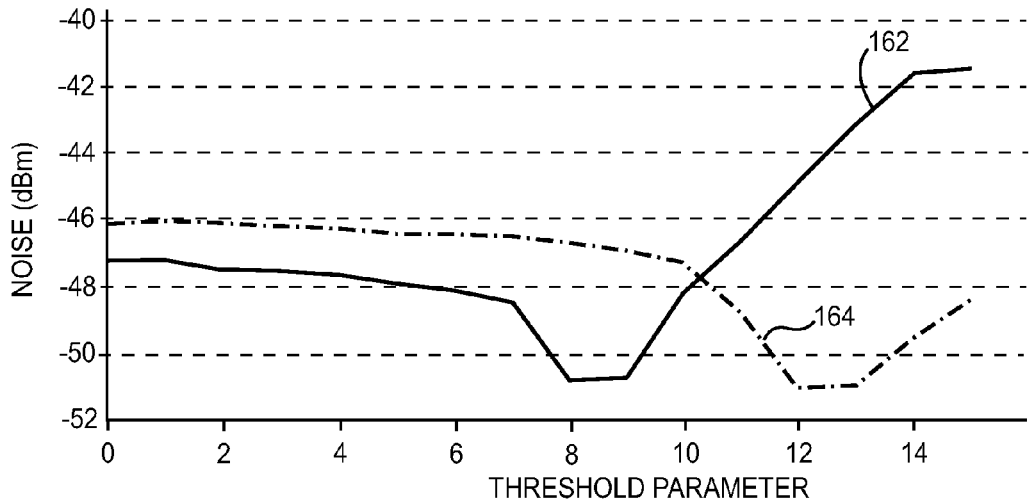
FIG. 10A illustrates a pair of noise curves for the RF switching converter shown in FIG. 3, wherein the noise curves are each shown as a function of a threshold parameter when the target average frequency is 30 MHz.
Figure 10B:
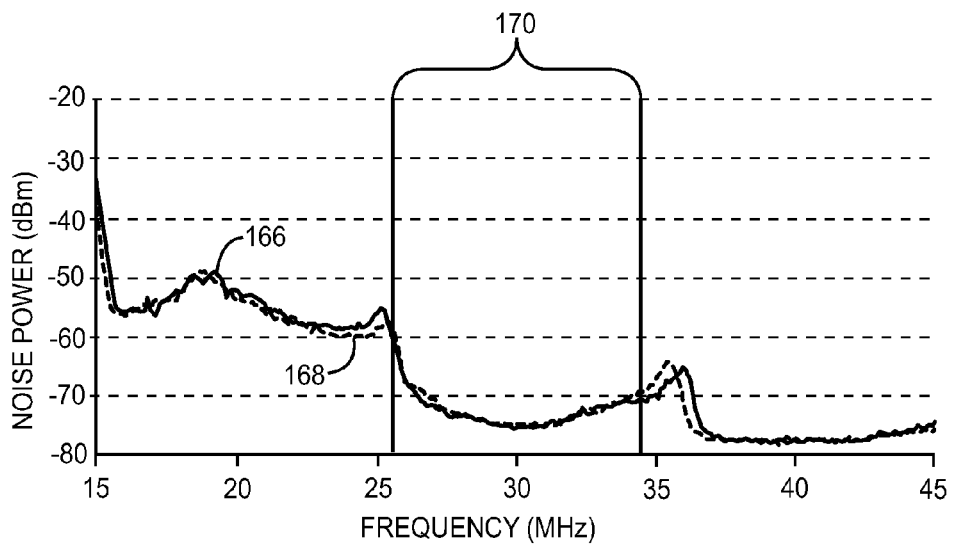
FIG. 10B illustrates a pair of wideband noise power curves for the RF switching converter shown in FIG. 3, wherein the wideband noise power curves are functions of frequency.

Referring now to FIGS. 10A and 10B, FIG. 10A has a noise curve 162 and a noise curve 164 as functions of the threshold parameter 66 when the target average frequency is 30 MHz. In particular, the noise curve 162 is provided when the noise adjustment selection bit 156 is equal to zero (0), while the noise curve 164 is provided when the noise adjustment selection bit 156 is equal to one (1).

FIG. 10B illustrates a first wideband noise power curve 166 and a second wideband noise power curve 168 as functions of frequency. Also shown is a transmission band 170 having a center frequency of 30 MHz and cut-off frequencies of around 30 MHz±4.5 MHz. The first wideband noise power curve 166 is provided when the noise adjustment selection bit 156 is equal to zero (0), and the second wideband noise power curve 168 is provided when the noise adjustment selection bit 156 is equal to one (1).

Figure 11:
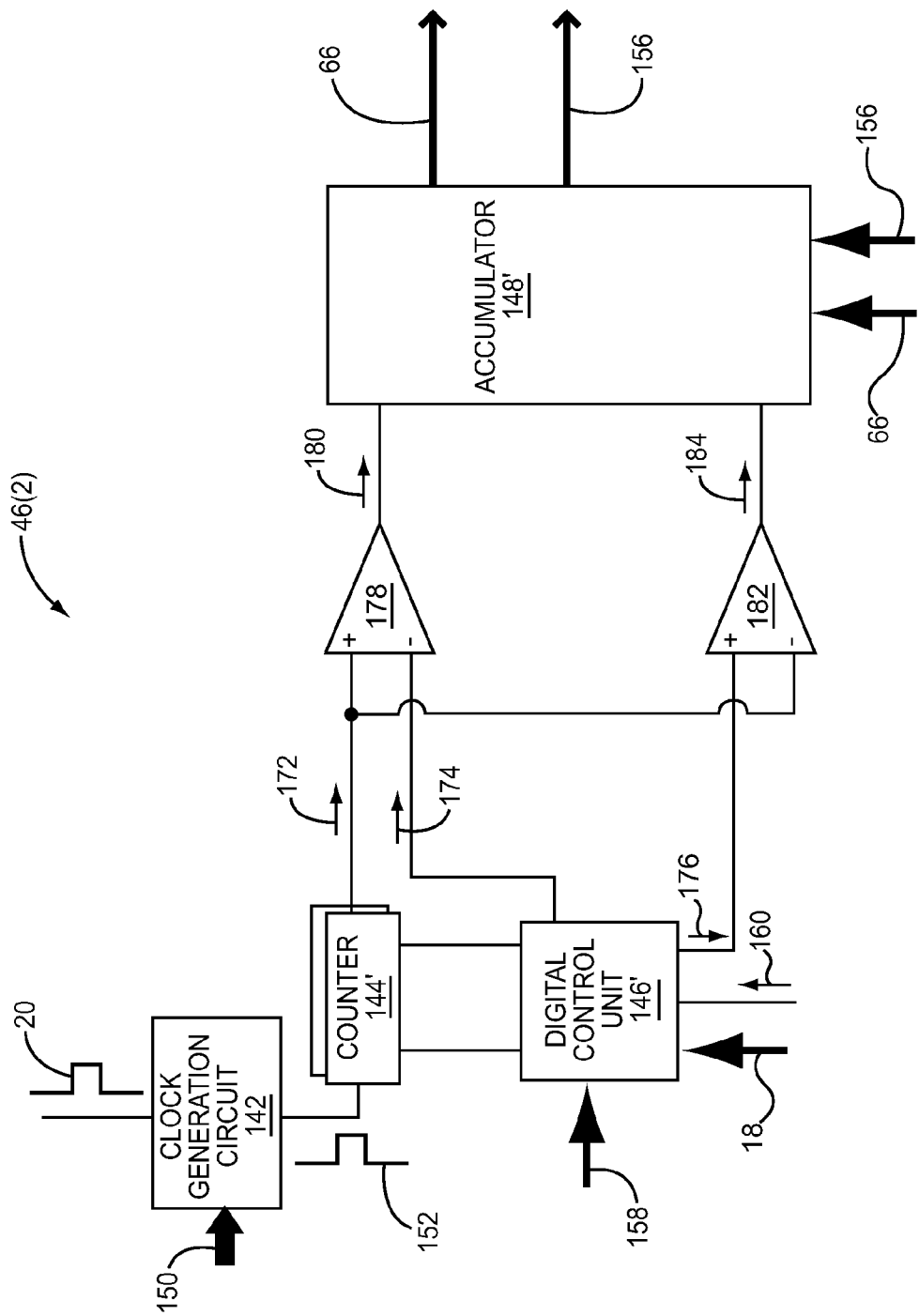
FIG. 11 illustrates another embodiment of the AFC shown in FIG. 3, wherein the AFC sets a pulse count integer to an initial value and increments the pulse count integer to a final value, and upper limits and lower limits for the final value are calculated to determine whether the average pulse frequency of the pulsed output voltage should be adjusted.

FIG. 11 illustrates another embodiment of an AFC 46(2). The AFC 46(2) is similar to the AFC 46(1) shown in FIG. 9. However, the count operation performed by a counter 144' is an increment operation that increments the pulse count integer. Thus, in this embodiment, the pulse count integer may be set to an initial value of zero (0). A digital control unit 146' is operable to receive the target average frequency value 18. In this embodiment, the digital control unit 146' is configured to calculate an upper limit for the final value of the pulse count integer based on the target average frequency value 18 and the pulse ratio parameter 150. Accordingly, given a tolerance, the digital control unit 146' calculates the upper limit for the final value. The digital control unit 146' is also configured to calculate a lower limit for the final value based on the target average frequency value 18 and the pulse ratio parameter 150. Given the tolerance, the final value for the pulse count integer should not be lower than a particular value. The clock generation circuit 142 generates the clock signal 152 such that the clock pulses of the clock signal 152 have the pulse ratio identified by the pulse ratio parameter 150 with respect to the pulses of the pulsed output voltage 16. The counter 144' performs the count operation on the pulse count integer, in this example, an increment operation, in response to each one of the clock pulses. Thus, in response to each clock pulse, the counter 144' is configured to increment the pulse count integer.

After the time period is over, the counter 144' is configured to generate a pulse count integer voltage 172 having a voltage level indicative of the final value. The digital control unit 146' is configured to generate an upper limit voltage 174 having a voltage level indicative of the upper limit for the final value. Additionally, the digital control unit 146' is configured to generate a lower limit voltage 176 having a voltage level indicative of the lower limit for the final value. The AFC 46(2) has a first comparator 178 configured to compare the upper limit voltage 174 and the pulse count integer voltage 172 so as to generate a first comparator signal 180. The first comparator signal 180 is in an activation state in response to the voltage level of the pulse count integer voltage 172 being greater than the voltage level of the upper limit voltage 174. The AFC 46(2) also includes a second comparator 182 configured to compare the lower limit voltage 176 and the pulse count integer voltage 172 so as to generate a second comparator signal 184. The second comparator signal 184 is in an activation state in response to the voltage level of the pulse count integer voltage 172 being lower than the voltage level of the lower limit voltage 176.

The accumulator 148' is configured to receive the threshold parameter 66, the first comparator signal 180, and the second comparator signal 184. If the first comparator signal 180 is in the activation state and the second comparator signal 184 is in the deactivation state, the accumulator 148' is configured to adjust the threshold parameter 66 by increasing the threshold parameter 66 by a step size in response to the first comparator signal 180 being in the activation state. If the second comparator signal 184 is in the activation state and the first comparator signal 180 is in the deactivation state, the accumulator 148' is configured to adjust the threshold parameter 66 by decreasing the threshold parameter 66 by a step size in response to the second comparator signal 184 being in the activation state. As in the previous embodiment described above with regard to FIG. 9, the noise adjustment selection bit 156 may be used to select an integer size of the step size.

Figure 12:
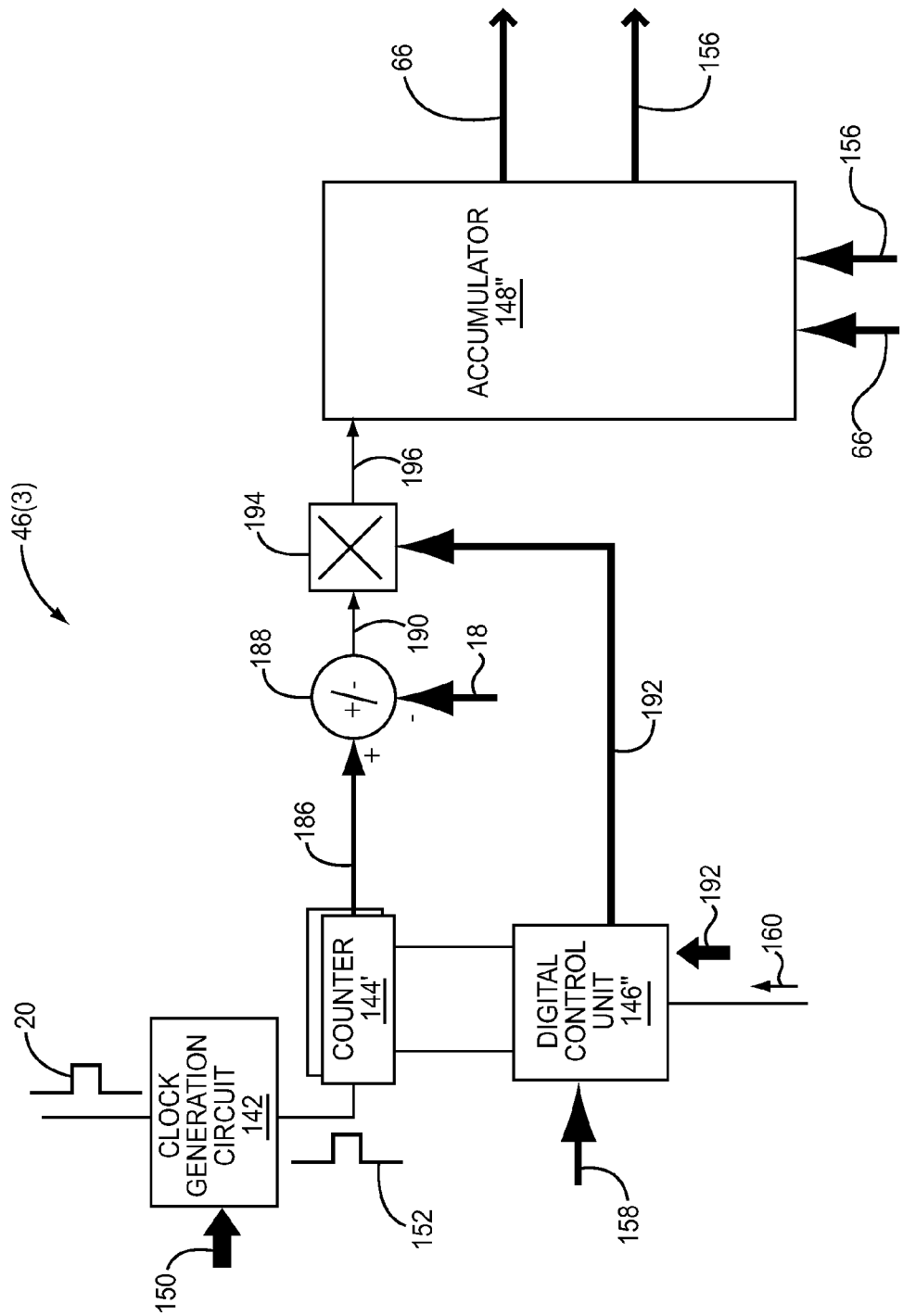
FIG. 12 illustrates still another embodiment of the AFC shown in FIG. 3, wherein the AFC sets a pulse count integer to an initial value and increments the pulse count integer to a final value, and a gain error is used to adjust the average pulse frequency.

FIG. 12 illustrates another embodiment of an AFC 46(3). The AFC 46(3) includes the same counter 144' described above with regard to FIG. 9. As such, the counter 144' increments the pulse count trigger from an initial value in response to each of the clock pulses of the clock signal 152. However, in this embodiment of the AFC 46(3), the counter 144' outputs a pulse count integer 186 at the final value. The AFC 46(3) includes a subtractor 188 operable to receive the pulse count integer 186 at the final value. The subtractor 188 is configured to subtract the target average frequency value 18 from the final value of the pulse count integer 186 so as to generate a count error value 190.

In this embodiment, a digital control unit 146" is operable to receive a gain error parameter 192 that identifies a gain error. The digital control unit 146" provides the gain error parameter 192 to a multiplier 194. The multiplier 194 also receives the count error value 190 from the subtractor 188. The gain error parameter 192 identifies the gain error, which indicates a ratio of adjustment for the threshold parameter 66 with respect to the count error value 190. The multiplier 194 is configured to multiply the gain error parameter 192 with the count error value 190 so as to generate an error value 196.

An accumulator 148" is operable to receive the error value 196 from the multiplier 194. The accumulator 148" is configured to adjust the threshold parameter 66 by adding the error value 196 or a rounded value of the error value 196 to the threshold parameter 66. After updating the threshold parameter 66, the accumulator 148" provides the threshold parameter 66 to the BBC 44 (shown in FIG. 3), as described above.

The switching controller 12 shown in FIG. 3 is further configured to reduce the ripple variation in the supply voltage level of the supply voltage $V_{SUPPLY}$. One way of reducing the ripple variation is to increase the inductance of the power inductor 36. However, this would be detrimental to the operation of the RF switching converter 24 due to the large slew rate since the maximum current rate that the switching circuit 14 can deliver efficiently is limited by $(V_{POWER}-\text{BUCK})/L_{POWER\ INDUCTOR}=dI_{POWER\ INDUCTOR}/dt$.

Figure 13:
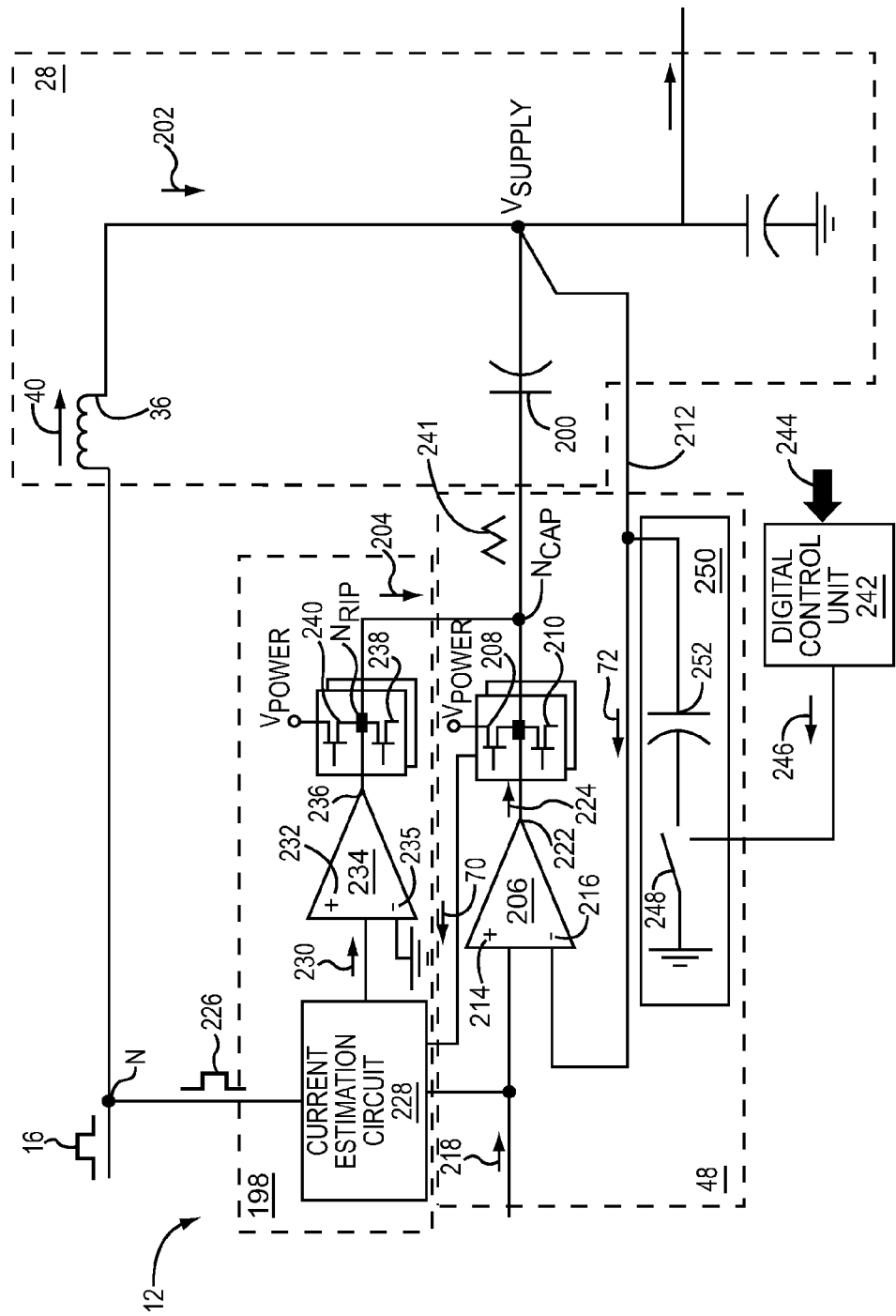
FIG. 13 illustrates one embodiment of the current sense detector shown in FIG. 3, along with a ripple current correction circuit configured to generate a ripple correction current that reduces ripple variation in a supply current level of a supply current provided by the RF switching converter shown in FIG. 3.

FIG. 13 illustrates one embodiment of the current sense detector 48 shown in FIG. 3, along with a ripple current correction circuit 198 used to decrease the ripple variation in the $V_{SUPPLY}$ without requiring an increase of the inductance of the power inductor 36. In this embodiment, the switching controller 12 includes the current sense detector 48 and the ripple current correction circuit 198. However, it should be noted that in alternative embodiments, the current sense detector 48 and the ripple current correction circuit 198 may be provided in circuitry outside or external to the switching controller 12.

Referring again to FIG. 13, the RF filter 28 has a decoupling capacitor 200 coupled to receive the supply voltage $V_{SUPPLY}$. The current sense detector 48 is configured to generate the current sense signal 70 having the sense signal level set so as to indicate a supply current level of a supply current 202 resulting from the supply voltage $V_{SUPPLY}$. In this embodiment, the supply current 202 is the inductor current 40. The ripple current correction circuit 198 is configured to receive the current sense signal 70 from the current sense detector 48 and generate a ripple correction current 204. In this manner, ripple variation in the supply current level of the supply current 202 can be corrected without having to significantly increase the inductance of the power inductor 36.

For instance, the RF amplification circuit 26 (shown in FIG. 2) has a non-zero and varying output impedance. Due to this non-linear output impedance, the ripple variation of both the supply current 202 and the supply voltage $V_{SUPPLY}$ can be significantly high without correction. In order to reduce the ripple variation of the supply current 202 (and therefore also reduce the ripple variation of the supply voltage $V_{SUPPLY}$), the current sense detector 48 is configured to adjust the sense signal level of the current sense signal 70 in response to a change in the supply voltage level of the supply voltage $V_{SUPPLY}$ at the decoupling capacitor 200. Accordingly, the sense signal level of the current sense signal 70 is adjusted such that the sense signal level varies in accordance with the ripple variation of the supply voltage $V_{SUPPLY}$, and thus as a result of the ripple variation of the supply current level of the supply current 202. In other words, the rippling supply voltage results in the ripple variation in the supply current level of the supply current 202, thereby resulting in rippling across the decoupling capacitor 200. Accordingly, the sense signal level of the current sense signal 70 ripples in accordance with the ripple variation and the supply current level of the supply current 202.

As shown in FIG. 13, the current sense detector 48 includes a comparator 206, a P-FET 208, an N-FET 210, and a feedback circuit 212. The current sense detector 48 is operable to be activated and deactivated. In the ET operational mode, the P-FET 208 is switched on, while the N-FET 210 is switched off. The current sense detector 48 is activated. The comparator 206 includes a non-inverting input terminal 214 configured to receive a supply control input voltage 218, an inverting input terminal 216 configured to receive the feedback voltage 72 from the feedback circuit 212, and an output terminal 222. The comparator 206 operates to maintain the voltage at a node $N_{CAP}$ at the supply control voltage level of the supply control input voltage 218. More specifically, in the ET operational mode, the comparator 206 is configured to generate a supply control output voltage 224 from the output terminal 222 based on the supply control input voltage 218 and the feedback voltage 72. The comparator 206, along with the P-FET 208 and the N-FET 210, is a linear amplification circuit with negative feedback. Since the supply control input voltage 218 is modulated in the ET operational mode, the supply control output voltage 224 is also modulated. Thus, using the linear amplification circuit, the switching controller 12 modulates the supply voltage $V_{SUPPLY}$ in the ET operational mode.

If the supply control input voltage 218 and the feedback voltage 72 have unequal voltage levels, the comparator 206 drives the supply control output voltage 224 until the feedback voltage 72 at the inverting input terminal 216 is equal to the voltage level of the supply control input voltage 218 at the non-inverting input terminal 214. In turn, this results in a current being drawn across the P-FET 208. Since the decoupling capacitor 200 is coupled to the node $N_{CAP}$, the decoupling capacitor 200 is coupled to receive the supply control output voltage 224. The change in the supply control output voltage 224 results in a change in the current across the P-FET 208. The current across the P-FET 208 is tapped in order to provide the current sense signal 70 from the current sense detector 48.

The ripple current correction circuit 198 shown in FIG. 13 is operable to receive the current sense signal 70, a pulsed feedback signal 226 based on the pulsed output voltage 16, and the supply control input voltage 218. From the pulsed feedback signal 226, the supply control input voltage 218, and the current sense signal 70, the ripple current correction circuit 198 estimates the supply current level of the supply current 202. More specifically, the ripple current correction circuit 198 has a current estimation circuit 228 coupled to receive the pulsed feedback signal 226, the supply control input voltage 218, and the current sense signal 70. Based on the pulsed feedback signal 226, the supply control input voltage 218, and the current sense signal 70, the current estimation circuit 228 is configured to generate an estimated current signal 230 that is estimated to be directly proportional to the sense current level of the current sense signal 70. The estimated current signal 230 is received at an inverting terminal 232 of a comparator 234. A non-inverting terminal 235 of the comparator 234 is coupled to ground, while an output terminal 236 of the comparator 234 is coupled between an N-FET 238 and a P-FET 240.

During ET operational mode operation, the N-FET 238 is switched off, and the P-FET 240 is switched on. Since the sense signal level of the current sense signal 70 varies in accordance with the ripple variation in the supply current level of the supply current 202, a signal level of the estimated current signal 230 also has ripple variation. Since the estimated current signal 230 is received at the inverting terminal 232 of the comparator 234, this results in the generation of a current across the P-FET 240, which is the ripple correction current 204.

The ripple current correction circuit 198 is coupled so as to inject the ripple correction current 204 into the decoupling capacitor 200 in order to filter the ripple correction current 204. In this embodiment, the decoupling capacitor 200 provides a high-pass filter with a stopband that extracts the high-frequency ripple current from the ripple correction current 204. The decoupling capacitor 200 outputs the ripple correction current 204 such that the ripple correction current 204 reduces the ripple variation in the supply current level of the supply current 202, and therefore also the ripple variation of the supply voltage $V_{SUPPLY}$. In this particular embodiment, a node $N_{RIP}$ coupled between the N-FET 238 and the P-FET 240 is connected to the node $N_{CAP}$. The stopband, which in this case is a notch, provided by the decoupling capacitor 200 is centered at or near the signal frequency of the RF signal 30 (shown in FIG. 2). By applying the ripple correction current 204, after filtering, the ripple correction current 204 reduces the ripple variation in the supply current level of the supply current 202. The ripple correction current 204 is generated as an estimated mirror of the supply current 202. However, filtering by the decoupling capacitor 200 only injects high frequency portions of the ripple correction current 204 to avoid degrading power efficiency.

The RF switching converter 10 (shown in FIG. 3) needs to meet stringent noise standards within a transmission band for the RF signal 30. For example, when fewer than twelve (12) Resource Blocks (RBs) are being utilized in the RF signal 30 (shown in FIG. 2), the noise needs to be better than −138 dbm/Hz for LTE at a 30 MHz offset. In contrast, where the number of RBs is large, i.e., >twelve (12), noise only needs to be better than −120 dbm/Hz for LTE at a 30 MHz offset. Thus, some noise filtering can be sacrificed when the number of RBs is large. However, the greater the capacitance of the decoupling capacitor 200, the larger the currents drawn by the current sense detector 48. Accordingly, power efficiency is degraded by greater or larger capacitances at the decoupling capacitor 200. Consequently, it may be desirable to sacrifice some noise filtering when the number of RBs is large, in order to get better power efficiency. While this may not be done when the number of RBs is low, since the noise level requirements are stricter, noise filtering can be relaxed for a larger number of RBs.

The current sense detector 48 is configured to generate the current sense signal 70 in response to the power inductor current 40 such that the sense signal level of the current sense signal 70 varies in accordance with the ripple variation of the supply voltage $V_{SUPPLY}$. In this exemplary embodiment, the current sense detector 48 is configured generate a supply current 241 (sourced by the P-FET 208 and sinked by the N-FET 210) in order to charge and discharge the decoupling capacitor 200 at the node $N_{CAP}$. The supply current 241 is provided so as to resist changes in the power inductor current level of the power inductor current 40, and are thus the result of the ripple variation of the supply voltage $V_{SUPPLY}$. As a result, a derivative of the supply current 241 from the current sense detector 48 and a derivative of the power inductor current 40 are inversely proportional. Therefore, the derivative of the supply current 241 from the current sense detector 48 and the derivative of the supply voltage $V_{SUPPLY}$ are also inversely proportional. In this embodiment, the sense signal level of the current sense signal 70 is generated by the current sense detector 48 so as to directly indicate a supply current level of the supply current 241. Accordingly, the current sense detector 48 is configured to generate the current sense signal 70 such that a change in the power inductor current level of the power inductor current 40 results in a change in the sense signal level, where the change in the sense signal level of the current sense signal 70 is negatively proportional to the change in the power inductor current level of the power inductor current 40. As such, the current sense detector 48 is configured to generate the current sense signal 70 such that a change in the supply current level of the supply current 202 results in a change in the sense signal level, where the change in the sense signal level of the current sense signal 70 is negatively proportional to the change in the supply current level of the supply current 202. Finally, and as a further result, the current sense detector 48 is configured to generate the current sense signal 70 such that a change in the supply voltage level of the supply voltage $V_{SUPPLY}$ results in a change in the sense signal level, where the change in the sense signal level of the current sense signal 70 is negatively proportional to the change in the supply voltage level of the supply voltage $V_{SUPPLY}$.

As shown in FIG. 13, the switching controller 12 has a digital control unit 242 configured to receive an RB parameter 244 that indicates an integer number of RBs. The digital control unit 242 generates a control signal 246 in an activation state when the RB parameter 244 indicates that the integer number is less than an RB threshold value (i.e., twelve (12), in this example). However, the digital control unit 242 is configured to generate the control signal 246 in a deactivation state when the RB parameter 244 indicates that the integer number is greater than or equal to the RB threshold value (i.e., twelve (12), in this example). A switch 248 within a shunt-coupled circuit 250 is closed in response to the control signal 246 being provided in the activation state. In contrast, the switch 248 is opened in response to the control signal 246 being provided in the deactivation state.

The shunt-coupled circuit 250 shown in FIG. 13 is included in the switching controller 12, and in this particular embodiment, the feedback circuit 212 includes the shunt-coupled circuit 250. The shunt-coupled circuit 250 has a second decoupling capacitor 252 and the switch 248. The switch 248 is coupled in series with the second decoupling capacitor 252, and is configured to be opened and closed, as explained above. The digital control unit 242 transmits the control signal 246 to the switch 248 so that the digital control unit 242 can open and close the switch 248 based on the RB parameter 244. When the RB parameter 244 indicates that the integer number of RBs is greater than or equal to the RB threshold value (i.e., twelve (12), in this example), noise level requirements are relaxed. Thus, a smaller capacitance may be used to increase power efficiency.

For example, the decoupling capacitor 200 has a first capacitance. The switch 248 is open in response to the RB parameter 244 indicating an integer number of RBs greater than the RB threshold value, and thus a second capacitance of the second decoupling capacitor 252 is not seen by the supply voltage $V_{SUPPLY}$. The ripple correction current 204 is not further filtered by the second decoupling capacitor 252 when the switch 248 is open. In this case, noise filtering is sacrificed for greater power efficiency.

However, in the feedback circuit 212, the shunt-coupled circuit 250 is coupled in shunt with respect to the decoupling capacitor 200. Thus, when the switch 248 is closed, the second capacitance of the second decoupling capacitor 252 is added to the first capacitance of the decoupling capacitor 200. As such, the second decoupling capacitor 252 further filters the ripple correction current 204 when the switch 248 is closed. The switch 248 is closed when the RB parameter indicates that the integer number of RBs is less than the RB threshold value (i.e., twelve (12), in this example), and thus, power efficiency is sacrificed for greater noise filtering.

Figure 14:
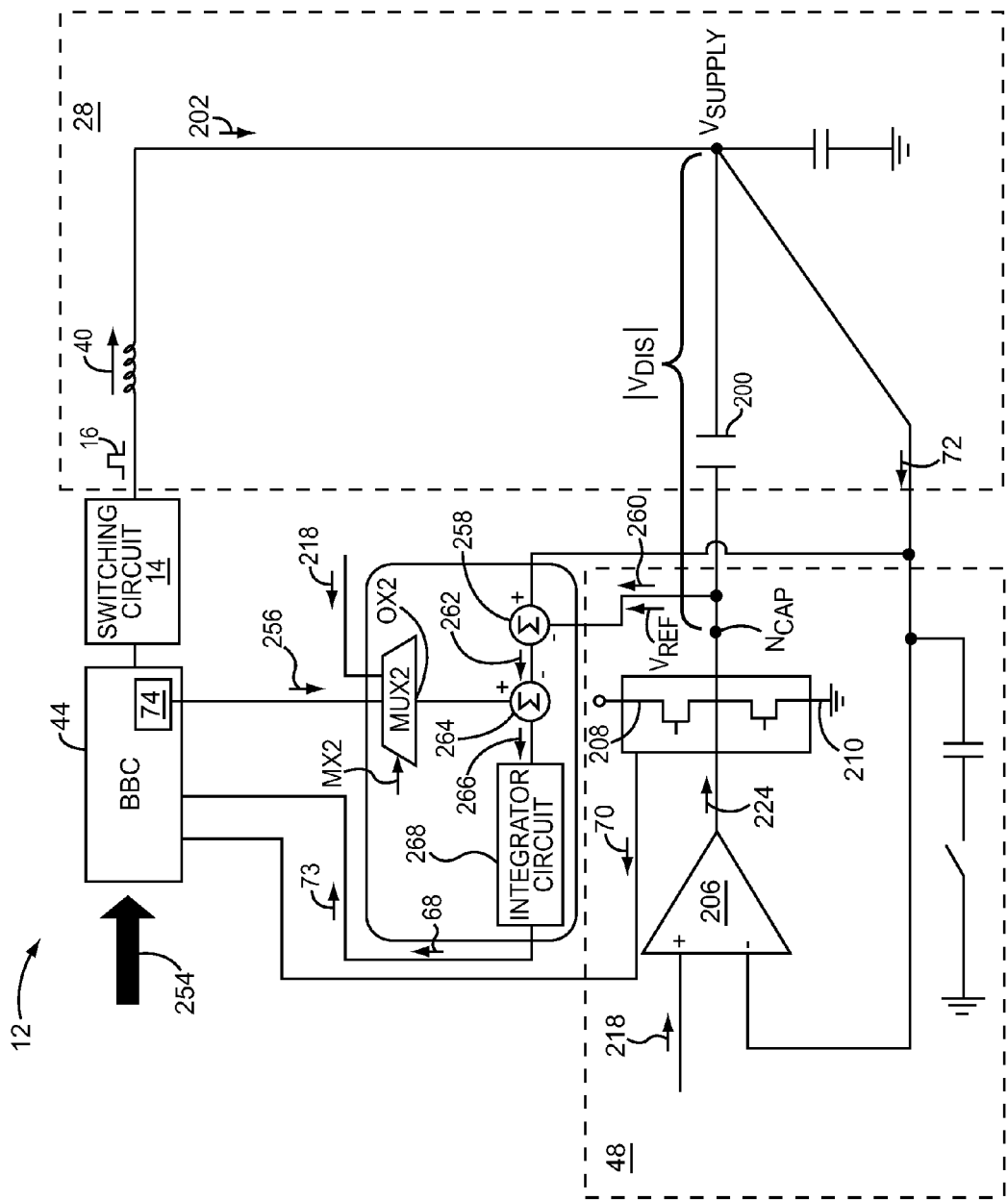
FIG. 14 illustrates one embodiment of the VOL illustrated in FIG. 3 wherein the VOL maintains a displacement voltage magnitude across a decoupling capacitor relatively constant.

Referring now to FIGS. 5A, 6A, and 14, FIG. 14 illustrates one embodiment of the VOL 50 that generates the offset voltage 68 in the ET operational mode and the APT signal 73 in the APT operational mode, as shown in FIG. 3. The voltage magnitude $V_{OFFS}$ of the offset voltage 68 determines the center voltage level $V_{CEN}$. The ripple variation of the sense voltage level of the sense voltage 124 oscillates from peak to peak about the center voltage level $V_{CEN}$. To generate the sense voltage 124, the BBC 44 (shown in FIG. 4) is configured to receive the current sense signal 70 from the current sense detector 48. The BBC 44 converts the current sense signal 70 into the preliminary voltage 104E (shown in FIG. 4), and then the BBC 44 subtracts the voltage magnitude $V_{OFFS}$ of the offset voltage 68 from the preliminary voltage 104E to generate the sense voltage 124. Accordingly, adjusting the voltage magnitude $V_{OFFS}$ also adjusts the center voltage level $V_{CEN}$. This therefore results in the sense voltage level of the sense voltage 124 reaching the first threshold voltage level $M_1$ and the second threshold voltage level $M_2$ at different points in the oscillation of the sense voltage 124.

Referring now specifically to FIGS. 5A and 6A, decreasing the voltage magnitude $V_{OFFS}$ lowers the center voltage level $V_{CEN}$ so that the sense voltage level of the sense voltage 124 reaches the first threshold voltage level $M_1$ closer to a voltage peak maximum $V_{PEAKMAX}$. The sense voltage level of the sense voltage 124 would reach the second threshold voltage level $M_2$ further away from a voltage peak minimum $V_{PEAKMIN}$. (In FIG. 6A, the sense voltage level of the sense voltage 124 also reaches the third threshold voltage level $M_3$ and the fourth threshold voltage level $M_4$ closer to the voltage peak maximum $V_{PEAKMAX}$.)

Note that while the first threshold voltage level $M_1$ and the second threshold voltage level $M_2$ (along with the third threshold voltage level $M_3$ and the fourth threshold voltage level $M_4$) are not adjusted by the offset voltage 68 in this embodiment, the relationship between the sense voltage level of the sense voltage 124 and the sense signal level of the current sense signal 70 (shown in FIG. 3) is modified by adjustments of the voltage magnitude $V_{OFFS}$. For example, if the voltage magnitude $V_{OFFS}$ is increased, the center voltage level $V_{CEN}$ is raised. Thus, the sense voltage 124 reaches the first threshold voltage level $M_1$ further away from the voltage peak maximum $V_{PEAKMAX}$, and reaches the second threshold voltage level $M_2$ closer to the voltage peak minimum $V_{PEAKMIN}$.

Prior to the increase of the voltage magnitude $V_{OFFS}$, the sense voltage level of the sense voltage 124 is equal to the first threshold voltage level $M_1$ and the sense voltage level of the sense voltage 124 is equal to the second threshold voltage level $M_2$ at particular values of the sense signal level of the current sense signal 70. However, when the voltage magnitude $V_{OFFS}$ is increased, the sense voltage level of the sense voltage 124 equal to the first threshold voltage level $M_1$ and the sense voltage level of the sense voltage 124 equal to the second threshold voltage level $M_2$ each correspond to different values of the sense signal level of the current sense signal 70. More specifically, the sense voltage level of the sense voltage 124 equal to the current threshold voltage level $M_1$ and the sense voltage level of the sense voltage 124 equal to the second threshold voltage level $M_2$ each correspond to lower values of the sense signal level of the current sense signal 70. As such, with regard to the sense signal level of the current sense signal 70, the threshold voltage levels $M_1$, $M_2$ have been effectively lowered. Additionally, the pulse length of the pulse 140 would be decreased by increasing the voltage magnitude $V_{OFFS}$. This thereby results in a decrease in the supply voltage level of the supply voltage $V_{SUPPLY}$.

Conversely, decreasing the voltage magnitude $V_{OFFS}$ results in the sense voltage level of the sense voltage 124 equal to the first threshold voltage level $M_1$ and the sense voltage level of the sense voltage 124 equal to the second threshold voltage level $M_2$ each corresponding to higher values of the sense signal level of the current sense signal 70. Additionally, this results in an increase of the pulse length of the pulse 140, and thereby an increase in the supply voltage level of the supply voltage $V_{SUPPLY}$. Note that the same effect could be achieved by directly inputting the preliminary voltage 104E as the current sense signal into the comparators 80, 82, 84, and 86 (shown in FIG. 4), while adding the offset voltage 68 to the first threshold signal 118, the second threshold signal 120, the third threshold signal 130, and the fourth threshold signal 134 (shown in FIG. 4). However, the specific embodiment of the BBC 44 shown in FIG. 4 reduces the number of adders required, since rather than adding the offset voltage 68 directly to the threshold signals 118, 120, 130, 134, the offset voltage 68 is subtracted from the preliminary voltage 104E to generate the sense voltage 124. Analogous logic with regard to the relationship between the sense voltage 124 and the thresholds is applicable with respect to FIGS. 7A and 8A.

Referring again to FIG. 14, the current sense detector 48 generates the supply control output voltage 224 when the current sense detector 48 is activated, as explained above. The RF filter 28 is operable to apply the supply control output voltage 224 to the supply voltage $V_{SUPPLY}$ such that the supply voltage level of the supply voltage $V_{SUPPLY}$ is biased by the supply control output voltage level of the supply control output voltage 224. Accordingly, the supply control output voltage level of the supply control output voltage 224 and the supply voltage level of the supply voltage $V_{SUPPLY}$ are displaced by a displacement voltage magnitude $|V_{DIS}|$. In this embodiment, the supply control output voltage 224 is received by the decoupling capacitor 200 to bias the supply voltage $V_{SUPPLY}$. Accordingly, this results in the displacement voltage magnitude $|V_{DIS}|$ across the decoupling capacitor 200.

When the VOL 50 is in the ET operational mode, the displacement voltage magnitude $|V_{DIS}|$ is set by the offset voltage magnitude of the offset voltage 68. The BBC 44 (shown in FIG. 4) is configured to switch the switching circuit 14 based on the sense signal level of the current sense signal 70 so that the switching circuit 14 generates the pulsed output voltage 16, and such that the displacement voltage magnitude $|V_{DIS}|$ is set by the offset voltage magnitude of the offset voltage 68 when the VOL 50 is in the ET operational mode. As described above, the BBC 44 is configured to receive the offset voltage 68, wherein adjustments to the voltage magnitude $V_{OFFS}$ (shown in FIGS. 5A and 6A) adjust the pulse length of the pulses 140 (shown in FIG. 5B). This thereby adjusts the supply voltage level of the supply voltage $V_{SUPPLY}$. As a result, the voltage magnitude $V_{OFFS}$ determines the displacement voltage magnitude $|V_{DIS}|$ between the supply control output voltage level of the supply control output voltage 224 and the supply voltage level of the supply voltage $V_{SUPPLY}$.

The BBC 44 is thus configured to switch the switching circuit 14 such that the displacement voltage magnitude $|V_{DIS}|$ is set in accordance with the voltage magnitude $V_{OFFS}$ (shown in FIGS. 5A and 5B) of the offset voltage 68. The VOL 50 is configured to adjust the voltage magnitude $V_{OFFS}$ of the offset voltage 68 so that the displacement voltage magnitude $|V_{DIS}|$ is driven to a target displacement voltage magnitude. More specifically, adjusting the voltage magnitude $V_{OFFS}$ results in adjusting the center voltage level $V_{CEN}$ of the sense voltage 124. This thereby results in adjustments in the switching of the switching circuit 14 by the BBC 44, which therefore adjusts the pulsed output voltage 16. Accordingly, adjusting the pulsed output voltage 16 results in the supply voltage level of the supply voltage $V_{SUPPLY}$ being adjusted. The VOL 50 is configured to adjust the voltage magnitude $V_{OFFS}$ to adjust the supply voltage level of the supply voltage $V_{SUPPLY}$ so as to drive the displacement voltage magnitude $|V_{DIS}|$ to a target displacement voltage magnitude. In this manner, voltage spurs in the supply voltage $V_{SUPPLY}$ and current spikes in the supply current 202 can be minimized or eliminated.

In this embodiment, the VOL 50 adjusts the voltage magnitude $V_{OFFS}$ of the offset voltage 68 so that the displacement voltage magnitude $|V_{DIS}|$ appears as an almost constant DC voltage set at the target displacement voltage magnitude. The BBC 44 and, in particular, the digital control unit 74, are operable to receive a target displacement voltage parameter 254 that identifies the target displacement voltage magnitude. The digital control unit 74 of the BBC 44 is configured to generate a target displacement voltage signal 256 having a target displacement voltage level that is indicative of the target displacement voltage magnitude.

The VOL 50 shown in FIG. 14 includes an adder 258 that receives the feedback voltage 72 having the feedback voltage level indicative of the supply voltage level. In the ET operational mode, the adder 258 is also operable to receive a feedback voltage 260 indicative of the supply control output voltage level of the supply control output voltage 224. The adder 258 is configured to subtract the feedback voltage level of the feedback voltage 72 from a feedback voltage level of the feedback voltage 260 so as to generate a displacement indication voltage 262 having a voltage magnitude indicative of the displacement voltage magnitude $|V_{DIS}|$. The displacement indication voltage 262 is thus set in accordance with a difference between the feedback voltage level of the feedback voltage 72 and the feedback voltage level of the feedback voltage 260.

The VOL 50 also includes an adder 264 and a multiplexer MUX2. The multiplexer MUX2 is operable to receive a multiplexer select bit signal MX2. The multiplexer MUX2 is configured to select the target displacement voltage signal 256 in response to the multiplexer select bit signal MX2 being in a first bit state (i.e., logical "1" or logical "0"). In contrast, the multiplexer MUX2 is configured to select the supply control input voltage 218 in response to the multiplexer select bit signal MX2 being in a second bit state (i.e., logical "0" or logical "1") antipodal to the first bit state. In the ET operational mode, the multiplexer select bit signal MX2 is provided in the first bit state so that the multiplexer MUX2 selects the target displacement voltage signal 256 generated by the digital control unit 74 in the BBC 44. The adder 264 is operable to receive the displacement indication voltage 262 from the adder 258 and the target displacement voltage signal 256 from an output terminal OX2 of the multiplexer MUX2. The adder 264 subtracts the voltage level of the displacement indication voltage 262 from the target displacement voltage level of the target displacement voltage signal 256 so as to generate an error voltage 266 with an error voltage magnitude indicative of a difference between the displacement voltage magnitude $|V_{DIS}|$ and the target displacement voltage magnitude in the ET operational mode.

As shown in FIG. 14, the VOL 50 includes an integrator circuit 268 configured to receive the error voltage 266. The integrator circuit 268 is configured to integrate the error voltage 266 having an error voltage magnitude so as to generate the offset voltage 68 in the ET operational mode. The integrator circuit 268 provides an integration function over time, such that the voltage magnitude $V_{OFFS}$ of the offset voltage 68 is adjusted so long as the error magnitude of the error voltage 266 indicates that the displacement voltage magnitude $|V_{DIS}|$ is different from the target displacement voltage magnitude. For example, if the error voltage magnitude is not zero, integration will continue. On the other hand, the voltage magnitude $V_{OFFS}$ of the offset voltage 68 changes the supply voltage level of the supply voltage $V_{SUPPLY}$ until the displacement voltage magnitude $|V_{DIS}|$ is approximately equal to the target displacement voltage magnitude. By driving the displacement voltage magnitude $|V_{DIS}|$ to the target displacement voltage magnitude, spurs in the supply voltage level of the supply voltage $V_{SUPPLY}$ and spikes in the supply current level of the supply current 202 can be minimized.

In one embodiment, the integrator circuit 268 has a transfer function of:

$$\frac{-(1+\tau_1 * s)}{(\tau_2 * s)}.$$

The transfer function thus not only has a pole, but also has a zero to help stabilize the VOL 50. The pole and the zero can be adjusted by modifying the values of $\tau_1$ and $\tau_2$. These values may be modified by adjusting reactive impedance levels of reactive components provided by the integrator circuit 268. Also, modulation for ET can be provided by modulating the supply control input voltage level of the supply control input voltage 218.

The VOL 50 does not generate the offset voltage 68 in the APT operational mode. Rather, the switching controller 12 is configured to switch the switching circuit 14 in the APT operational mode such that the pulsed output voltage 16 is adjusted to drive an average DC supply voltage level of the supply voltage $V_{SUPPLY}$ to a target average DC supply voltage level. In this embodiment, the VOL 50 is configured to generate the APT signal 73 so that an APT signal level of the APT signal 73 varies from a DC offset signal level in the APT operational mode. In the APT operational mode, the supply control input voltage 218 is not modulated and the supply control input voltage level is indicative of the target average DC supply voltage level, and therefore also the DC offset signal level of the APT signal 73.

With regard to the APT signal 73 generated by the VOL 50 shown in FIG. 14, the APT signal 73 is an APT voltage and the APT signal level is an APT voltage level. The DC offset signal level is a DC offset voltage level. When the VOL 50 is in the APT operational mode, the supply voltage level of the supply voltage $V_{SUPPLY}$ has an average DC supply voltage level set in accordance with the DC offset voltage level of the APT signal 73. Accordingly, the APT voltage level oscillates about the DC offset voltage level of the APT signal 73 in accordance with the ripple variation of the supply voltage level of the supply voltage $V_{SUPPLY}$. The current sense detector 48 is deactivated in the APT operational mode. Thus, the linear amplification circuit does not generate the supply control output voltage 224.

Furthermore, the P-FET 208 is set so as to be in an off state while the N-FET 210 is selected to be in an on state in the APT operational mode. Accordingly, while the adder 258 receives the feedback voltage 72 in both the APT operational mode and the ET operational mode, the adder 258 is configured to receive a reference voltage $V_{REF}$ having a reference voltage level that is fixed at a relatively constant DC voltage level in the APT operational mode. For example, the reference voltage level of the reference voltage $V_{REF}$ shown in FIG. 14 is approximately at ground. More specifically, the reference voltage level is set at a minimum voltage level, which is a headroom voltage level of the N-FET 210 (near or at the saturation voltage level across the N-FET 210). The adder 258 is configured to subtract the feedback voltage level of the feedback voltage 72 from the reference voltage level of the reference voltage $V_{REF}$ so as to generate the displacement indication voltage 262. The voltage magnitude of the displacement indication voltage 262 is thus set in accordance with a difference between the first feedback voltage level and the reference voltage level.

The VOL 50 is configured to set the DC offset voltage level of the APT signal 73 in accordance with the supply control input voltage level of the supply control input voltage 218 in the APT operational mode. To do this, the multiplexer select bit signal MX2 is provided in the second bit state so that the multiplexer MUX2 selects the supply control input voltage 218 in the APT operational mode. The current sense detector 48 is deactivated and thus does not generate the current sense signal 70. Again, the supply control input voltage level of the supply control input voltage 218 is unmodulated and is indicative of a target DC offset voltage level for the APT signal 73. Accordingly, the adder 264 is operable to receive the supply control input voltage 218 from the multiplexer MUX2 and the displacement indication voltage 262 from the adder 258 in the APT operational mode. The adder 264 subtracts the voltage magnitude of the displacement indication voltage 262 from the supply control input voltage level of the supply control input voltage 218 so as to generate the error voltage 266 with an error voltage magnitude indicative of the deviation of the supply voltage level from the target DC offset signal level in the APT operational mode. In this manner, the VOL 50 sets the DC offset voltage level of the APT signal 73 in accordance with the supply control input voltage level of the supply control input voltage 218 in the APT operational mode.

The integrator circuit 268 is configured to integrate the error voltage 266 having an error voltage magnitude so as to generate the APT signal 73 in the APT operational mode. The integrator circuit 268 provides an integration function over time, such that the DC offset voltage level is driven to the target DC offset voltage level indicated by the supply control input voltage level of the supply control input voltage 218. The BBC 44 may then use the APT signal 73, which in this example is the APT voltage, to generate the sense voltage 124 (shown in FIG. 4). Since the displacement indication voltage magnitude changes with the changes in the supply voltage level of the supply voltage $V_{SUPPLY}$, the APT voltage level of the APT signal 73 varies in accordance with the ripple variation of the supply voltage $V_{SUPPLY}$. However, note that the adder 264 subtracts the displacement indication voltage level from the supply control input voltage level. As such, a change in the supply voltage level of the supply voltage $V_{SUPPLY}$ results in a change in the APT voltage level, where the change in the APT voltage level is negatively proportional and to the change in the supply voltage level. Since the VOL 50 uses the integrator circuit 268, the VOL 50 can thus generate the APT signal 73 so that the DC offset voltage level is not zero-centered, and the sense voltage 124 is not zero-centered. The use of the integrator circuit 268 allows the VOL 50 to maintain precise control over the relationship between the threshold voltage levels $M_1$, $M_2$, $M_3$, and $M_4$ (shown in FIGS. 5A-8A), and thus the BBC 44, may be provided in the first bang-bang mode, the second bang-bang mode, the third bang-bang mode, or the fourth bang-bang mode when the VOL 50 is in the APT operational mode.

Figure 15:
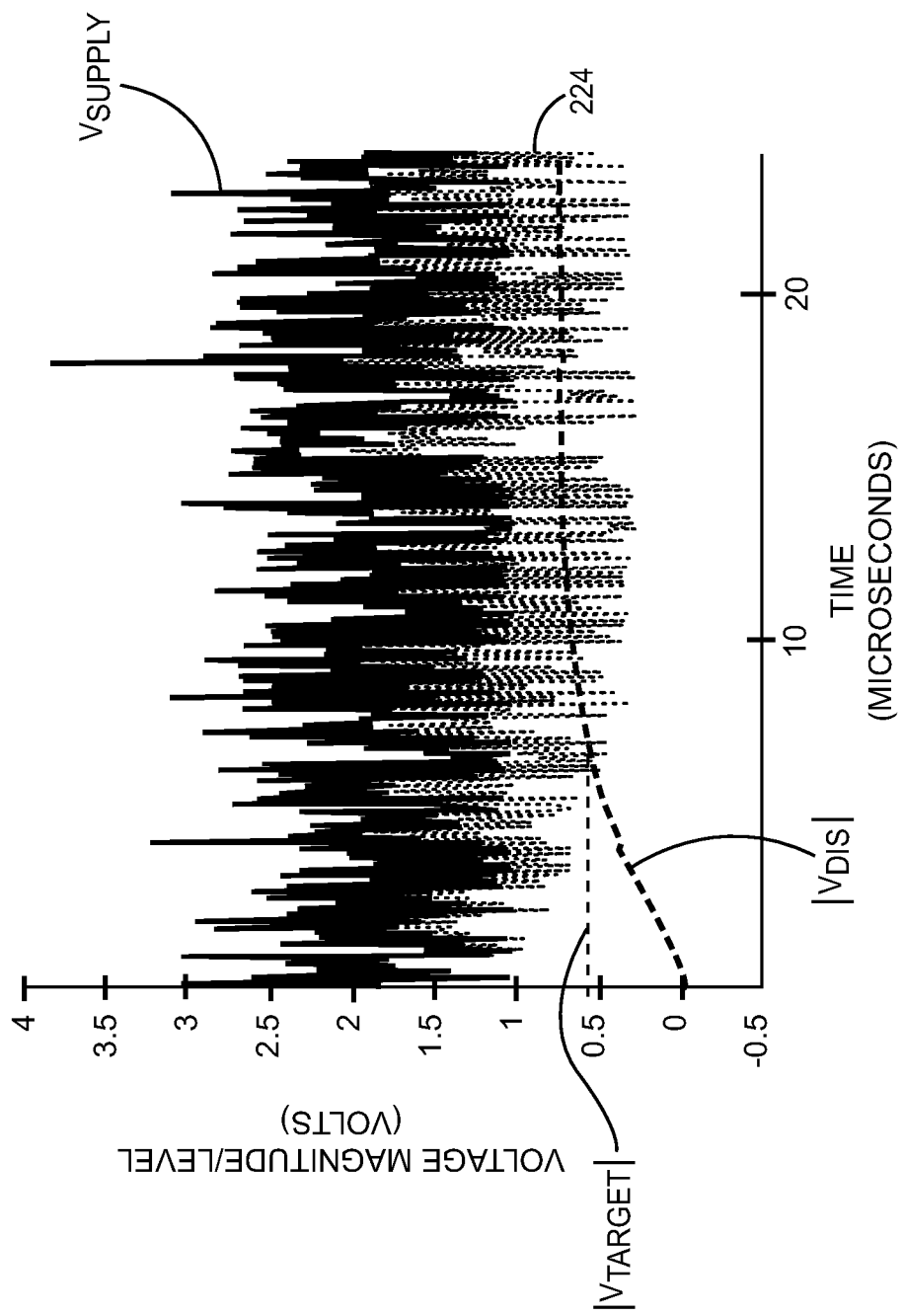
FIG. 15 illustrates a graph of one embodiment of the supply voltage, a supply control output voltage, and the displacement voltage magnitude as a function of time.

FIG. 15 illustrates one embodiment of the supply voltage $V_{SUPPLY}$, the supply control output voltage 224, and the displacement voltage magnitude $|V_{DIS}|$ as a function of time, while the switch controller 12 and the VOL 50 are both in the ET operating mode. Accordingly, the supply voltage level of the supply voltage $V_{SUPPLY}$ and the supply control output voltage level of the supply control output voltage 224 are modulated. As shown in FIG. 15, the VOL 50 (shown in FIG. 14) maintains the displacement voltage magnitude $|V_{DIS}|$ relatively steady with a virtually constant DC magnitude at a target displacement voltage magnitude $|V_{TARGET}|$.

Figure 16:
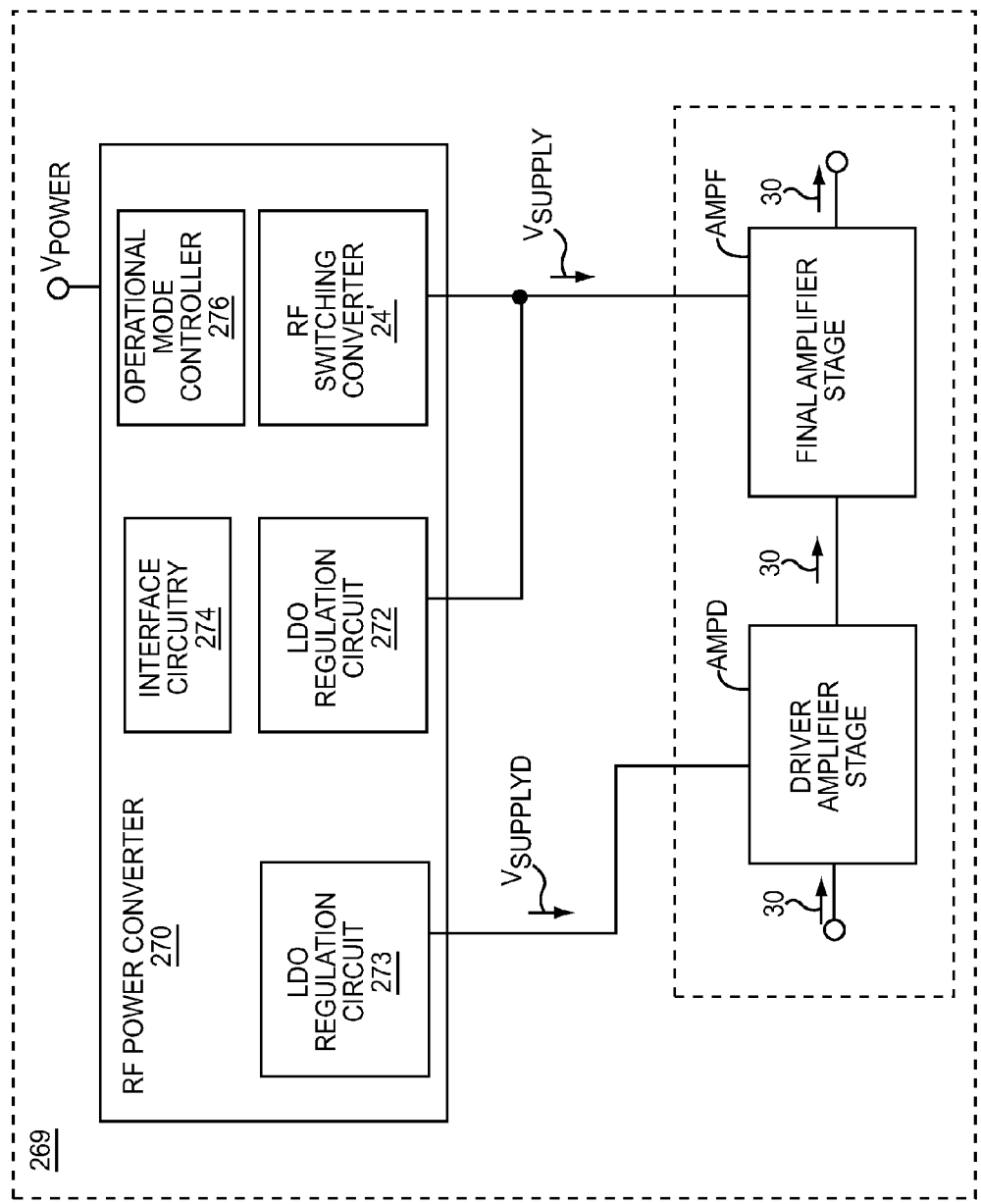
FIG. 16 illustrates another embodiment of an RF amplification device.

FIG. 16 illustrates another embodiment of an RF amplification device 269. The RF amplification device 269 includes one embodiment of an RF power converter 270 and one embodiment of an RF amplification circuit 271. The RF amplification device 269 has a plurality of RF amplifier stages (referred to generically as "AMPs" and specifically as "AMPD" and "AMPF"). Each of the plurality of RF amplifier stages AMPs is operable to provide amplification to the RF signal 30. In other words, by being coupled in cascade, the RF amplifier stages AMPs provide amplification to the RF signal 30 in sequence.

Since at least two RF amplifier stages AMPs are need to provide cascaded RF amplifier stages AMPs, the RF amplification device 269 includes at least a driver RF amplifier stage AMPD and a final RF amplifier stage AMPF. The driver amplifier stage AMPD is the RF amplifier stage AMP prior to the final amplifier stage AMPF in the sequence. Other embodiments of the RF amplification circuit 271 may include any number of RF amplifier stages AMPs greater than or equal to two (2). As such, there may be any number of intermediate RF amplifier stages AMPs, like the driver RF amplifier stage AMPD, coupled in cascade between the driver RF amplifier stage AMPD and the final RF amplifier stage AMPF. The final RF amplifier stage AMPF is the RF amplifier stage AMP at an end of the sequence. Thus, other embodiments may include one or more intermediate RF amplifier stages coupled in cascade between the driver amplifier stage AMPD and the final amplifier stage AMPF.

Since the RF amplifier stages AMPs are coupled in cascade, the RF amplifier stages AMPs provide amplification to the RF signal 30 in sequence. Accordingly, the driver amplifier stage AMPD amplifies the RF signal 30 in accordance with a driver amplifier gain $G_{DRI}$. Once the RF signal 30 is amplified by the driver amplifier stage AMPD in accordance with the amplifier gain $G_{DRI}$, the final RF amplifier stage AMPF amplifies the RF signal 30 in accordance with an amplifier gain $G_{final}$. The total amplifier gain of the RF amplification circuit 271 is thus approximately the driver amplifier gain $G_{DRI}$ magnified by the final amplifier gain $G_{final}$ or $G_{DRI}*G_{final}$).

The RF power converter 270 includes an RF switching converter 24', an LDO regulation circuit 272, an LDO regulation circuit 273, interface circuitry 274, and an operational mode controller 276. The RF switching converter 24' generates the supply voltage $V_{SUPPLY}$ from the power source voltage $V_{POWER}$. In this example, the final amplifier stage AMPF is coupled to receive the supply voltage $V_{SUPPLY}$ from the RF switching converter 24'. Additionally, the LDO regulation circuit 272 may generate the supply voltage $V_{SUPPLY}$ from the power source voltage $V_{POWER}$. Thus, the final amplifier stage AMPF is also coupled to the LDO regulation circuit 272 to receive the supply voltage $V_{SUPPLY}$. As a result, either the RF switching converter 24' or the LDO regulation circuit 272 may generate the supply voltage $V_{SUPPLY}$ to provide power amplification by the final amplifier stage AMPF. This is explained in further detail below.

The LDO regulation circuit 273 generates a supply voltage $V_{SUPPLYD}$ from the power source voltage $V_{POWER}$. The driver amplifier stage AMPD is coupled to the LDO regulation circuit 273 to receive the supply voltage $V_{SUPPLYD}$. As a result, the LDO regulation circuit 273 provides the supply voltage $V_{SUPPLYD}$ to power amplification by the driver amplifier stage AMPD.

The driver amplifier gain $G_{DRI}$ of the driver amplifier stage AMPD is set in accordance with a supply voltage level of the supply voltage $V_{SUPPLYD}$, while the final amplifier gain $G_{final}$ is set in accordance with the supply voltage level of the supply voltage $V_{SUPPLY}$. As explained in further detail below, the interface circuitry 274 shown in FIG. 16 may receive an external signal (or signals) indicative of a target supply voltage level for the supply voltage $V_{SUPPLYD}$ and/or a target supply voltage level for the supply voltage $V_{SUPPLY}$. The interface circuitry 274 may be configured to control the RF switching converter 24', the LDO regulation circuit 272, and the LDO regulation circuit 273, and may set the supply voltage levels of the supply voltages $V_{SUPPLYD}$ and $V_{SUPPLY}$ to the corresponding target supply voltage levels indicated by the external signal(s). In this manner, the interface circuitry 274 may be used to vary the driver amplifier gain $G_{DR}$, and the final amplifier gain $G_{final}$, and thus ultimately the total amplifier gain.

The RF power converter 270 may be operated in various operational modes. The operational mode controller 276 is configured to provide signals to the RF switching converter 24', the LDO regulation circuit 272, and the LDO regulation circuit 273 so that each operates in accordance with the requirements of the operational modes. These operational modes may be related to the power source voltage level of the power source voltage $V_{POWER}$, the instantaneous input power level of the RF signal 30, a target output power level of the RF signal 30 (such as a target average power value), the type of tracking to be employed (such as APT or ET), and/or the like.

Figure 17:
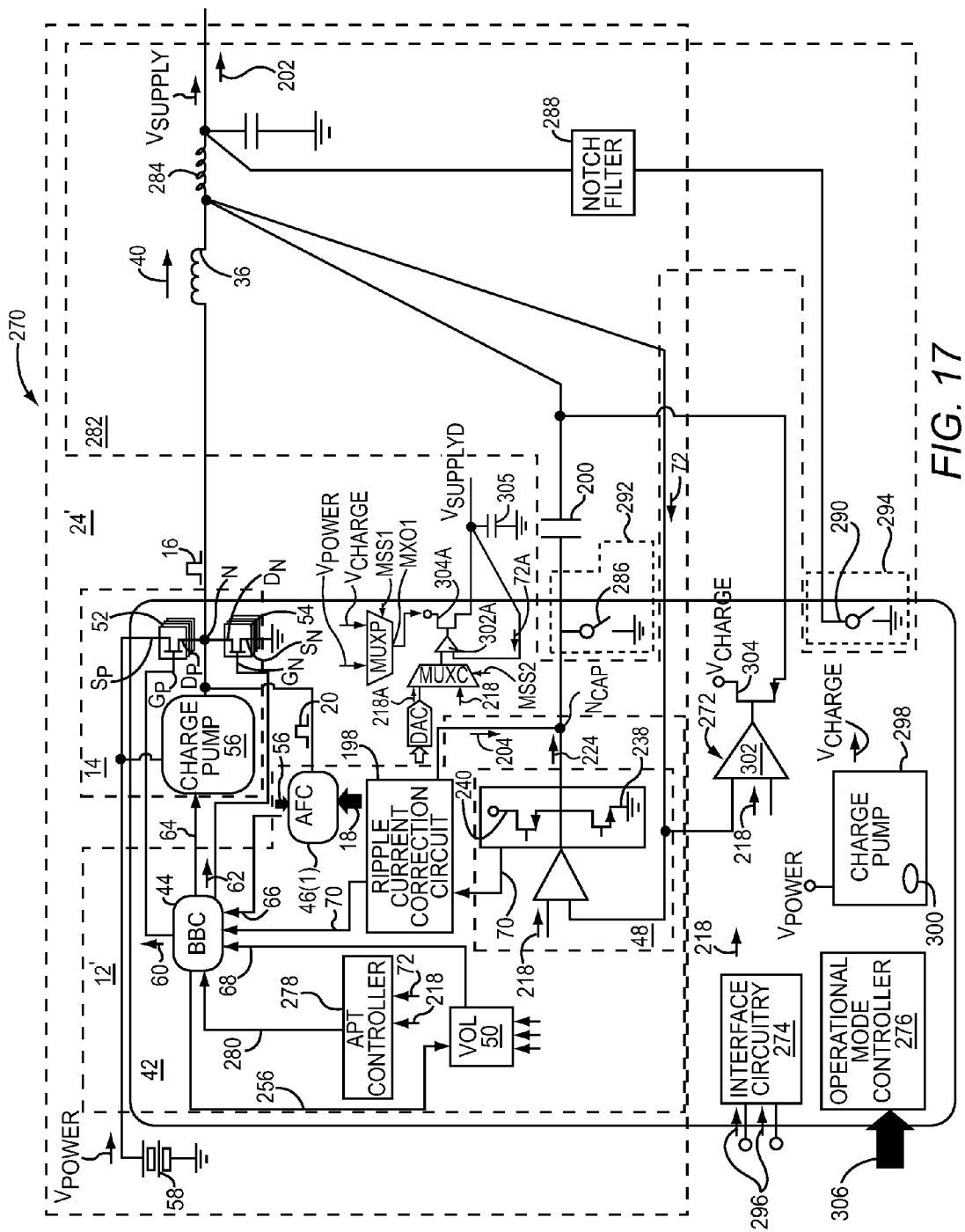
FIG. 17 illustrates one embodiment of an RF power converter, which includes an RF switching converter, a low-drop out (LDO) regulation circuit, another LDO regulation circuit, and an RF filter that is configured to be alternated between different RF filter topologies.

FIG. 17 illustrates one embodiment of the RF power converter 270 along with embodiments of the RF switching converter 24', the LDO regulation circuit 272, the LDO regulation circuit 273, the interface circuitry 274, and the operational mode controller 276. The RF switching converter 24' shown in FIG. 17 includes a switching controller 12' and the switching circuit 14 described above. In this embodiment, the switching controller 12' includes the BBC 44, the AFC 46(1), the VOL 50, the current sense detector 48, and the ripple current correction circuit 198 described above with respect to FIGS. 3, 4, 9, 13, and 14. Additionally, the switching controller 12' includes an APT controller 278 configured to generate an APT signal 280 for APT, as described below. As mentioned above, the RF switching converter 24' also includes the switching circuit 14 described above with respect to FIG. 3. An RF filter 282 is configured to convert the pulsed output voltage 16 from the switching circuit 14 into the supply voltage $V_{SUPPLY}$, and to bias the supply voltage $V_{SUPPLY}$ with the supply control output voltage 224 from the current sense detector 48. Additionally, the RF filter 282 includes an additional inductor 284 coupled in series with the power inductor 36, a switch 286, a notch filter 288, and a switch 290. The inductor 284 typically has a small inductance with respect to the power inductor 36. For example, the power inductor 36 may have an inductance of around 0.5-1.5 microhenries (μH), while the inductor 284 may have an inductance of around 3.0-7.0 nanohenries (nH). In this manner, the supply control output voltage 224 and the feedback voltage 72 may be slightly time-advanced, thereby reducing the effects of loop delay in the switching controller 12'.

The operational mode controller 276 may be operable to set the RF power converter 270 in a first operational mode, a second operational mode, a third operational mode, and a fourth operational mode. The first operational mode and the second operational mode may be for ET, while the third operational mode and the fourth operational mode may be for APT. In this example, the first operational mode is a high-power ET operational mode, the second operational mode is a medium-power ET operational mode, the third operational mode is a medium-power APT operational mode, and the fourth operational mode is a low-power APT operational mode.

The operational mode controller 276 is configured to activate the current sense detector 48 to generate the current sense signal 70 in both the high-power ET operational mode and the medium-power ET operational mode. As described above, the current sense detector 48 is formed as the linear amplification circuit and modulates the supply voltage $V_{SUPPLY}$ with the supply control output voltage 224. To generate the supply control output voltage 224 and provide ET, the current sense detector 48 is configured to receive the supply control input voltage 218 having the supply control input voltage level, which is modulated in both the high-power ET operational mode and the medium-power ET operational mode. The notch filter 288 provides a notch and may be an LC-type RF filter configured to filter the ripple variation of the supply voltage $V_{SUPPLY}$. Furthermore, the notch filter 288 may reduce an impedance relative to the supply current 202, which is also modulated during ET. However, the notch filter 288 may need to be disabled via the switch 290 when the supply voltage $V_{SUPPLY}$ is operating with over 30 RBs in order to avoid degrading the modulation of the supply voltage $V_{SUPPLY}$ and the supply current 202. In both the high-power ET operational mode and the medium-power ET operational mode, the multiplexer MUX1 (shown in FIG. 4) is provided in the first bit state by the operational mode controller 276 to select the current sense signal 70 (i.e., through the mirror current 104C shown in FIG. 4).

In the medium-power APT operational mode, the supply voltage $V_{SUPPLY}$ and the supply current 202 are not modulated. In this case, as explained below, either the APT controller 278 may be used to control the BBC 44, or the VOL 50 may be used to control the BBC 44. In particular, in the medium-power APT operational mode, the operational mode controller 276 may provide the VOL 50 in the APT operational mode to generate the APT signal 73 as described above. However, in this embodiment, the APT controller 278 is preferably used in the medium-power APT operational mode to generate the APT signal 280. Thus, when the switching controller 12' is in the medium-power APT operational mode, the operational mode controller 276 simply deactivates the VOL 50 and activates the APT controller 278. Accordingly, in some embodiments, the VOL 50 may not be provided in the APT operational mode.

The APT controller 278 is configured to generate the APT signal 280. The APT signal 280, which in this example is a current, takes the place of the current sense signal 70 so that the APT signal 280 is used to generate the sense voltage 124. In this case, the VOL 50 is deactivated so that the VOL 50 does not provide either the offset voltage 68 (shown in FIG. 4) or the APT signal 73 (shown in FIG. 4). The BBC 44 is operable to receive the APT signal 280 having the APT signal level, and is configured to switch the switching circuit 14 based on the APT signal level of the APT signal 280 so as to generate the pulsed output voltage 16 when the APT controller 278 is activated. More specifically, the multiplexer select bit signal MX1 (shown in FIG. 4) is provided in the second bit state by the operational mode controller 276 so that the multiplexer MUX1 selects the APT signal 280 in the medium-power APT operational mode.

The APT controller 278 is configured to generate the APT signal 280 such that the APT signal level varies from a DC offset signal level of the APT signal 280 in accordance with the ripple variation of the supply voltage level of the supply voltage $V_{SUPPLY}$. The APT controller 278 is also configured to set the DC offset signal level of the APT signal 280 in accordance with the supply control input signal level of the supply control input signal 218, which is unmodulated during APT. When the multiplexer select bit signal MX1 is provided in the second bit state so as to select the APT signal 280, the BBC 44 is configured to switch the switching circuit 14 to generate the pulsed output voltage 16 so that the supply voltage level of the supply voltage $V_{SUPPLY}$ has an average DC supply voltage level set in accordance with the DC offset signal level of the APT signal 280. The operational mode controller 276 is configured to provide the BBC 44 in the first bang-bang mode, the third bang-bang mode, or the fourth bang-bang mode while the RF power converter 270 is in the medium-power APT mode.

In contrast, the LDO regulation circuit 272 is used during a low-power APT operational mode. The LDO regulation circuit 272 also sets the average DC supply voltage level of the supply voltage $V_{SUPPLY}$ in accordance with the supply control input voltage level of the supply control input voltage 218. The BBC 44 shown in FIG. 14 is operable to be activated and deactivated, and the LDO regulation circuit 272 is also operable to be activated and deactivated. When the LDO regulation circuit 272 is activated, the LDO regulation circuit 272, not the RF power converter 24', is configured to generate the supply voltage $V_{SUPPLY}$. More specifically, the RF filter 282 is coupled to receive the pulsed output voltage 16 from the switching circuit 14 and the supply voltage $V_{SUPPLY}$ from the LDO regulation circuit 272. The RF filter 282 is operable to alternate between a first RF filter topology and a second RF filter topology depending on whether the BBC 44 is activated or the LDO regulation circuit 272 is activated. The RF filter 282 in the first filter topology is configured to convert the pulsed output voltage 16 from the switching circuit 14 into the supply voltage $V_{SUPPLY}$. Furthermore, in this embodiment, the switch 286 is open in the first RF filter topology, so that the supply control output voltage 224 and the ripple correction current 204 can be applied through the decoupling capacitor 200. However, when the BBC 44 is deactivated, the LDO regulation circuit 272 may be activated to generate the supply voltage $V_{SUPPLY}$. In this case, the RF filter 282 in the second RF filter topology is configured to filter the supply voltage $V_{SUPPLY}$ from the LDO regulation circuit 272 to reduce a ripple variation in the supply voltage level of the supply voltage $V_{SUPPLY}$. In particular, the switch 286 may be closed, so that the decoupling capacitor 200 is operable to passively filter the supply voltage $V_{SUPPLY}$ from the LDO regulation circuit 272.

When the switch 286 is closed, the passive filtering from the decoupling capacitor 200 reduces the ripple variation in the supply voltage level of the supply voltage $V_{SUPPLY}$. In this embodiment, the BBC 44, the APT controller 278, the VOL 50, the current sense detector 48, the AFC 46(1), the ripple current correction circuit 198, and the LDO regulation circuit 272 are each operable to be activated and deactivated. The operational mode controller 276 is configured to activate and deactivate the BBC 44, the APT controller 278, the VOL 50, the current sense detector 48, the AFC 46(1), the ripple current correction circuit 198, and the LDO regulation circuit 272 so that the RF power converter 270 operates in different operational modes.

In the high-power ET operational mode, the APT controller 278 and the LDO regulation circuit 272 are deactivated by the operational mode controller 276. The operational mode controller 276 is configured to provide the BBC 44, the VOL 50, the ripple current correction circuit 198, and the current sense detector 48, such that each is activated. The VOL 50 is provided in the ET operational mode, as described above, and generates the offset voltage 68. The operational mode controller 276 is further operable to provide the RF filter 282 in the first RF filter topology by closing the switch 286 and the switch 290.

As shown in FIG. 17, the switch 286 is provided in a switchable ground path 292. Activating the switch 286 closes the switchable ground path 292, while deactivating the switch 286 opens the switchable ground path 292. The operational mode controller 276 is also configured to deactivate the switch 286 and open the switchable ground path 292 to provide the RF filter 282 in the first RF filter topology. To provide the RF filter 282 in the first RF filter topology, the switch 290 also forms a switchable ground path 294. The operational mode controller 276 is configured to activate the switch 290, which closes the switchable ground path 294.

The switchable ground path 292 is coupled in shunt between the ripple current correction circuit 198 and the decoupling capacitor 200. Thus, the ripple current correction circuit 198 is coupled so as to inject the ripple correction current 204 into the decoupling capacitor 200 when the switchable ground path 292 is open. The decoupling capacitor 200 is further operable to filter the ripple correction current 204. The decoupling capacitor 200 outputs the ripple correction current 204 such that the ripple correction current 204 reduces the ripple variation in the supply current level of the supply current 202 that results from the supply voltage $V_{SUPPLY}$. Similarly, when the switchable ground path 292 is open, the current sense detector 48 biases the supply voltage $V_{SUPPLY}$ with the supply control output voltage 224. Furthermore, the operational mode controller 276 holds the P-FET 240 in the on state and holds the N-FET 238 in the off state.

In the high-power ET operational mode, the current sense signal 70 is provided to the BBC 44, and the BBC 44 is configured to switch the switching circuit 14 based on the sense signal level of the current sense signal 70 so as to generate the pulsed output voltage 16 when the current sense detector 48 is activated by the operational mode controller 276. The APT controller 278 is deactivated, and thus does not provide the APT signal 280 to the BBC 44. The BBC 44 is further configured to receive the offset voltage 68 having the offset voltage magnitude and to switch the switching circuit 14 such that the displacement voltage magnitude $|V_{DIS}|$ (shown in FIG. 12) is set in accordance with the offset voltage magnitude of the offset voltage 68 when the VOL 50 is activated.

The second operational mode is the medium-power ET operational mode. The operational mode controller 276 is configured to set the RF power converter 270 in the same manner as described above with respect to the high-power ET operational mode, except that in the medium-power ET operational mode, the ripple current correction circuit 198 is deactivated. Accordingly, in the second operational mode, the ripple variation of the supply voltage $V_{SUPPLY}$ is reduced entirely by the notch filter 288, since the switchable ground path 294 remains closed. Also, the supply control output voltage 224 continues to bias the supply voltage $V_{SUPP7}$, the interface circuitry 274 receives a preliminary differential control signal 296. In both the high-power ET operational mode and the medium-power ET operational mode, the operational mode controller 276 sets the interface circuitry 274 so that the interface circuitry 274 converts the preliminary differential control signal 296 into the single-ended supply control input voltage 218. Also, during ET, the preliminary differential control signal 296 is modulated and the interface circuitry 274 is set by the operational mode controller 276 to provide predistortion and anti-alias filtering. The interface circuitry 274 provides the supply control input voltage 218 to the current sense detector 48 so as to drive the supply control output voltage 224.

The third operational mode is the medium-power APT operational mode. In the medium-power APT operational mode, the switching controller 12' continues to switch the switching circuit 14 to generate the pulsed output voltage 16 so that the RF filter 282 converts the pulsed output voltage 16 into the supply voltage $V_{SUPPLY}$. In this embodiment, the RF filter 282 is further operable to be alternated to a third RF filter topology. During the medium-power APT operational mode, the operational mode controller 276 provides the RF filter 282 in the third RF filter topology while the switching controller 12' is activated. More specifically, the operational mode controller 276 provides the RF power converter 270 such that the BBC 44, the AFC 46(1), the APT controller 278, the switch 286, and the switch 290 are all activated during the medium-power APT operational mode. Additionally, the operational mode controller 276 deactivates the VOL 50, the ripple current correction circuit 198, the current sense detector 48, and the LDO regulation circuit 272. Thus, the RF filter 282 is provided in the third RF filter topology when the switchable ground path 292 and the switchable ground path 294 are each closed while the switching controller 12' is activated. In contrast, during the high-power ET operational mode and the medium-power ET operational mode, the RF filter 282 is provided in the first RF filter topology when the switchable ground path 292 is open and the switchable ground path 294 is closed while the switching controller 12' is activated. The operational mode controller 276 may further hold the P-FET 240 in the off state and hold the N-FET 238 in the on state while the current sense detector 48 is deactivated.

The decoupling capacitor 200 and the notch filter 288 are thus each operable to passively filter the supply voltage $V_{SUPPLY}$ converted from the pulsed output voltage 16, which was generated by the switching circuit 14, when the RF filter 282 is in the third RF filter topology. The decoupling capacitor 200 is thus coupled in shunt with respect to external downstream circuitry (such as, for example, the RF amplification circuit 26 shown in FIG. 2). In this case, the preliminary differential control signal 296 is not modulated and the operational mode controller 276 simply configures the interface circuitry 274 so that the interface circuitry 274 converts the preliminary differential control signal 296 into the single-ended supply control input voltage 218. Since the current sense detector 48 is deactivated and the switch 286 is activated, the current sense detector 48 is no longer biasing the supply voltage $V_{SUPPLY}$. Instead, the supply control input voltage level of the supply control input voltage 218 is unmodulated for APT and is indicative of a target average DC voltage level.

In the medium-power APT operational mode, the APT controller 278 is also configured to receive the feedback voltage 72 having the feedback voltage level indicative of the supply voltage level of the supply voltage $V_{SUPPLY}$ from the feedback circuit 212 and the supply control input voltage 218 from the interface circuitry 274. As mentioned above, the BBC 44 is operable to receive the APT signal 280, which takes the place of the current sense signal 70. Thus, the BBC 44 may include the multiplexer MUX1 (shown in FIG. 4) to select whether the current sense signal 70 or the APT signal 280 are to be used. Since the BBC 44 uses the APT signal 280 in the medium-power APT operational mode, the BBC 44 is configured to switch the switching circuit 14 based on the APT signal level of the APT signal 280 so as to generate the pulsed output voltage 16 when the APT controller 278 is activated. Again, the feedback voltage level of the feedback voltage 72 is indicative of the supply voltage level of the supply voltage $V_{SUPPLY}$. The APT controller 278 is configured to adjust the APT signal level to drive the feedback voltage level of the feedback voltage 72 to the supply control input voltage level of the supply control input voltage 218. In this manner, the pulsed output voltage 16 is generated by the switching circuit 14 so as to provide an average DC supply voltage level of the supply voltage $V_{SUPPLY}$ approximately at the target average DC voltage level indicated by the supply control input voltage level of the supply control input voltage 218. Alternatively, the operational mode controller 276 may be configured to provide the VOL 50 in the APT operational mode during the medium-power APT operational mode, as described above with regard to FIG. 12, and the VOL 50 may remain activated by the operational mode controller 276.

The switching controller 12' and the switching circuit 14 should be used to generate the supply voltage $V_{SUPPLY}$ so long as the power source voltage level of the power source voltage $V_{POWER}$ is high enough to provide adequate headroom to the P-FET 52 and the N-FET 54. Once the power source voltage level cannot provide adequate headroom, the operational mode controller 276 may be configured to provide the RF power converter 270 in the fourth operational mode. Thus, the fourth operational mode is the low-power APT operational mode. In the low-power APT operational mode, the operational mode controller 276 is configured to provide the RF power converter 270 such that the BBC 44, the APT controller 278, the VOL 50, the ripple current correction circuit 198, and the current sense detector 48 are each deactivated. The operational mode controller 276 provides the LDO regulation circuit 272 such that the LDO regulation circuit 272 is activated. The P-FET 240 and the N-FET 238 are maintained in the off state and the on state, respectively. In addition, the BBC 44 is configured to hold the P-FET 52 in the off state and hold the N-FET 54 in the on state when the BBC 44 is deactivated, such that the switching circuit 14 and the power inductor 36 form a ground path. The RF filter 282 is provided in the second RF filter topology during the low-power APT operational mode. More specifically, the power mode controller 276 provides the RF filter 282 so that the switch 286 is activated, the switch 290 is deactivated, and such that the power inductor 36 and the switching circuit 14 form a ground path. Accordingly, the switchable ground path 292 is closed, the switchable ground path 294 is open, and the switching circuit 14 and the power inductor 36 form the ground path in the second RF filter topology of the RF filter 282.

The LDO regulation circuit 272 is configured to generate the supply voltage $V_{SUPPLY}$ when the LDO regulation circuit 272 is activated. The RF filter 282 in the second RF filter topology is configured to filter the supply voltage $V_{SUPPLY}$ from the LDO regulation circuit 272 to reduce a ripple variation in the supply voltage level of the supply voltage $V_{SUPPLY}$. More specifically, the switchable ground path 292 is closed in the second RF filter topology, and thus the decoupling capacitor 200 is configured to passively filter the supply voltage $V_{SUPPLY}$ to reduce the ripple variation in the supply voltage level of the supply voltage $V_{SUPPLY}$. The switchable ground path 294 is open, and thus the notch filter 288 does not filter the supply voltage $V_{SUPPLY}$, since at backed-off power levels, the notch filter 288 may cause excessive distortion.

In this embodiment, the LDO regulation circuit 272 is configured to generate the supply voltage $V_{SUPPLY}$ from a charge pump voltage $V_{CHARGE}$ when the LDO regulation circuit 272 is activated. A charge pump 298 is operable to provide an adjustable voltage ratio. More specifically, the charge pump 298 is configured to generate the charge pump voltage $V_{CHARGE}$ from the power source voltage $V_{POWER}$ such that an average DC voltage level of the charge pump voltage $V_{CHARGE}$ has the adjustable voltage ratio with respect to a power source voltage level of the power source voltage $V_{POWER}$. For example, the charge pump 298 may be able to provide the adjustable voltage ratio at 1/3 or 1/4. When the adjustable voltage ratio is 1/3, the charge pump 298 provides the average DC voltage level of the charge pump voltage $V_{CHARGE}$ at 1/3 the power source voltage level of the power source voltage $V_{POWER}$. In contrast, when the adjustable voltage ratio is set to 1/4, the average DC voltage level of the charge pump voltage $V_{CHARGE}$ may be at 1/4 the power source voltage level of the power source voltage $V_{POWER}$.

Since the charge pump voltage $V_{CHARGE}$ is generated by the charge pump 298, a charge pump voltage level of the charge pump voltage $V_{CHARGE}$ has a ripple variation, thereby resulting in a ripple variation of the supply voltage $V_{SUPPLY}$ provided by the LDO regulation circuit 272. The charge pump 298 may include an oscillator 300 used to time the switching of the switches in the charge pump 298. The adjustable voltage ratio may be set to 1/3 or 1/4 by adjusting the pulse frequency of the clock signal generated by the oscillator 300.

As shown in FIG. 17, the LDO regulation circuit 272 includes a comparator 302 and a voltage regulator, which in this example is a P-FET 304. The comparator 302 receives the supply control input voltage 218 from the interface circuitry 274 and the feedback voltage 72 from the feedback circuit 212. The comparator 302 may be configured to drive the P-FET 304 so that the feedback voltage level of the feedback voltage 72 is approximately equal to the supply control input voltage level of the supply control input voltage 218. This causes the supply voltage level of the supply voltage $V_{SUPPLY}$ to be adjusted. The amount of adjustment of the supply voltage level of the supply voltage $V_{SUPPLY}$ depends on the amount of adjustment required to drive the feedback signal voltage of the feedback voltage 72 so that the feedback voltage level is approximately equal to the supply control input voltage level of the supply control input voltage 218.

So long as the P-FET 304 is not saturated, the comparator 302 drives the P-FET 304 to resist the change and therefore resist the ripple variation from the charge pump voltage $V_{CHARGE}$. By being coupled to ground, the decoupling capacitor 200 further reduces the ripple variation in the supply voltage level of the supply voltage $V_{SUPPLY}$ by filtering the supply voltage $V_{SUPPLY}$.

FIG. 17 also illustrates the LDO regulation circuit 273, which includes a comparator 302A and a voltage regulator, which in this example is a P-FET 304A. The comparator 302A may receive the supply control input voltage 218 from the interface circuitry 274 or may receive a supply control input voltage 218A from a digital-to-analog converter (DAC). The LDO regulation circuit 273 is configured to generate the supply voltage $V_{SUPPLYD}$ and set the supply voltage level of the supply voltage $V_{SUPPLYD}$ in accordance with either the supply control input voltage level of the supply control input voltage 218 or a supply control input voltage level of the supply control input voltage 218A. The LDO regulation circuit 273 is operable to receive a feedback voltage 72A. The feedback voltage 72A has a feedback voltage level indicative of the supply voltage level of the supply voltage $V_{SUPPLYD}$. The LDO regulation circuit 273 is configured to generate the supply voltage $V_{SUPPLYD}$ in the high-power ET operational mode, the medium-power ET operational mode, the medium-power APT operational mode, and the low-power APT operational mode.

The comparator 302A may be configured to drive the P-FET 304A of the LDO regulation circuit 273 so that the feedback voltage level of the feedback voltage 72A is approximately equal to either the supply control input voltage level of the supply control input voltage 218 or the supply control input voltage level of the supply control input voltage 218A. This causes the supply voltage level of the supply voltage $V_{SUPPLYD}$ to be adjusted. The amount of adjustment of the supply voltage level of the supply voltage $V_{SUPPLYD}$ depends on the amount of adjustment required to drive the feedback signal voltage of the feedback voltage 72A so that the feedback voltage level is approximately equal to either the supply control input voltage level of the supply control input voltage 218 or the supply control input voltage level of the supply control input voltage 218A.

In this embodiment, a multiplexer MUXP is operable to receive the power source voltage $V_{POWER}$ and the charge pump voltage $V_{CHARGE}$. The multiplexer MUXP is configured to output either the power source voltage $V_{POWER}$ or the charge pump voltage $V_{CHARGE}$ based on a multiplexer select bit signal MSS1. More specifically, the multiplexer MUXP is configured to select the power source voltage $V_{POWER}$ in response to the multiplexer select bit signal MSS1 being in a first bit state (i.e., logical "1" or logical "0"). In contrast, the multiplexer MUXP is configured to select the charge pump voltage $V_{CHARGE}$ in response to the multiplexer select bit signal MSS1 being in a second bit state (i.e. logical "0" or logical "1") antipodal to the first bit state. A source S of the P-FET 304A in the LDO regulation circuit 273 is coupled to an output terminus MXO1 of the multiplexer MUXP. The output terminus MXO1 is thus operable to output a selected one of the power source voltage $V_{POWER}$ and the charge pump voltage $V_{CHARGE}$. In this manner, the LDO regulation circuit 273 is configured to generate the supply voltage $V_{SUPPLYD}$ from the selected one of the power source voltage $V_{POWER}$ and the charge pump voltage $V_{CHARGE}$ at a drain D of the P-FET 304A.

So long as the P-FET 304A is not saturated, the comparator 302A drives a gate of the P-FET 304A to resist changes and therefore resist high-frequency components within the supply voltage $V_{SUPPLYD}$ (such as the ripple variation from the charge pump voltage $V_{CHARGE}$ when the charge pump voltage $V_{CHARGE}$ is selected). A capacitor 305 is coupled in shunt with respect to the LDO regulation circuit 273. The capacitor 305 is operable to filter and further reduce high-frequency components (such as the ripple variation from the charge pump voltage $V_{CHARGE}$ when the charge pump voltage $V_{CHARGE}$ is selected) in the supply voltage $V_{SUPPLYD}$. The supply voltage $V_{SUPPLYD}$ is output from the drain D of the P-FET 304A. Regardless of the operational mode, the operational mode controller 276 is configured to provide the multiplexer select bit signal MSS1 such that the lowest one of the charge pump voltage $V_{CHARGE}$ and the power source voltage $V_{POWER}$ is selected. In this manner, the RF power converter 24' is more power efficient.

In this embodiment, the comparator 302A in the LDO regulation circuit 273 is coupled to an output terminus O2 of a multiplexer MUXC. The multiplexer MUXC is operable to receive the supply voltage input signal 218 and the supply voltage input signal 218A. The multiplexer MUXC is configured to output either the supply voltage input signal 218 or the supply voltage input signal 218A to the comparator 302A based on a multiplexer select bit signal MSS2. More specifically, the multiplexer MUXC is configured to select the supply voltage input signal 218 in response to the multiplexer select bit signal MSS2 being in a first bit state (i.e., logical "1" or logical "0"). In contrast, the multiplexer MUXC is configured to select the supply voltage input signal 218A in response to the multiplexer select bit signal MSS2 being in a second bit state (i.e., logical "0" or logical "1") antipodal to the first bit state. The comparator 302A is coupled to a gate G of the P-FET 304A. In the high-power ET operational mode and in the medium-power ET operational mode, the operational mode controller 276 is configured to provide the multiplexer select bit signal MSS2 in the second bit state so as to select the supply voltage input signal 218A. On the other hand, in the medium-power APT operational mode and in the low-power APT operational mode, the operational mode controller 276 is configured to provide the multiplexer select bit signal MSS2 in the first bit state so as to select the supply control input voltage 218.

When the supply voltage input voltage 218 is selected by the multiplexer MUXP, the comparator 302A is configured to drive the gate G of the P-FET 304A so that the feedback voltage level of the feedback voltage 72A is approximately equal to the supply control input voltage level of the supply control input voltage 218. So long as the P-FET 304A is not saturated, the comparator 302A drives the gate G of the P-FET 304A to resist variations in the supply voltage $V_{SUPPLYD}$ not resulting from changes to the supply control input voltage level of the supply control input voltage 218. Accordingly, the LDO regulation circuit 273 regulates the supply voltage level of the supply voltage $V_{SUPPLYD}$ based on the supply voltage input voltage level of the supply voltage input voltage 218.

Similarly, when the supply voltage input voltage 218 is selected by the multiplexer MUXP, the comparator 302A is configured to drive the gate G of the P-FET 304A so that the feedback voltage level of the feedback voltage 72A is approximately equal to the supply control input voltage level of the supply control input voltage 218A. So long as the P-FET 304A is not saturated, the comparator 302A drives the gate G of the P-FET 304A to resist variations in the supply voltage $V_{SUPPLYD}$ not resulting from changes to the supply control input voltage level of the supply control input voltage 218A. Accordingly, the LDO regulation circuit 273 regulates the supply voltage level of the supply voltage $V_{SUPPLYD}$ based on the supply voltage input voltage level of the supply voltage input voltage 218A.

In this embodiment, the DAC is operable to output the supply voltage input voltage 218A as an input to the multiplexer MUXC. The DAC is configured to convert a 5-bit digital word from digital to analog. The 5-bit digital word represents a parameter value that is indicative of a target supply control input voltage level for the supply control input voltage 218A. Accordingly, the DAC is configured to generate the supply control input voltage 218A in accordance with the parameter value of the 5-bit digital word. In this manner, the supply control input voltage level of the supply control input voltage 218A is set by the DAC to the target supply control input voltage level.

The comparator 302A may be configured to drive the P-FET 304A so that the feedback voltage level of the feedback voltage 72A is approximately equal to the supply control input voltage level of the supply control input voltage 218. This causes the supply voltage level of the supply voltage $V_{SUPPLY}$ to be adjusted. The amount of adjustment of the supply voltage level of the supply voltage $V_{SUPPLY}$ depends on the amount of adjustment required to drive the feedback signal voltage of the feedback voltage 72A so that the feedback voltage level is approximately equal to the supply control input voltage level of the supply control input voltage 218. Thus, in the low-power APT mode, the LDO regulation circuit 273 and the LDO regulation circuit 272 are controlled via the same supply control input voltage 218.

Figure 18:
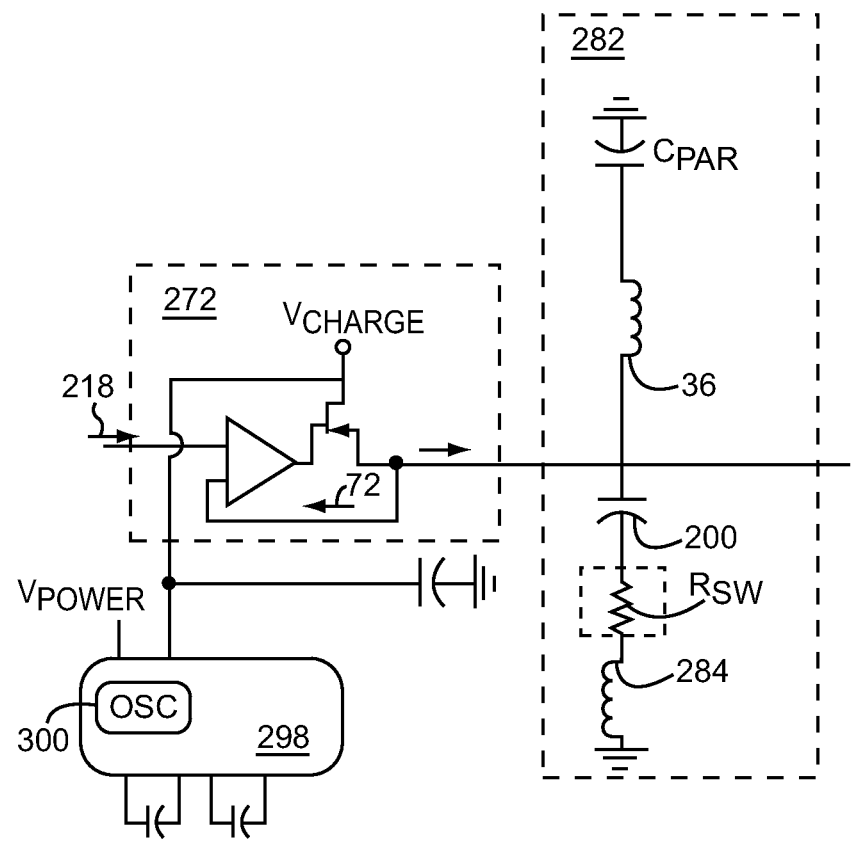
FIG. 18 is a circuit diagram illustrating an equivalent circuit topology when the LDO regulation circuit is activated.

FIG. 18 illustrates a circuit diagram of the LDO regulation circuit 272, the charge pump 298, and the RF filter 282 during the low-power APT operational mode. The RF filter 282 is in the second RF filter topology. A capacitance $C_{PAR}$ represents the parasitic capacitance of the N-FET 54. Both the capacitance $C_{PAR}$ and the inductance of the power inductor 36 are relatively high, and thus have little effect on the output impedance of the RF filter 282. A resistance $R_{SW}$ represents an equivalent resistance of the N-FET 238 and the switchable ground path 292 when the switchable ground path 292 is closed and the N-FET 238 is held in the on state. As such, the N-FET 238 and the switchable ground path 292 are parallel and the resistance $R_{SW}$ is decreased. Furthermore, the inductance of the inductor 284 is very small. As such, the output impedance is mainly set by the decoupling capacitor 200 and the parasitic resistance $R_{SW}$, which has been lowered by holding the N-FET 238 in the off state.

Figure 19:
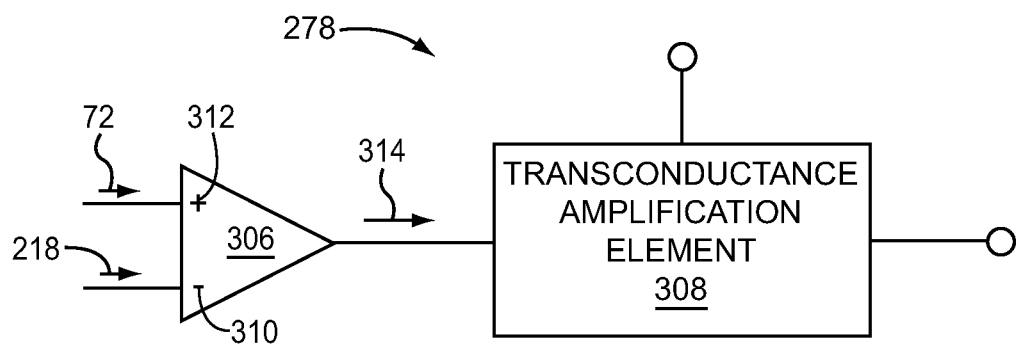
FIG. 19 illustrates one embodiment of the APT controller shown in FIG. 17.

FIG. 19 illustrates one embodiment of the APT controller 278 shown in FIG. 17. The APT controller 278 is configured to generate the APT signal 280 such that the APT signal level varies from the DC offset signal level of the APT signal 280 in accordance with the ripple variation of the supply voltage level of the supply voltage $V_{SUPPLY}$. In the medium-power APT mode, the supply control input voltage level of the supply control input voltage 218 is indicative of the target average DC supply voltage level for the average DC supply voltage level, so that the average DC supply voltage level is driven by the BBC 44 to the target average DC supply voltage level.

As shown in FIG. 19, the APT controller 278 includes a comparator 306 and a transconductance amplification element 308. The APT controller 278 shown in FIG. 19 is thus an amplification circuit having a transconductance amplification gain $G_m$. The comparator 306 includes an inverting terminal 310 operable to receive the supply control input voltage 218, and a non-inverting terminal 312 configured to receive the feedback voltage 72. The comparator 306 is configured to generate an error voltage 314 having an error voltage level set in accordance with a difference between the feedback signal level of the feedback signal 72 and the supply control input voltage level of the supply control input voltage 218. By generating the error voltage 314, the APT controller 278 is configured to set the DC offset signal level of the APT signal 280 in accordance with the supply control input signal level of the supply control input voltage 218. For example, the supply voltage $V_{SUPPLY}$ is offset by the average DC supply voltage level, and thus the ripple variation varies from the average DC supply voltage level. Generating the error voltage 314 having the error voltage level set in accordance with the difference between the feedback signal level and the supply control input signal level provides the DC offset signal level as a quiescent APT signal level of the APT signal 280 when the error voltage level is zero. Thus, the error voltage level is based on deviations from the supply control input voltage level, which corresponds to the DC offset signal level.

The error voltage 314 is received by the transconductance amplification element 308. The error voltage 314 is then amplified by the transconductance amplification element 308 in accordance with the transconductance gain $G_m$ so as to generate the APT signal 280 as an APT current. The APT signal level is thus an APT current level and the DC offset signal level is a DC offset current level. In this embodiment, the transconductance amplification gain $G_m$ is negative, and thus the APT controller 278 generates the APT signal 280 such that a first change in the supply voltage level of the supply voltage $V_{SUPPLY}$ results in a second change in the APT current level, the second change being negatively proportional to the first change. During the medium-power APT operational mode, the APT signal 280 is used by the BBC 44 (shown in FIG. 4) to generate the sense voltage 124. When the BBC 44 is in the first bang-bang mode and the second bang-bang mode, the pulsed output voltage 16 is generated using the threshold voltage levels $M_1$, $M_2$, $M_3$, $M_4$ as described above with regard to FIGS. 5A, 5B, 6A, and 6B. However, when the APT controller 278 is activated, the BBC 44 is not provided in the third bang-bang mode or the fourth bang-bang mode, but rather in the fifth bang-bang mode and in the sixth bang-bang mode.

Figure 20A:
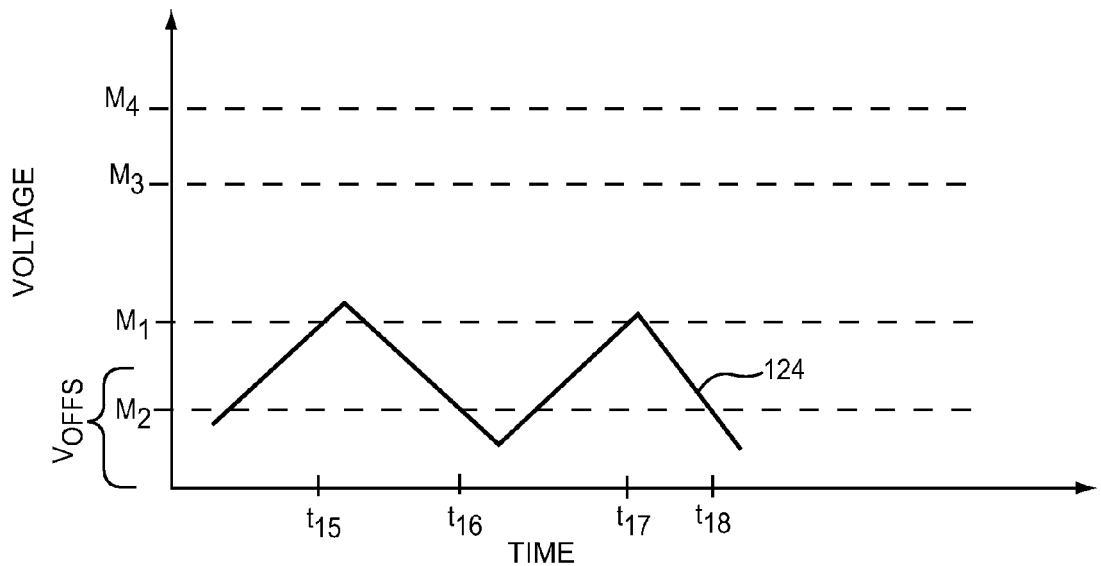
FIG. 20A illustrates one embodiment of the sense voltage as a function of time along with threshold voltage levels when the BBC shown in FIG. 4 is operating in a fifth bang-bang mode.
Figure 20B:
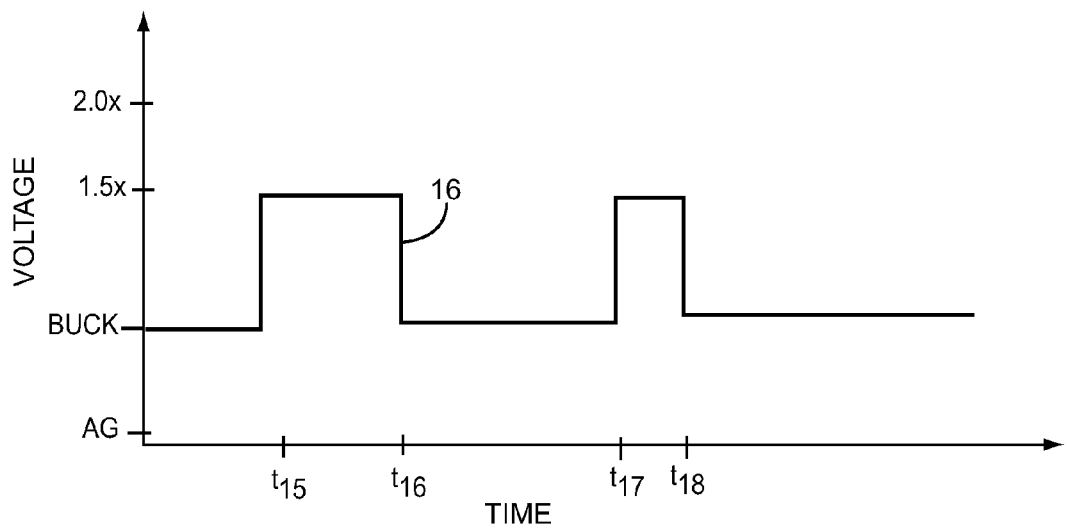
FIG. 20B illustrates one embodiment of the pulsed output voltage generated by the switching circuit shown in FIG. 3 when the BBC shown in FIG. 4 is operating in the fifth bang-bang mode.

Referring now to FIGS. 20A-20B, FIG. 20A illustrates one embodiment of the sense voltage 124 with respect to time. The voltage magnitude $V_{OFFS}$ is set by the DC offset current level of the APT signal 280. Also, the transconductance amplification gain $G_m$ of the APT controller 278 is adjusted so that the desired sense voltage level of the sense voltage 124 corresponds to the first threshold voltage level $M_1$ and the second threshold voltage level $M_2$.

FIG. 20B illustrates one embodiment of the pulsed output voltage 16 in the fifth bang-bang mode. As shown in FIG. 20A, the sense voltage level of the sense voltage 124 is above the first threshold voltage level $M_1$ at time $t_{15}$. Accordingly, in response, the BBC 44 (shown in FIG. 4) operates the charge pump 56 (shown in FIG. 3) so that the voltage level of the pulsed output voltage 16 is provided at the high voltage state 1.5× (i.e., the third voltage state), as shown in FIG. 20B. The pulsed output voltage 16 is maintained at the voltage state 1.5× until time $t_{16}$. As shown in FIG. 20A, the sense voltage level of the sense voltage 124 is below the second threshold voltage level $M_2$ at time $t_{16}$. Accordingly, in response, the BBC 44 operates the P-FET 52 so that the pulsed output voltage 16 is provided at the first voltage state with the voltage magnitude BUCK, as shown in FIG. 20B. The process repeats itself at times $t_{17}$ and $t_{18}$. Since the first threshold voltage level $M_1$ is positive and the second threshold voltage level $M_2$ is negative, this allows for the APT signal 280 to have the DC offset signal level set at zero. Furthermore, the magnitude difference between the second threshold voltage level $M_2$ and the first threshold voltage level $M_1$ is smaller than the magnitude difference between the second threshold voltage level $M_2$ and the third threshold voltage level $M_3$. This thereby reduces the ripple variation of the supply voltage $V_{SUPPLY}$ in comparison to the third bang-bang mode.

Figure 21A:
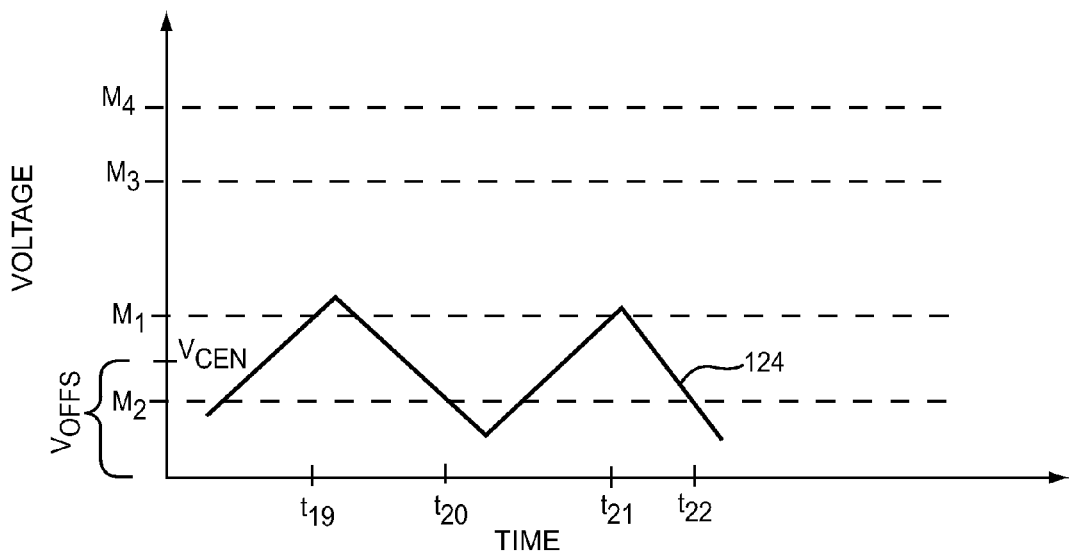
FIG. 21A illustrates one embodiment of the sense voltage as a function of time along with threshold voltage levels when the BBC shown in FIG. 4 is operating in a sixth bang-bang mode.
Figure 21B:
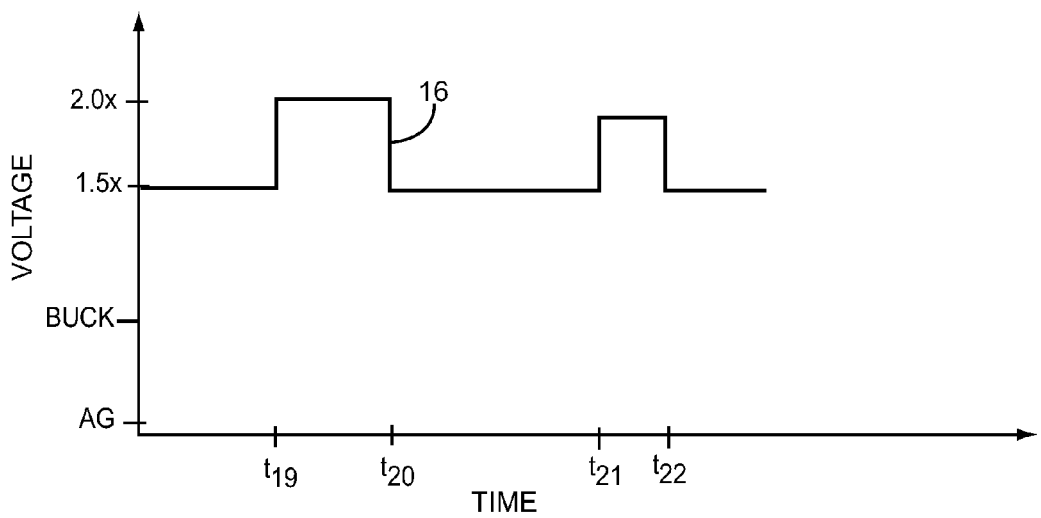
FIG. 21B illustrates one embodiment of the pulsed output voltage generated by the switching circuit shown in FIG. 3 when the BBC shown in FIG. 4 is operating in the sixth bang-bang mode.

Referring now to FIGS. 21A-21B, FIG. 21A illustrates one embodiment of the sense voltage 124 with respect to time. The voltage magnitude $V_{OFFS}$ is set by the DC offset current level of the APT signal 280. Also, the transconductance amplification gain $G_m$ of the APT controller 278 is adjusted so that the desired sense voltage level of the sense voltage 124 corresponds to the first threshold voltage level $M_1$ and the second threshold voltage level $M_2$.

FIG. 21B illustrates one embodiment of the pulsed output voltage 16 in the fourth bang-bang mode. As shown in FIG. 21A, the sense voltage level of the sense voltage 124 is above the first threshold voltage level $M_1$ at time $t_{19}$. Accordingly, in response, the BBC 44 (shown in FIG. 4) operates the charge pump 56 (shown in FIG. 3) so that the voltage level of the pulsed output voltage 16 is provided at the high voltage state 2.0× (i.e., the fourth voltage state), as shown in FIG. 21B. The pulsed output voltage 16 is maintained at the voltage level 2.0× until time $t_{20}$. As shown in FIG. 21A, the sense voltage level of the sense voltage 124 is below the second threshold voltage level $M_2$ at time $t_{20}$. Accordingly, in response, the BBC 44 operates the charge pump 56 so that the pulsed output voltage 16 is provided at the third voltage state with the 1.5× voltage level, as shown in FIG. 21B. The process repeats itself at times $t_{21}$ and $t_{22}$. The magnitude difference between the second threshold voltage level $M_2$ and the first threshold voltage level $M_1$ is smaller than the magnitude difference between the third threshold voltage level $M_3$ and the fourth threshold voltage level $M_4$. This thereby reduces the ripple variation of the supply voltage $V_{SUPPLY}$ in comparison to the fourth bang-bang mode.

Figure 22:
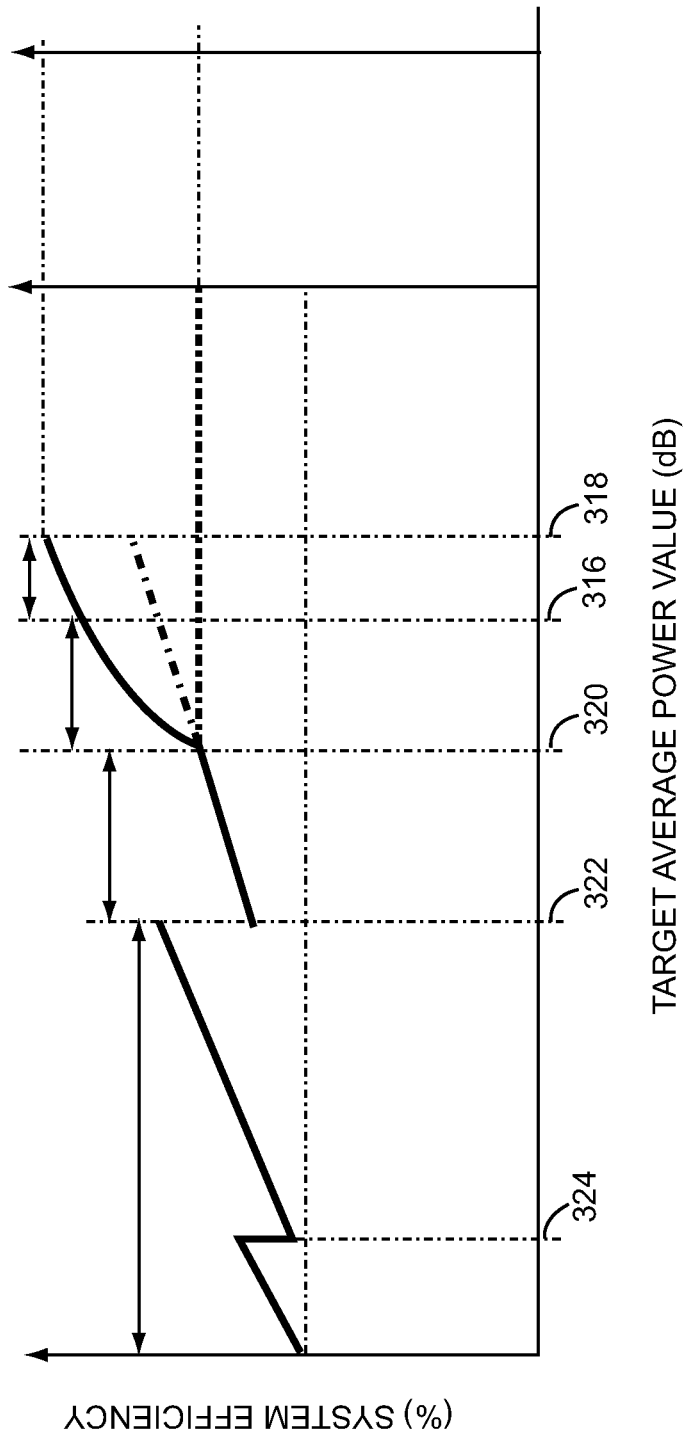
FIG. 22 is a graph illustrating system efficiency versus a target average power value.

Referring now to FIGS. 17 and 22, FIG. 22 is a graph illustrating system efficiency versus a target average power value. The operational mode controller 276 is configured to obtain a target average power output parameter 306 shown in FIG. 17 that identifies the target average power output value for the RF power converter 270. The operational mode controller 276 is configured to select between the first operational mode, the second operational mode, the third operational mode, and the fourth operational mode based on the target average power output value identified by the target average power output parameter 306.

As shown in FIG. 22, the operational mode controller 276 is configured to select the first operational mode (i.e., the high-power ET operational mode) when the target average power output value identified by the target average power output parameter 306 is above a threshold value 316. At a maximum target average power output value 318, the RF power converter 270 is at 100% system efficiency and cannot provide additional power. Once the target average power output value is below the threshold value 316, the operational mode controller 276 selects the second operational mode (i.e., the medium-power ET operational mode). As such, the supply voltage $V_{SUPPLY}$ continues to be modulated, but the ripple current correction circuit 198 is deactivated.

At a certain point, ET becomes inefficient in comparison to APT because although ET can reach higher system efficiency faster, it also decreases at a faster rate than APT. This point can be approximated to be at a threshold value 320, which is below the threshold value 316. When the operational mode controller 276 obtains the target average power output parameter 306 identifying a target average power output value below the threshold value 320, the operational mode controller 276 selects the third operational mode (i.e., the medium-power APT operational mode). As such, the BBC 44 and the switching circuit 14 continue to generate the pulsed output voltage 16 for conversion into the supply voltage $V_{SUPPLY}$. The third operational mode is selected so long as the RF switching converter 24' can provide the pulsed output voltage 16 at a level that is greater than the power source voltage level of the power source voltage $V_{POWER}$. This no longer becomes the case at a threshold value 322, which is below the threshold value 320, the threshold value 316, and the maximum target average power output value 318.

The operational mode controller 276 is configured to select the fourth operational mode (i.e., the low-power APT operational mode) when the target average power output value identified by the target average power output parameter 306 is below the threshold value 322. In this case, the LDO regulation circuit 272 is activated to generate the supply voltage $V_{SUPPLY}$. From the threshold value 322 to a threshold value 324, the adjustable voltage ratio of the charge pump 298 is set to 1/3. The operational mode controller 276 is configured to set the adjustable voltage ratio of the charge pump 298 to 1/4 when the target average power output value identified by the target average power output parameter 306 is below the threshold value 324.

Those skilled in the art will recognize improvements and modifications to the embodiments of the present disclosure. All such improvements and modifications are considered within the scope of the concepts disclosed herein and the claims that follow.

What is claimed is:

1. A radio frequency (RF) switching converter comprising:
   a switching circuit operable to receive a power source voltage, the switching circuit being switchable so as to generate a pulsed output voltage from the power source voltage;
   an RF filter coupled to receive the pulsed output voltage from the switching circuit and operable to convert the pulsed output voltage from the switching circuit into a supply voltage having a supply voltage level with a ripple variation;
   a bang-bang controller (BBC) operable to receive an Average Power Tracking (APT) signal and configured to switch the switching circuit based on an APT signal level of the APT signal so that the switching circuit generates the pulsed output voltage and so that the supply voltage level of the supply voltage has an average DC supply voltage level set in accordance with a DC offset signal level of the APT signal; and
   an APT controller operable to receive a supply control input signal having a supply control input signal level, the APT controller being configured to:
      generate the APT signal such that the APT signal level varies from the DC offset signal level of the APT signal in accordance with the ripple variation of the supply voltage level of the supply voltage; and
      set the DC offset signal level of the APT signal in accordance with the supply control input signal level of the supply control input signal.

2. The RF switching converter of claim 1 wherein:
   the supply control input signal level is indicative of a target DC supply voltage level for the average DC supply voltage level; and
   the APT controller is configured to set the DC offset signal level of the APT signal in accordance with the supply control input signal level of the supply control input signal so that the average DC supply voltage level is driven by the BBC to the target DC supply voltage level.

3. The RF switching converter of claim 1 wherein the APT controller is further operable to receive a feedback signal having a feedback signal level that is indicative of the supply voltage level of the supply voltage and is configured to:
   generate the APT signal from the feedback signal such that the APT signal level corresponds with the feedback signal level of the feedback signal and the APT signal level is provided at the DC offset signal level when the feedback signal level of the feedback signal is provided at a feedback voltage magnitude; and
   set the DC offset signal level of the APT signal by establishing the feedback voltage magnitude in accordance with the supply control input signal level of the supply control input signal.

4. The RF switching converter of claim 3 wherein the APT controller is further configured to establish the feedback voltage magnitude as being equal to the supply control input signal level of the supply control input signal.

5. The RF switching converter of claim 1 wherein the APT controller comprises an amplification circuit having an amplification gain, wherein the amplification circuit is operable to receive the supply control input signal and to receive a feedback signal having a feedback signal level indicative of the supply voltage level of the supply voltage, the amplification circuit being configured to:
   set the DC offset signal level of the APT signal in accordance with the supply control input signal level of the supply control input signal by generating an error signal having an error signal level set in accordance with a difference between the feedback signal level and the supply control input signal level; and
   generate the APT signal from the error signal by amplifying the error signal level in accordance with the amplification gain.

6. The RF switching converter of claim 5 wherein generating the error signal having the error signal level set in accordance with the difference between the feedback signal level and the supply control input signal level provides the DC offset signal level as a quiescent APT signal level of the APT signal when the error signal level is zero.

7. The RF switching converter of claim 5 wherein:
   the feedback signal is a feedback voltage and the feedback signal level is a feedback voltage level;
   the supply control input signal is a supply control input voltage and the supply control input signal level is a supply control input voltage level;
   the error signal is an error voltage and the error signal level is an error voltage level; and
   the amplification gain of the amplification circuit is a transconductance gain so that the APT signal is an APT current, the APT signal level is an APT current level, and the DC offset signal level of the APT signal is a DC offset current level.

8. The RF switching converter of claim 7 wherein the difference is from the feedback voltage level to the supply control input voltage level.

9. The RF switching converter of 8 wherein the transconductance gain has a negative value.

10. The RF switching converter of claim 9 wherein:
the switching circuit is switchable so as to provide the pulsed output voltage in a first voltage state, a second voltage state that is higher than the first voltage state, and a third voltage state that is higher than the second voltage state; and
the BBC is operable in a first bang-bang mode and in a second bang-bang mode, the BBC being configured to:
generate a sense voltage from the APT current such that a sense voltage level of the sense voltage is directly proportional to the APT signal level of the APT signal;
generate a first threshold voltage having a first threshold voltage level and a second threshold voltage having a second threshold voltage level that is higher than the first threshold voltage level;
in the first bang-bang mode, switch the switching circuit to change the pulsed output voltage from the first voltage state to the second voltage state in response to the sense voltage level being above the second threshold voltage level;
in the first bang-bang mode, switch the switching circuit to change the pulsed output voltage from the second voltage state to the first voltage state in response to the sense voltage level of the sense voltage being below the first threshold voltage level;
in the second bang-bang mode, switch the switching circuit to change the pulsed output voltage from the second voltage state to the third voltage state in response to the sense voltage level being above the second threshold voltage level; and
in the second bang-bang mode, switch the switching circuit to change the pulsed output voltage from the third voltage state to the second voltage state in response to the sense voltage level of the sense voltage being below the first threshold voltage level.

11. The RF switching converter of claim 10 wherein the first voltage state is set near ground, the second voltage state is set near a power source voltage level of the power source voltage, and the third voltage state is set so as to be boosted with respect to the power source voltage level of the power source voltage.

12. The RF switching converter of claim 1 wherein the APT controller is further configured to generate the APT signal such that a first change in the supply voltage level of the supply voltage results in a second change in the APT signal level, the second change being negatively proportional to the first change.

13. The RF switching converter of claim 12 wherein:
the switching circuit is switchable so as to provide the pulsed output voltage in a first voltage state, a second voltage state that is higher than the first voltage state, and a third voltage state that is higher than the second voltage state; and
the BBC is operable in a first bang-bang mode and in a second bang-bang mode, the BBC being configured to:
in the first bang-bang mode, switch the switching circuit to change the pulsed output voltage from the first voltage state to the second voltage state in response to the APT signal level of the APT signal being above a first threshold signal level;
in the first bang-bang mode, switch the switching circuit to change the pulsed output voltage from the second voltage state to the first voltage state in response to the APT signal level of the APT signal being below a second threshold signal level that is lower than the first threshold signal level;
in the second bang-bang mode, switch the switching circuit to change the pulsed output voltage from the second voltage state to the third voltage state in response to the APT signal level of the APT signal being above the first threshold signal level; and
in the second bang-bang mode, switch the switching circuit to change the pulsed output voltage from the third voltage state to the second voltage state in response to the APT signal level of the APT signal being below the second threshold signal level.

14. The RF switching converter of claim 1 wherein the BBC is further operable to receive a current sense signal and is further configured to switch the switching circuit based on the current sense signal so that the switching circuit generates the pulsed output voltage.

15. The RF switching converter of claim 14 wherein the BBC is further configured to select between the current sense signal and the APT signal so that the BBC switches the switching circuit based on the APT signal when the APT signal is selected and based on the current sense signal when the current sense signal is selected.

16. The RF switching converter of claim 15 wherein:
the BBC includes a multiplexer operable to receive the APT signal and the current sense signal; and
the multiplexer is configured to select between the APT signal and the current sense signal for the BBC so that the BBC switches the switching circuit based on the APT signal when the APT signal is selected and based on the current sense signal when the current sense signal is selected.

17. The RF switching converter of claim 15 further comprising a current sense detector wherein:
the RF filter comprises a power inductor coupled in series with the switching circuit to produce a power inductor current in response to the pulsed output voltage, such that a power inductor current level of the power inductor current has an other ripple variation;
the current sense detector is configured to generate a current sense signal in response to the power inductor current such that a sense signal level of the current sense signal varies in accordance with the ripple variation of the supply voltage.

18. The RF switching converter of claim 17 wherein the current sense detector is configured to generate the current sense signal such that a first change in the power inductor current level of the power inductor current results in a second change in the sense signal level, the second change being negatively proportional to the first change.

19. The RF switching converter of claim 18 wherein:
the APT controller is further configured to generate the APT signal such that a first change in the supply voltage level of the supply voltage results in a second change in the APT signal level, the second change being negatively proportional to the first change;
the switching circuit is switchable so as to provide the pulsed output voltage in a first voltage state, a second voltage state that is higher than the first voltage state, and a third voltage state that is higher than the second voltage state; and
the BBC is operable in a first bang-bang mode, in a second bang-bang mode, and in a third bang-bang mode, the BBC being configured to:

generate a sense voltage from the APT signal when the APT signal is selected, such that a sense voltage level of the sense voltage is provided in accordance with the APT signal level of the APT signal;
generate the sense voltage from the current sense signal when the current sense signal is selected, such that the sense voltage level of the sense voltage is provided in accordance with the sense signal level of the current sense signal;
generate a first threshold voltage having a first threshold voltage level, a second threshold voltage having a second threshold voltage level that is higher than the first threshold voltage level, and a third threshold voltage having a third threshold voltage level that is higher than the second threshold voltage level;
in the first bang-bang mode, switch the switching circuit to change the pulsed output voltage from the first voltage state to the second voltage state in response to the sense voltage level of the sense voltage being above the second threshold voltage level;
in the first bang-bang mode, switch the switching circuit to change the pulsed output voltage from the second voltage state to the first voltage state in response to the sense voltage level of the sense voltage being below the first threshold voltage level;
in the first bang-bang mode, switch the switching circuit so as to maintain the pulsed output voltage in the second voltage state when the sense voltage level of the sense voltage is above the third threshold voltage level;
in the second bang-bang mode, switch the switching circuit to change the pulsed output voltage from the second voltage state to the third voltage state in response to the sense voltage level of the sense voltage being above the second threshold voltage level;
in the second bang-bang mode, switch the switching circuit to change the pulsed output voltage from the third voltage state to the second voltage state in response to the sense voltage level of the sense voltage being below the first threshold voltage level;
in the second bang-bang mode, switch the switching circuit so as to maintain the pulsed output voltage in the third voltage state when the sense voltage level of the sense voltage is above the first threshold voltage level;
in the third bang-bang mode, switch the switching circuit to change the pulsed output voltage from the first voltage state to the second voltage state in response to the sense voltage level of the sense voltage being above the second threshold voltage level;
in the third bang-bang mode, switch the switching circuit to change the pulsed output voltage from the second voltage state to the third voltage state in response to the sense voltage level of the sense voltage being above the third threshold voltage level;
in the third bang-bang mode, switch the switching circuit to change the pulsed output voltage from the second voltage state to the first voltage state in response to the sense voltage level of the sense voltage being below the first threshold voltage level; and
in the third bang-bang mode, switch the switching circuit to change the pulsed output voltage from the third voltage state to the first voltage state in response to the sense voltage level of the sense voltage being below the first threshold voltage level.

20. A switching controller for a switching circuit comprising:
a bang-bang controller (BBC) operable to receive an Average Power Tracking (APT) signal and configured to switch the switching circuit based on an APT signal level of the APT signal so that the switching circuit generates a pulsed output voltage;
an APT controller operable to receive a supply control input signal having a supply control input signal level and to receive a feedback voltage in response to a supply voltage that is generated from the pulsed output voltage and has a supply voltage level with a ripple variation, the feedback voltage having a feedback signal level that is indicative of the supply voltage level of the supply voltage, the APT controller being configured to:
generate the APT signal from the feedback voltage such that the APT signal level is set in accordance with the feedback signal level of the feedback voltage and varies from a DC offset signal level; and
set the DC offset signal level of the APT signal in accordance with the supply control input signal level of the supply control input signal.

21. A method of converting a power source voltage into a supply voltage that has a supply voltage level with a ripple variation comprising:
receiving a supply control input signal having a supply control input signal level;
generating an Average Power Tracking (APT) signal having an APT signal level that varies from a DC offset signal level in accordance with the ripple variation of the supply voltage level of the supply voltage;
setting the DC offset signal level of the APT signal in accordance with the supply control input signal level;
switching a switching circuit so that the switching circuit generates a pulsed output voltage based on the APT signal level of the APT signal; and
filtering the pulsed output voltage so as to generate the supply voltage from the pulsed output voltage.

* * * * *